United States Patent
Candelaria

(10) Patent No.: US 9,280,487 B2
(45) Date of Patent: *Mar. 8, 2016

(54) METHODS AND APPARATUS FOR DATA PROCESSING USING DATA COMPRESSION, LINKED LISTS AND DE-DUPLICATION TECHNIQUES

(71) Applicant: CISCO TECHNOLOGY, INC., San Jose, CA (US)

(72) Inventor: James Candelaria, Branchburg, NJ (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/834,070

(22) Filed: Aug. 24, 2015

(65) Prior Publication Data
US 2015/0363328 A1     Dec. 17, 2015

Related U.S. Application Data

(63) Continuation of application No. 13/745,503, filed on Jan. 18, 2013, now Pat. No. 9,141,554.

(51) Int. Cl.
| | |
|---|---|
| *G06F 12/00* | (2006.01) |
| *G06F 13/00* | (2006.01) |
| *G06F 13/28* | (2006.01) |
| *G06F 12/10* | (2006.01) |

(Continued)

(52) U.S. Cl.
CPC .......... *G06F 12/1018* (2013.01); *G06F 3/0608* (2013.01); *G06F 3/0641* (2013.01); *G06F 3/0673* (2013.01); *G06F 12/0864* (2013.01); *G06F 2205/064* (2013.01); *G06F 2212/657* (2013.01)

(58) Field of Classification Search
CPC ............ G06F 12/1018; G06F 12/0864; G06F 2205/064; G06F 3/0641; G06F 3/0608; G06F 3/0673
USPC ....................................................... 711/154
See application file for complete search history.

(56) References Cited

U.S. PATENT DOCUMENTS

| | | |
|---|---|---|
| 5,588,012 A | 12/1996 | Oizumi |
| 7,707,481 B2 | 4/2010 | Kirschner et al. |

(Continued)

FOREIGN PATENT DOCUMENTS

WO    WO2014/151758    9/2014

OTHER PUBLICATIONS

PCT Jul. 29, 2014 International Search Report and Written Opinion of the International Searching Authority from International Application PCT/US2014/026400.

(Continued)

*Primary Examiner* — Tuan Thai
*Assistant Examiner* — Shane Woolwine
(74) *Attorney, Agent, or Firm* — Patent Capital Group

(57) ABSTRACT

Data processing methods and apparatus for efficiently storing and retrieving data, e.g., blocks of data, to and from memory. The data processing includes, e.g., techniques such as using linked lists and/or tables for tracking duplicate data blocks received for storage, the use of lossless data compression, and de-duplication based on comparing hash values, compressed data block sizes, and/or bit by bit comparisons of the block of data to be stored and previously stored blocks of data.

20 Claims, 33 Drawing Sheets

(51) Int. Cl.
*G06F 3/06* (2006.01)
*G06F 12/08* (2006.01)

(56) References Cited

U.S. PATENT DOCUMENTS

| | | |
|---|---|---|
| 7,979,670 B2 | 7/2011 | Saliba |
| 8,196,018 B2 | 6/2012 | Forhan et al. |
| 9,141,554 B1 | 9/2015 | Candelaria |
| 2002/0073276 A1 | 6/2002 | Howard |
| 2004/0128470 A1 | 7/2004 | Hetzler et al. |
| 2006/0215297 A1 | 9/2006 | Kikuchi |
| 2009/0193223 A1 | 7/2009 | Saliba et al. |
| 2011/0252274 A1 | 10/2011 | Kawaguchi et al. |
| 2013/0318288 A1 | 11/2013 | Khan et al. |
| 2014/0164866 A1 | 6/2014 | Bolotov et al. |
| 2014/0229790 A1 | 8/2014 | Goss |
| 2014/0244897 A1 | 8/2014 | Goss |
| 2014/0317479 A1 | 10/2014 | Candelaria |
| 2014/0325208 A1 | 10/2014 | Resch et al. |

OTHER PUBLICATIONS

"Delphi—Save a CRC value in a file, without altering the actual CRC Checksum?" Stack Overflow, stackoverflow.com, Dec. 23, 2011, XP055130879, 3 pages http://stackoverflow.com/questions/8608219/save-a-crc-value-in-a-file-wihout-altering-the-actual-crc-checksum.

Nelson, Mark, "File Verification Using CRC," Dr. Dobb's Journal, May 1, 1992, pp. 1-18, XP055130883; http://marknelson.us/1992/05/01/file-verification-using-crc-2/.

PCT Sep. 15, 2015 International Preliminary Report on Patentability and Written Opinion of the International Searching Authority from International Application PCT/US2014/026400.

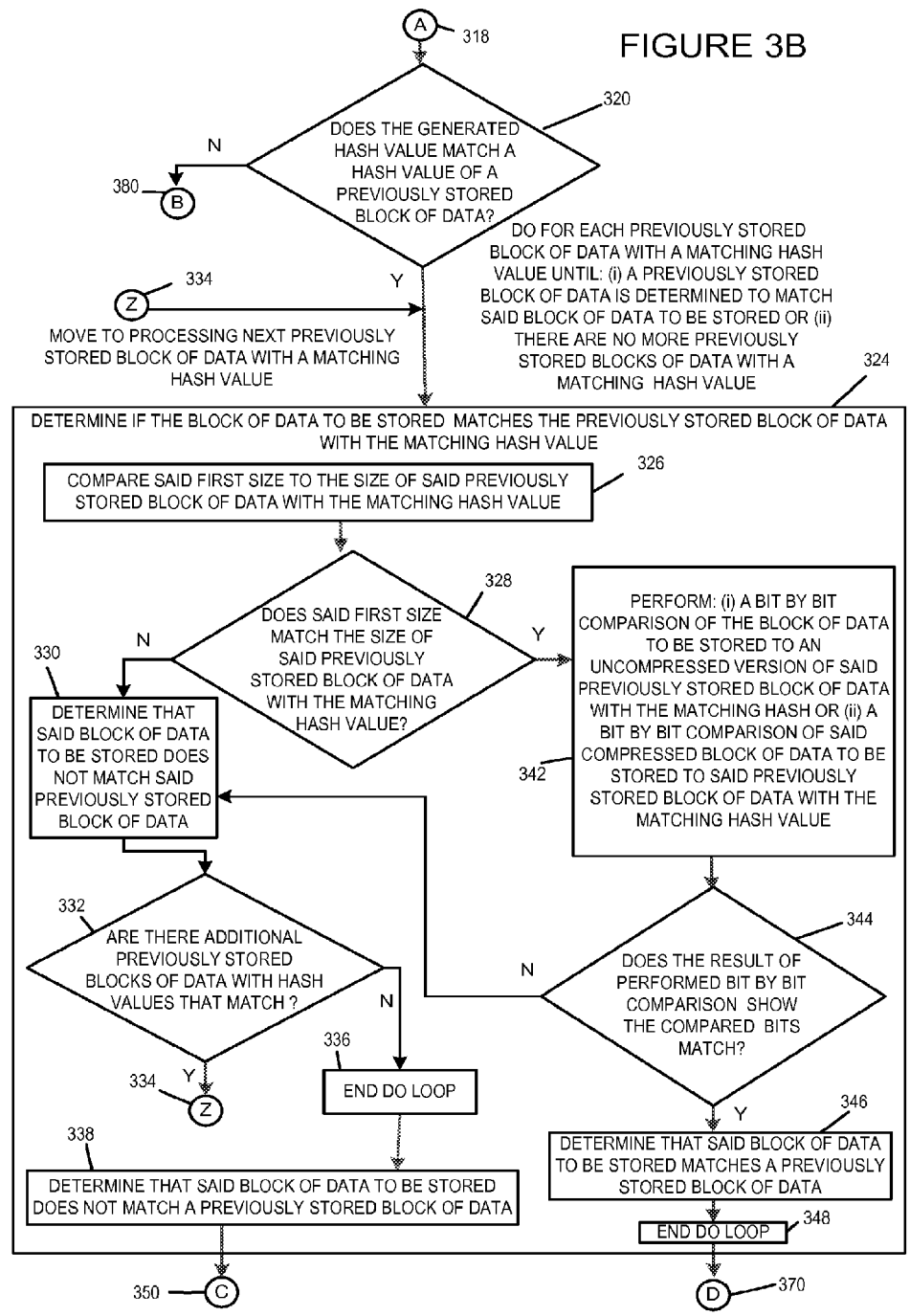

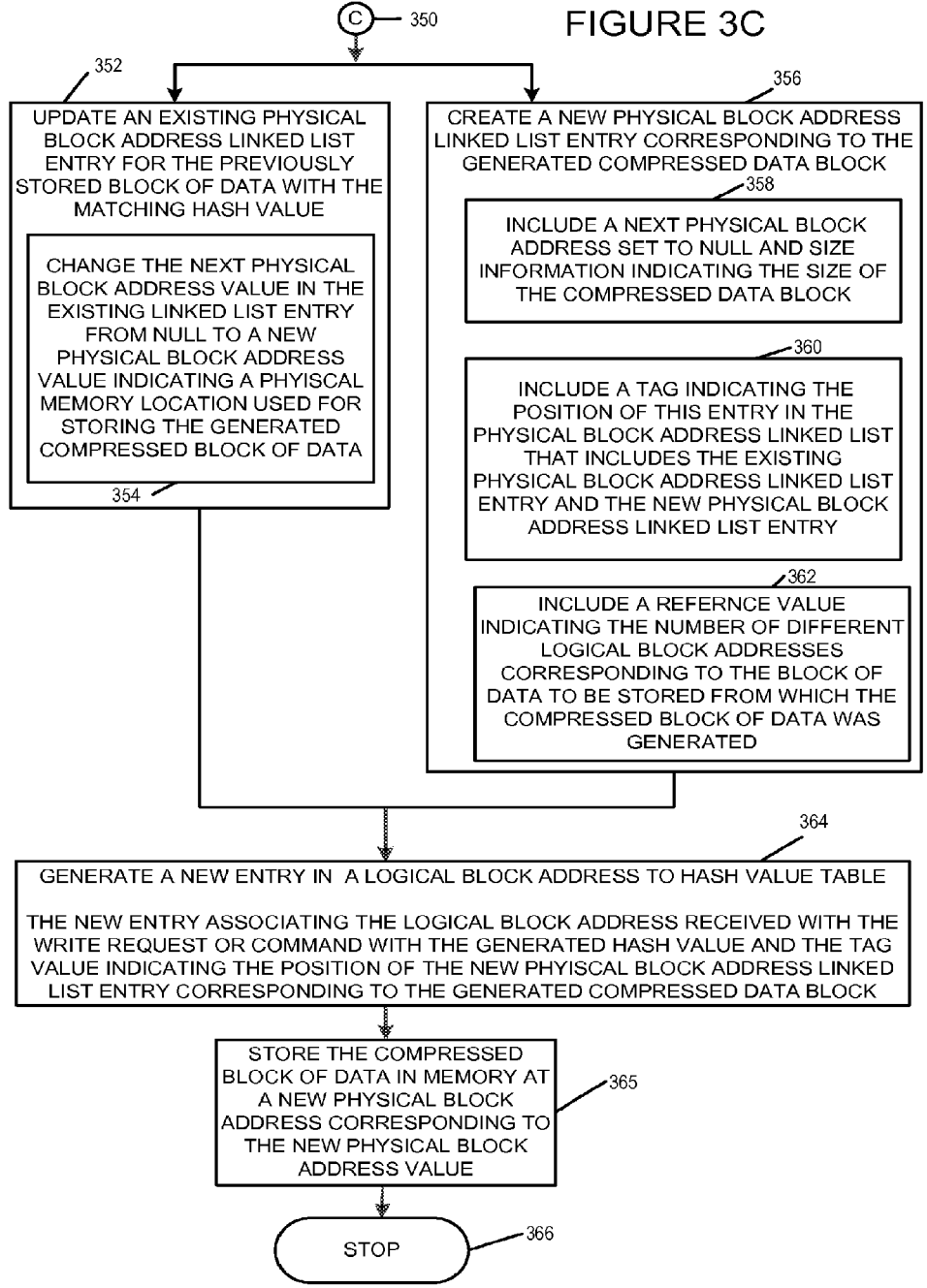

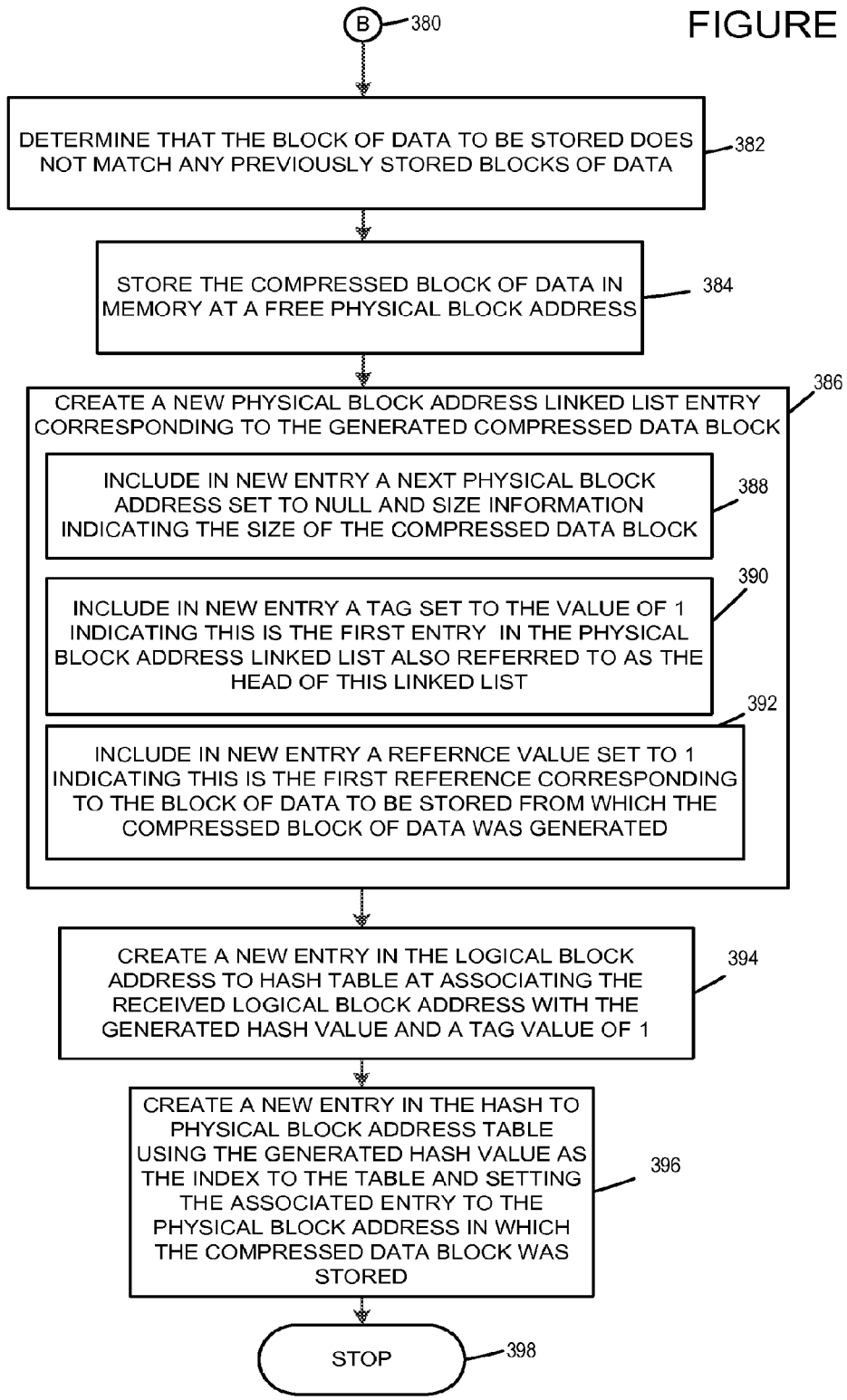

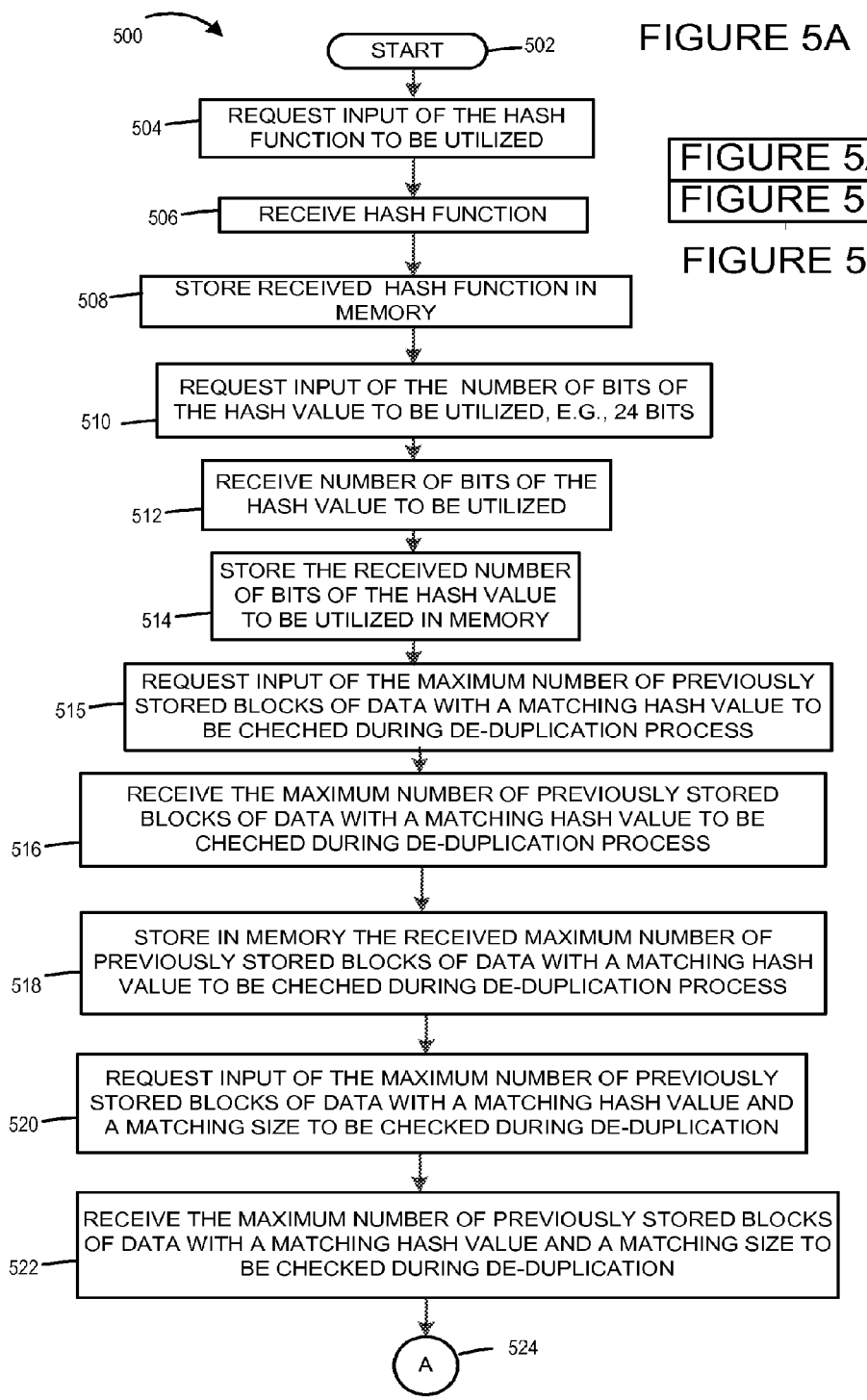

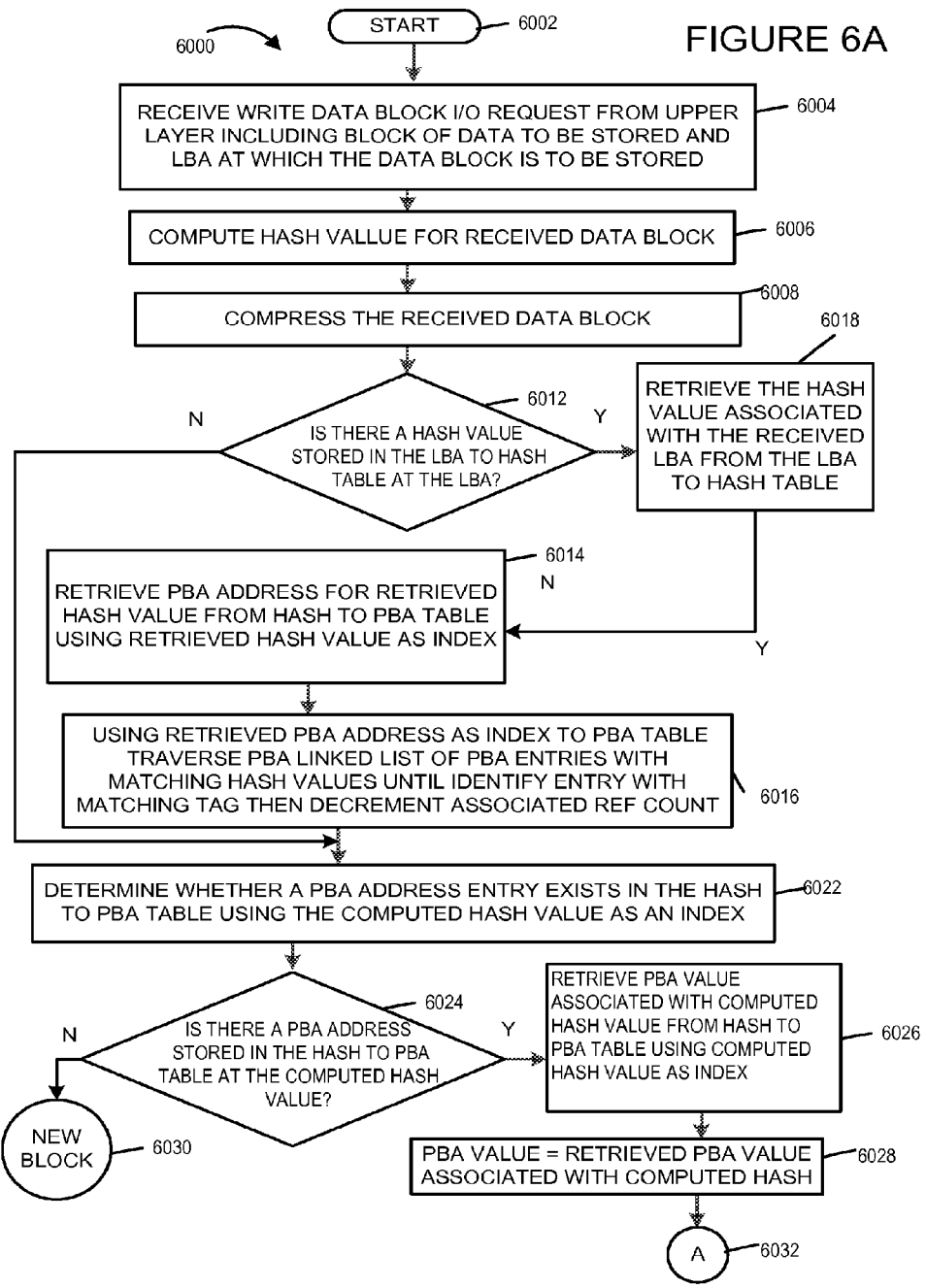

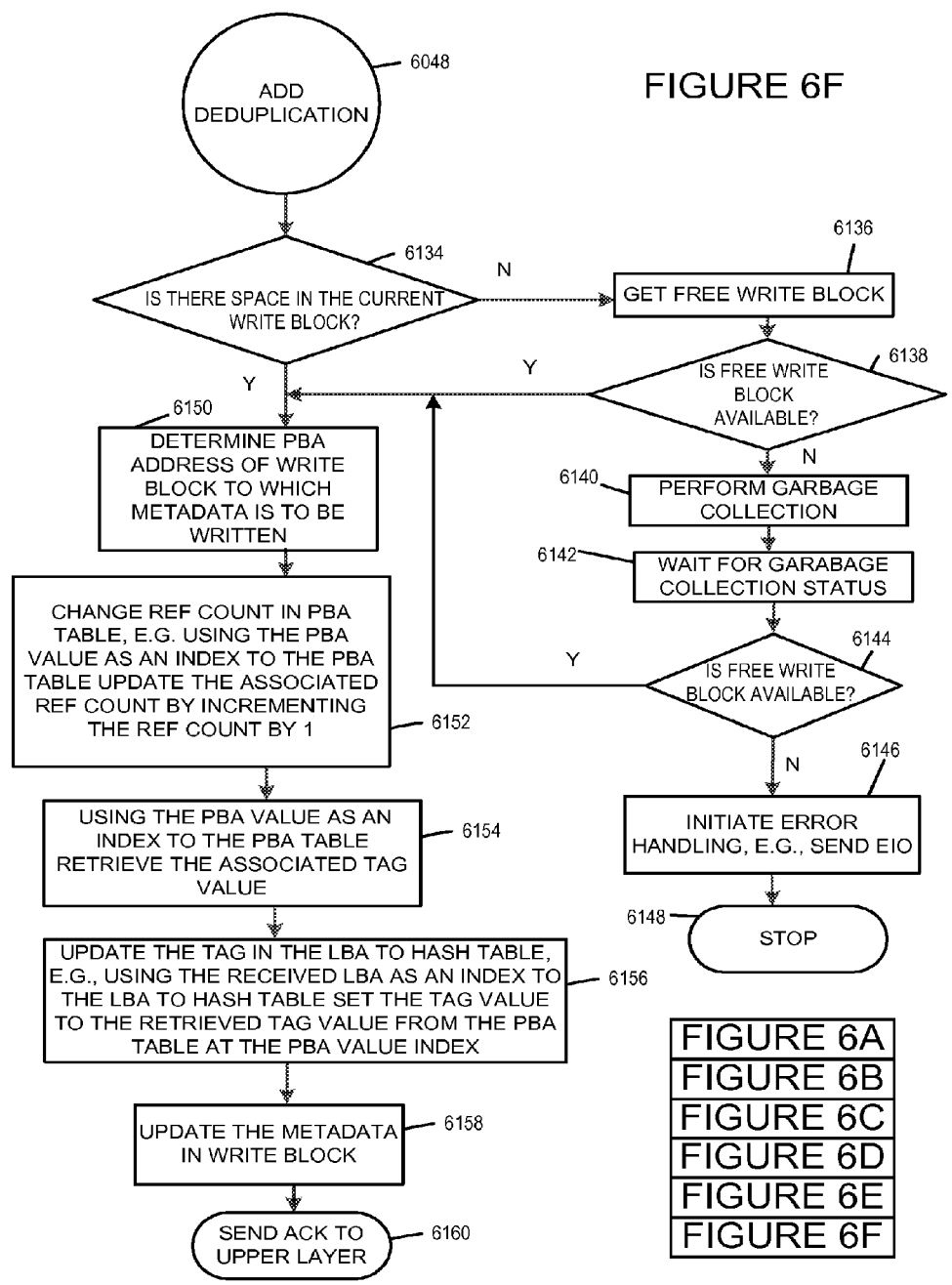

METHODS AND APPARATUS FOR DATA PROCESSING USING DATA COMPRESSION, LINKED LISTS AND DE-DUPLICATION TECHNIQUES

RELATED APPLICATION

This application is a continuation (and claims the benefit of priority under 35 U.S.C. §120) of U.S. application Ser. No. 13/745,503, filed Jan. 18, 2013, entitled "METHODS AND APPARATUS FOR DATA PROCESSING USING DATA COMPRESSION, LINKED LISTS AND DE-DUPLICATION TECHNIQUES" Inventor James Candelaria. The disclosure of the prior application is considered part of (and is incorporated by reference in) the disclosure of this application.

FIELD

The present application relates to data processing methods and apparatus and, more particularly, to methods and apparatus for storing and retrieving data using data compression, linked lists, and de-duplication techniques.

BACKGROUND

With the rise of computer systems and the ever increasing reliance of industries, businesses, and individuals on the use of electronic data there has arisen a need to be able to successfully store and retrieve large amounts of data in electronic form in a fast, efficient and economical way. For purposes of storing electronic data, hereinafter simply referred to as data, data is often broken up into blocks of a particular size. For example, data may be broken into 4 kilobyte blocks referred to as 4 k blocks of data. In storing data, the amount of data to be stored normally corresponds to the size of the physical storage device required to store the data. The larger the storage device required to meet the storage demands the higher the cost of the storage system. As a result, the compression of blocks of data received for storage has been used in some data storage systems to minimize the amount of data to be stored.

In addition to compressing blocks of data, prior known systems have also attempted to de-duplicate, e.g., eliminate the storage of duplicate blocks of data. However, such systems which use de-duplication require additional data processing and memory to track and properly manage the de-duplication of data blocks and the requests to store and retrieve blocks of data that may be duplicative. One approach that has met some limited success in managing the tracking of the de-duplicated data blocks has been to use a one way hash function to create a hash value to be associated with the physical address of where the block of data is stored. In such systems hash values corresponding to blocks of data can be compared to determine if the blocks of data are the same. Given that the hash value in such systems is usually around 128 bits, which is normally shorter than the length of the blocks of data being stored, in such a system two different blocks of data may result in the production of the same hash value. The use of a relatively long hash value in combination with a good hash function minimizes the probability that two blocks of data will result in the same hash value when processed. However, the possibility of two different blocks of data resulting in the same hash value, sometimes referred to as a collision, remains a real possibility. The known systems which use a very computationally heavy and complex hash function such as MD-5 and a hash value of 128 bits to provide a low risk of collisions have the distinct disadvantage of involving the use of specialized hardware to implement the hash function. Thus, the current approach has disadvantages in terms of cost due to hardware requirements as well as flexibility in terms of how a system can be implemented since support for the specialized hardware used to perform the MD-5 hash function needs to be provided in at least some known systems. Additionally, in some systems the process for determining whether a block of data received for storage is duplicative includes retrieving each previously stored block of data having a matching hash value from the storage media which is very time consuming In some instances, some users wish to optimize the speed at which the data is stored and/or retrieved from the storage media and are willing to forego the de-duplicating of data to avoid delays in storage and/or retrieval due to the de-duplication process.

The management of the storage and retrieval of data in data storage apparatus is important to ensuring that data is properly tracked especially when de-duplication of data blocks is utilized to reduce the amount of data needed to be stored. Moreover, the methods used to manage the storage and retrieval of data from the physical storage device is also important to the amount of time it takes to store and/or retrieve data from the physical storage device.

The type of physical storage device or media, e.g., ROM, RAM, magnetic disk, optical disk, hard drives, solid state memory, upon which the data is stored is an additional aspect of a storage apparatus that affects the speed at which data can be stored on and retrieved from the physical storage device. For example, magnetic disks or drums have mechanical limitations that reduce the speed with which data can be read from the media.

Thus, there is a need for data processing methods and apparatus that can efficiently and effectively manage the storage and retrieval of data while reducing the amount of data to be stored as well as the amount of memory used to track the storage of data. Furthermore, there is a need for data processing methods and apparatus that can use lighter weighted and computationally simpler, hash functions than those currently being used in the management of data storage systems today. In particular, there is a need for methods and apparatus which allow for data de-duplication, e.g., using a hash function and/or other techniques, but without requiring specialized hardware, e.g., to implement the hash function. Moreover, there is a need for improved data de-duplication that reduces and/or minimizes the time it takes to identify duplicative data blocks without retrieving each potentially duplicative data block from physical media storage device. There is also a need for improved data storage with de-duplication methods and apparatus that reduce and/or minimize the time for storing blocks of data while also performing some de-duplication.

SUMMARY

Data processing methods and apparatus for efficiently storing and retrieving data, e.g., blocks of data, to and from memory are described. In various embodiments, data de-duplication is supported to avoid writing the same block of data to physical storage multiple times. In addition to data de-duplication, data compression is supported and used in some embodiments.

Various features of the present invention are well suited for supporting data de-duplication without the need for specialized hardware for implementing a hash function used as part of the data de-duplication process. In at least some embodiments, the hash function used for data duplication is sufficiently light in terms of computational complexity that it can be readily implemented in software thereby avoiding the need for specialized hardware used by some systems. To minimize storage requirements with regard to the storage of hash values, hash values of relatively few bits, e.g., less than 128 bits, are used in some embodiments. In fact, some embodiments use hash values which may be anywhere from 22 to 31 bits depending on the embodiment.

While the use of short hash values allows for less hash value storage requirements and lower computational complexity than systems which use much longer hash values, the risk of collisions increases as shorter hash values are used.

Various features of the present invention are directed to determining if a data block with a hash value that matches the hash value of a previously stored block of data matches the previously stored block of data, i.e., is a duplicate of the previously stored data, or a different data block that needs to be stored.

In one embodiment, when a hash value is generated from a data block to be stored matches the hash value of a previously stored data block, a determination is made to determine if the block of data to be stored matches the previously stored data block. This determination involves, in at least some embodiments, a comparison of the uncompressed size of the data block to be stored to the uncompressed size of the previously stored data block with the matching hash value or a comparison of the compressed size of the data block to be stored to the compressed size of the previously stored data block with the matching hash value. If the size comparison that is performed indicates a size miss-match, it is determined that the data block to be stored does not match, i.e., is not a duplicate of, the previously stored block of data with matching hash value.

The size comparison step is computationally easy to implement and will identify a large number of the non-duplicative data blocks with a hash value that matches a hash value of a previously stored data block.

Assuming that the size comparison does not determine that the data block to be stored does not match the previously stored data block with a matching hash value, a bit by bit comparison of the uncompressed data block to be stored to an uncompressed version of the stored data block with the matching hash value is performed or a bit by bit comparison of a compressed version of the data block to be stored to a compressed version of the previously stored data block with the matching hash value is performed. Since the compression is loss-less it should be appreciated that the compressed data blocks will not match if the content of the original uncompressed data blocks are different. If the bit by bit comparison that is performed indicates a match, the data block to be stored is determined to be a duplicate of a previously stored data block. If the bit by bit comparison does not result in a match, the data block to be stored is determined to be non-duplicative and is stored in the storage device.

In some embodiments the speed with which data is stored and/or retrieved from the storage device is important or even critical. In some of these embodiments a limited form of de-duplication is performed by determining if one or a few of the previously stored blocks of data with a hash value that matches the hash value of the current block of data received for storage is a duplicate. If the one or more blocks are determined not to be duplicative the received block of data is treated as not being a duplicate and is stored in the storage device. The one or more blocks with the matching hash value are, in some embodiments the one or more blocks which were most recently stored. In one such embodiment a single block with a matching hash value is checked before determining and treating the block to be stored as not being a duplicate. In such embodiments multiple duplicative blocks may end up being stored in the storage device but the speed of storing data is increased as compared to other embodiments where all blocks with a hash value matching the hash value of the block to be stored are checked to eliminate the possibility of storing a duplicate block.

In some embodiments, the compressed size of each previously stored block of data with a hash value that matches the hash value of the block of data received for storage is compared to the size of the block of data received for storage after compression. Blocks with different compressed sizes from the block of data waiting to be stored are determined to be non-duplicative without having to retrieve and compare the stored blocks with the matching hash values to the block of data waiting to be stored.

If there is a match in compressed size and the hash value, in some embodiments, only one or a few of the previously stored blocks of data with matching hash values and compressed sizes are retrieved from the storage device and compared to determine if in the one or more blocks of data is a duplicate. Absent a match between the block to be stored and one of the retrieved blocks, the received block of data is treated as a unique block of data and the compressed version of the data block is stored in the storage device. In some embodiments, the number of the previously stored blocks of data with hash values that match the hash value of the received block that will be retrieved and checked in the event of a hash value match and/or hash and compressed size match is configurable so that the level of de-duplication and thus tradeoff between speed and storage space used due to storage of duplicate blocks can be customized and controlled by a user.

Various tables and linked lists are maintained and used in various embodiments to keep track of where physical data blocks are stored in the physical memory and the mapping between logical and physical addresses. The tables allow for the retrieval and access of data stored at physical addresses based on logical addresses which were used by the routine or application which sent the block write or read request to the storage device implementing the method described herein.

In some embodiments one or more of the following tables and/or linked lists are used: a logical block address to hash value table; a hash value to physical block address table; a physical block address table; and a physical block address linked list.

Through the use of the tables and/or linked lists multiple different logical addresses can be used to access the same block of data stored at a location indicated by the physical block address of the stored block. Furthermore, multiple different blocks corresponding to the same hash value can be stored and retrieved, e.g., through the use of the linked lists, in an efficient manner without the need to store duplicate copies of the same data block.

The tables and/or linked lists can, and in some embodiments are, stored in more than one location to provide system redundancy. However, in some but not necessarily all embodiments the tables and/or linked lists are not duplicated or stored multiple times in the system.

The methods and apparatus of the present invention are implemented in some embodiments on a storage node which includes a processor which performs hash functions using software without the aid of specialized hash function hardware. The storage node may include silicon storage for storing the data blocks as well as the tables and/or linked lists used for accessing the stored blocks of data.

While various exemplary embodiments and features have been described, numerous additional features and embodiments are described in the detailed description which follows.

BRIEF DESCRIPTION OF THE FIGURES

FIG. 3B which is a second part of FIG. 3 illustrates a second portion of an exemplary method for processing data in accordance with one embodiment of the present invention.

FIG. 3C which is a third part of FIG. 3 illustrates a third portion of an exemplary method for processing data in accordance with one embodiment of the present invention.

FIG. 3D which is a fourth part of FIG. 3 illustrates a fourth portion of an exemplary method for processing data in accordance with one embodiment of the present invention.

FIG. 5A which is a first part of FIG. 5 illustrates a first portion of an exemplary routine that may be, and in some embodiments of the present invention is, used to obtain information regarding the configuration of a system or apparatus implemented in accordance with one embodiment of the present invention.

FIG. 6A which is a first part of FIG. 6 illustrates a first portion of an exemplary method for processing write requests in accordance with one embodiment of the present invention.

FIG. 6F which is a sixth part of FIG. 6 illustrates a sixth portion of an exemplary method for processing write requests in accordance with one embodiment of the present invention.

DETAILED DESCRIPTION

Figure 1:
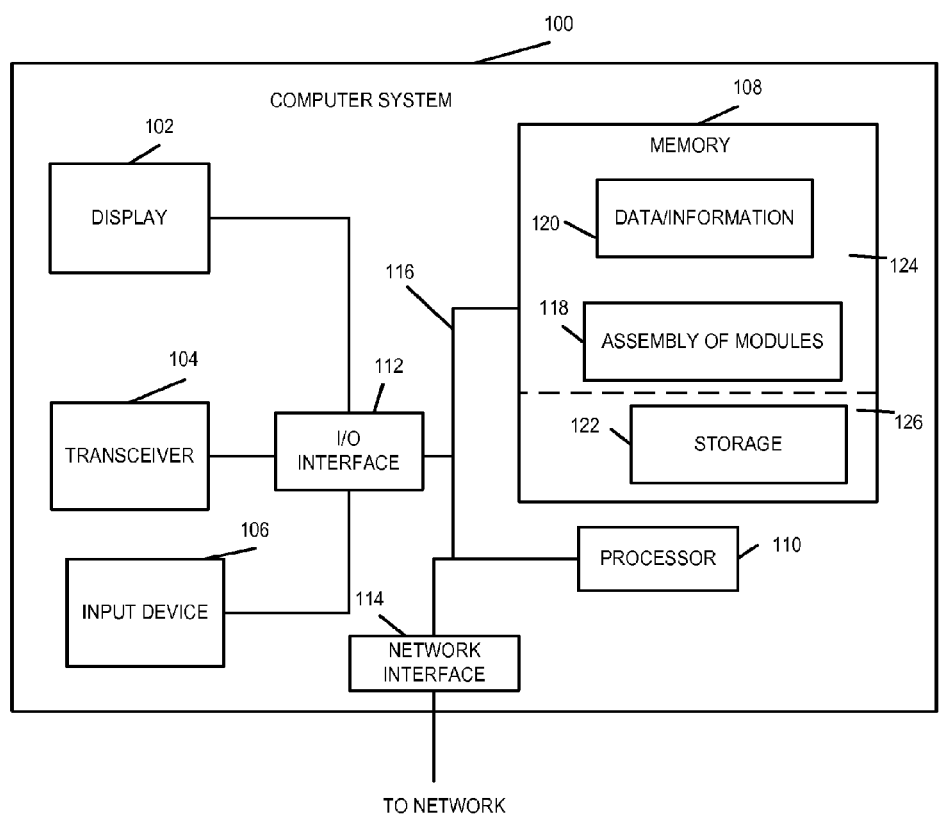
FIG. 1 illustrates an exemplary system in accordance with one embodiment of the present invention.

FIG. 1 illustrates an exemplary system, e.g., computer system 100, for processing data, e.g., writing and reading data from memory in accordance with one embodiment of the present invention. The data being processed may be, and in various embodiments are, blocks of data. In some embodiments of the present invention, the exemplary system 100 is implemented as an apparatus.

The exemplary system 100 includes a display device 102, a transceiver 104 for transmitting and receiving items such as for example requests, commands, instructions, data and information, an input device 106, e.g., keyboard that may be used for inputting information, data and/or instructions, memory 108, a processor 110, a network interface 114, and an I/O interface 112. The display device 102 may be, and in some embodiments is, used to display information regarding the configuration of the system and/or status of data processing being performed on the system. The display device 102, transceiver 104 and input device 106 are coupled to a bus 116 by an I/O interface 112. The bus 116 is also coupled to the memory 108, processor 110 and network interface 114. The network interface 114 couples the internal components of the system 100 to an external network, e.g., the Internet, thereby allowing the system 100 to receive data for processing over a network or output processed data to the network.

The processor 110 controls operation of the system 100 under direction of software modules and/or routines stored in the memory 108. Memory 108 includes memory assembly of modules 118 wherein one or more modules include one or more software routines, e.g., machine executable instructions, for implementing the data processing methods of the present invention. Individual steps and/or lines of code in the modules of 118 when executed by the processor 110 control the processor 110 to perform steps of the method of the invention. When executed by processor 110, the data processing modules 118 cause at least some data to be processed by the processor 110 in accordance with the method of the present invention. The resulting data and information (e.g., received data block to be stored, hash value of received data block, compressed version of received data block) are stored in data/information memory 120 for future use or additional processing and/or output, e.g., to display device 102 to be displayed. Memory 108 also includes storage 122 for storing data such as data blocks received for storage and later retrieval. The memory 108 includes different types of memory for example, Random Access Memory (RAM) 124 in which the assembly of modules 118 and data/information 120 may be, and in some embodiments are, stored during data processing activities, and silicon storage memory such as NAND Flash memory 126 in which data blocks are stored for later retrieval in storage 122. Storage 126 may, and in some embodiments does, include one or more silicon storage disks. In at least some embodiments, the assembly of modules is stored in ROM memory separate from storage 122.

In some but not all embodiments the network interface 114 supports a 4/8 GB/s Fibre Channel connection, 1/10 Gb Ethernet connection, and/or a 40 Gb Infiniband channel.

Figure 2:
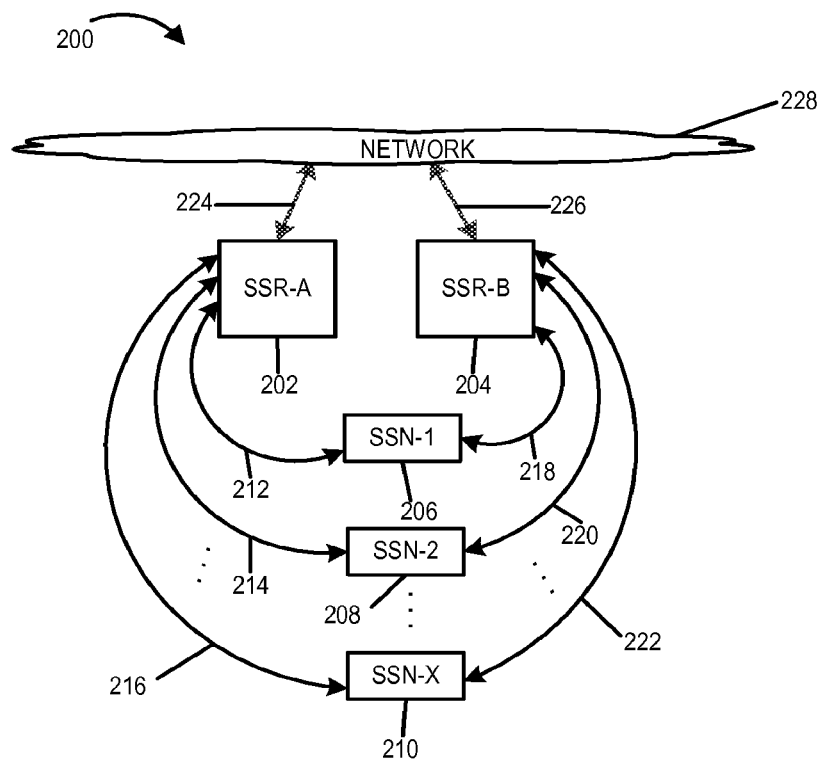
FIG. 2 illustrates exemplary silicon storage nodes in accordance with one embodiment of the present invention used in an exemplary solid state storage array coupled to a network.

In some embodiments of the present invention exemplary system 100 is a silicon storage node (SSN) such as SSN-1 202 of FIG. 2 that may be, and in some embodiments of the present invention, is part of a solid state storage array.

FIG. 2 illustrates an exemplary solid state storage array 200 including exemplary silicon storage routers SSR-A 202 and SSR-B 204 and silicon storage nodes SSN-1 206, SSN-2 208, . . . , SSN-X 210. Data links 212, 214, . . . , 216, 218, 220, . . . , 222 couple various elements of the solid state storage array and allow for the communication of requests, commands, instructions, data and information to occur between the various components included in the solid storage array 200. Data link 224 couples the SSR-A 202 to a network 228 which may, and in some embodiments does, include additional storage equipment. Data link 226 similar to data link 224 couples SSR-B 204 to network 228. SSR-A and SSR-B are only meant to be exemplary as in some systems there are additional silicon storage routers and additional data links for connecting the routers to silicon storage nodes and the network 228. Data links 224 and 226 allow for the communication of requests, commands, instructions, data and information to occur between the silicon storage routers of the solid state array and the equipment included in the network 228. Data links 212, 214 and 216 couple silicon storage router SSR-A 202 to silicon storage nodes SSN-1 206, SSN-2

208, and SSN-X 210 respectively. Data links 218, 220 and 222 couple silicon storage router SSR-B 204 to silicon storage nodes SSN-1 206, SSN-2 208, and SSN-X 210 respectively. The illustrated number of silicon storage routers, silicon storage nodes, and the number and arrangement of data links used to couple them together is only meant to be exemplary and may vary.

Figure 7:
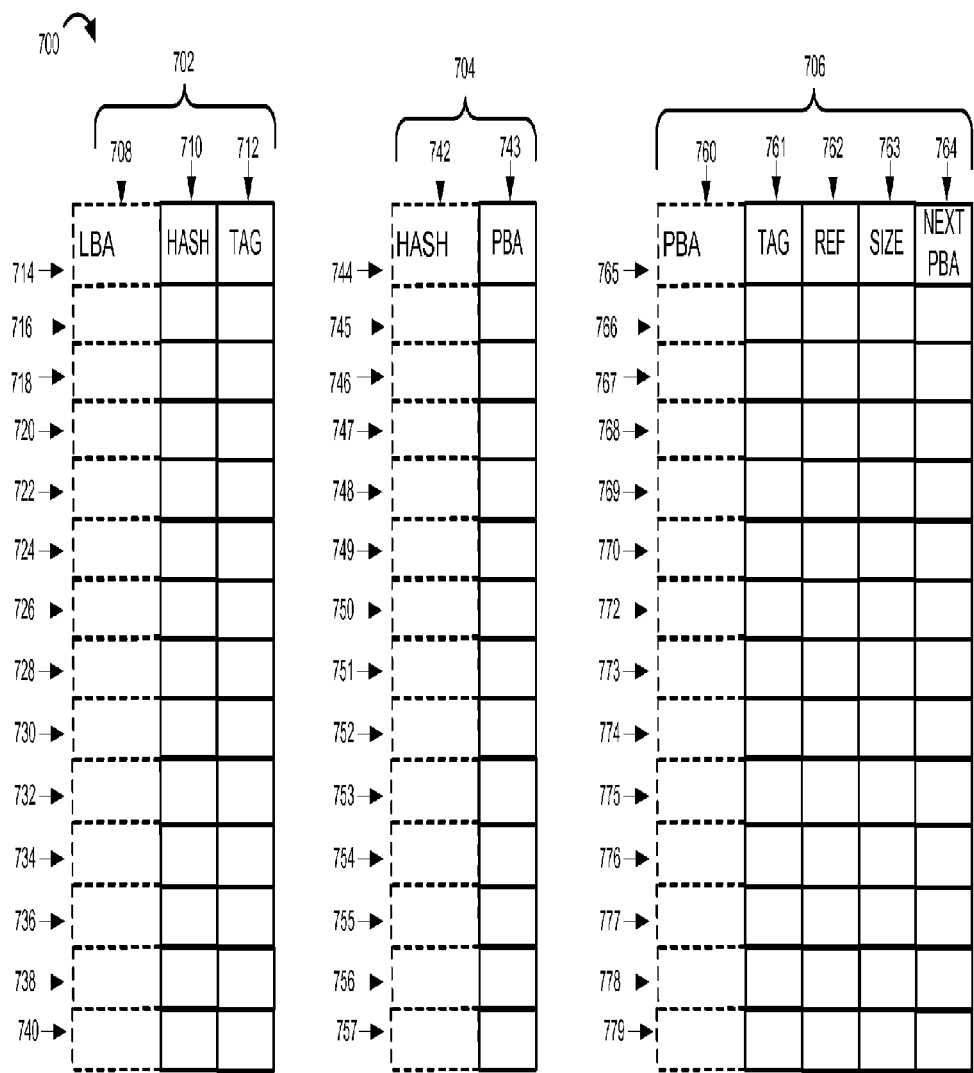
FIG. 7 illustrates exemplary tables that may be, and in some embodiments are, used in implementing the present invention.

Diagram 700 of FIG. 7 illustrates exemplary tables that may be, and in some embodiments are, used in implementing the present invention. Diagram 700 includes logical block address (LBA) to hash value (hash) table 702 also referred to herein as LBA to hash table 702, hash value to physical block address (PBA) table 704 also referred to herein as hash to PBA table, and physical block address (PBA) table 706 also referred to herein as PBA table.

The LBA to hash table 702 includes three columns of information. The first row 714 of the LBA to hash table 702 is a header that is not part of the table but is merely provided to help explain the table. The first column 708 of the LBA to hash value table 702 includes logical block addresses, the second column 710 of the LBA to hash value table 702 includes hash values, and the third column 712 of the LBA to hash value table includes tag values. The table includes a plurality of rows wherein each row of the table associates the data contained in that row. For example, in the first row of the table which may contain content row 716 the logical block address in the first column 708 of the row 716 is associated with the hash value in the second column 710 of the row 716 and tag value in the third column 712 of the row 716. In some embodiments, column 708 which includes the logical block address information is merely an index into the table and not a column of data in the table.

The hash value to PBA table 704 includes two columns of information. The first row 744 of the hash value to PBA table 704 is a header that is not part of the table but is merely provided to help explain the table. The first column 742 of the hash value to PBA table 704 includes hash values and the second column 743 of the hash value to PBA table 704 includes physical block addresses. The table includes a plurality of rows wherein each row of the table associates the data contained in that row. For example, in the first row of the table which may contain content row 745 the hash value in the first column 742 of the row 745 is associated with the physical block address in the second column 743 of the row 745. In some embodiments, column 742 which includes hash values is merely an index into the table 704 and is not a column of data in the table.

The physical block address (PBA) table 706 includes five columns of information. The first row 765 of the PBA table 706 is a header that is not part of the table but is merely provided to help explain the table. The first column 760 of the PBA table 706 includes physical block addresses, the second column 761 of the PBA table 706 includes tag values, the third column 762 of the PBA table includes reference values, the fourth column 763 of the PBA table 706 includes size values, and the fifth column 764 of the PBA table includes a next physical block address. The table includes a plurality of rows wherein each row of the table associates the data contained in that row. For example, in the first row of the table which may contain content row 766 the physical block address in the first column 760 of the row 766 is associated with the tag value in the second column 761 of the row 766, the reference value in the third column 762 of the row 766, the size value of the fourth column 763 of row 766, and the next physical block address of the fifth column 764 of the row 766. In some embodiments, column 760 which includes the physical block address information is merely an index into the table and not a column of data in the table.

Figure 3A:
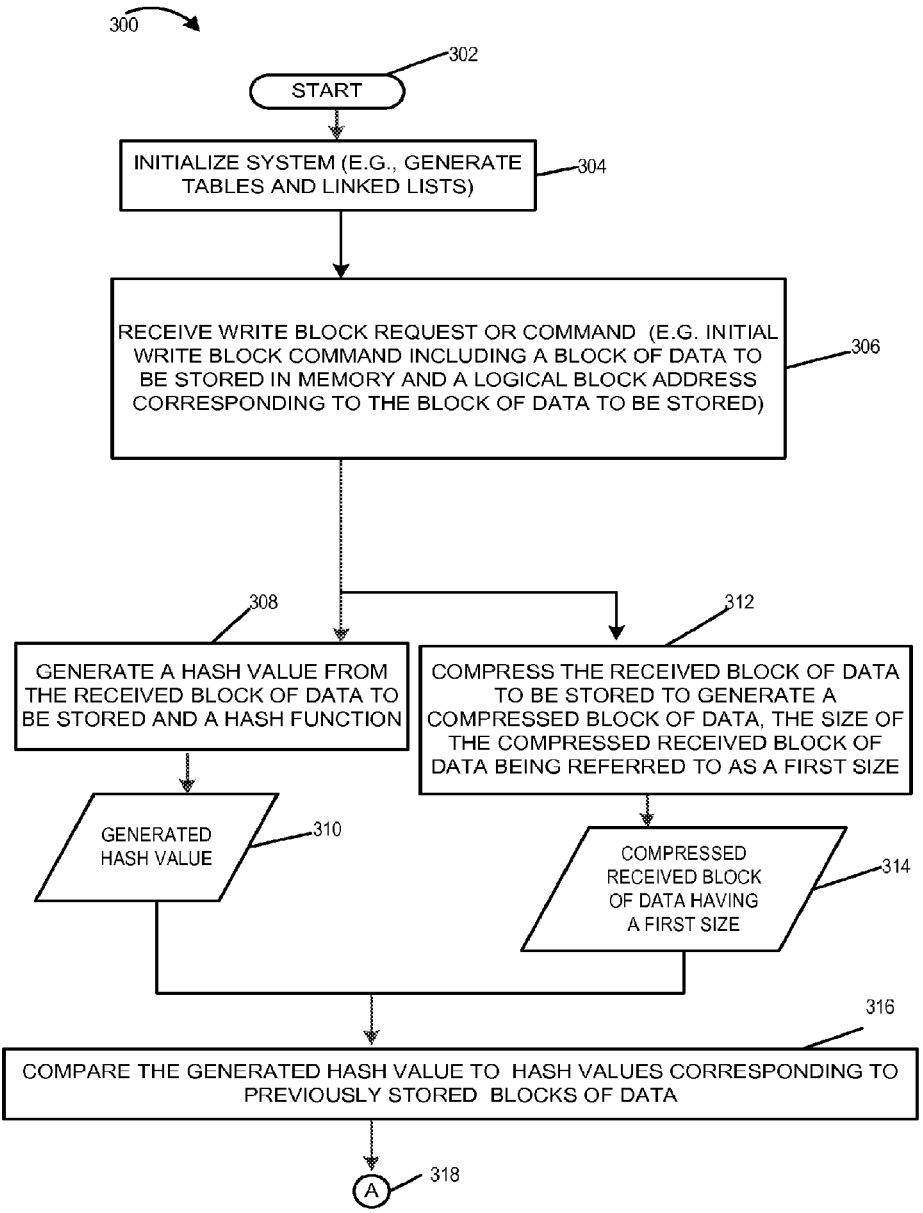
FIG. 3A which is a first part of FIG. 3 illustrates a first portion of an exemplary method for processing data in accordance with one embodiment of the present invention.
Figures 3, 3E:
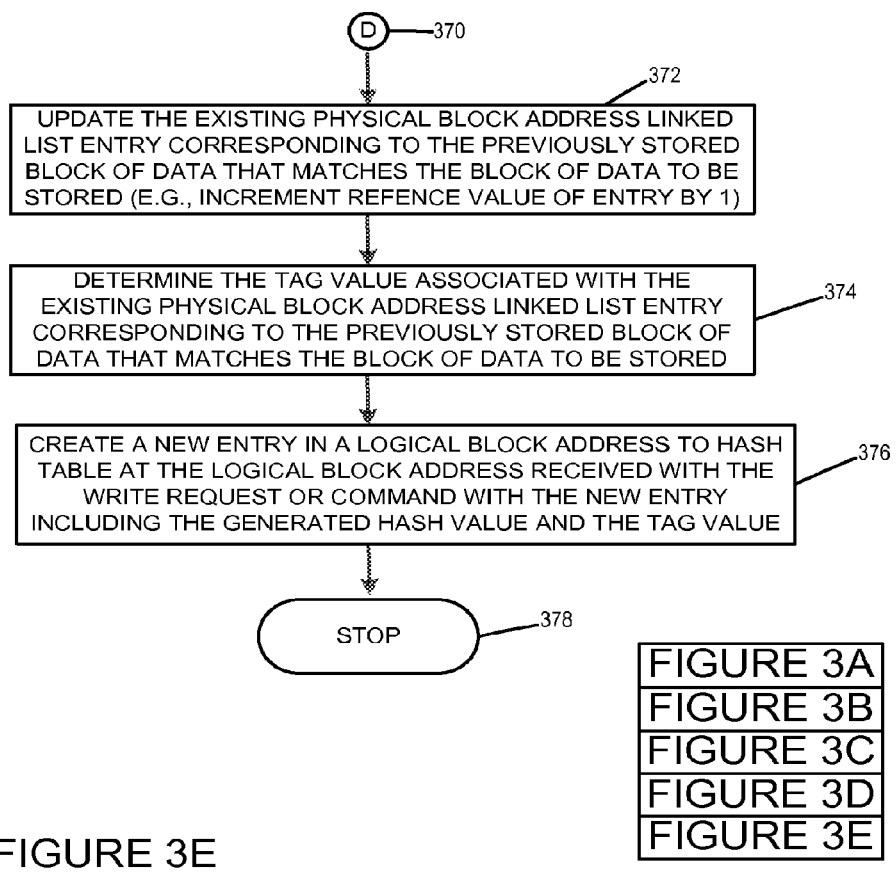
FIG. 3E which is a fifth part of FIG. 3 illustrates a fifth portion of an exemplary method for processing data in accordance with one embodiment of the present invention.

FIG. 3 which includes FIGS. 3A, 3B, 3C, 3D and 3E illustrates an exemplary method of processing write requests or commands in accordance with an exemplary embodiment of the present invention. The method 300 of FIG. 3 is an example used to explain various features of the invention. The example shown in FIG. 3 assumes that a single data block has previously been processed and stored and the example shows the processing associated with a second data block to be stored. It should be appreciated that additional blocks of data may be processed and stored after the processing described with respect to the second block of data.

The processing steps of the method 300 of FIG. 3 will be now be explained in view of system 100 of FIG. 1.

The method 300 of FIG. 3 starts at start step 302 with the steps of the method being executed on processor 110 from which processing proceeds to step 304.

In step 304 the system is initialized which includes generating and initialized tables and linked lists to be used in tracking the storage locations of blocks of data to be stored in memory. In some embodiments for example step 304 includes setting up a physical block address linked list (PBA linked list), a logical block address to hash value table (LBA to HASH VALUE TABLE), and a hash value to physical block address table (HASH to PBA table). In at least some embodiments of the present invention, a physical block address table (PBA table) is also created as part of the initialize process. From step 304 processing proceeds to step 306.

In step 306 transceiver 104 receives a write block request or command. The write block request or command includes a block of data to be stored in memory and a logical block address (LBA) corresponding to the block of data to be stored. The write request may be, and in some embodiments is, received via network interface 114, I/O Interface 112, and transceiver 104. In at least some embodiments of the present invention, the I/O Interface 112 includes the transceiver 104. The received block of data and corresponding logical block address may be, and in some embodiments is, stored in data/information section of memory 120 of RAM memory 124 so that it is available for use in additional processing steps of the method 300.

Processing proceeds from receiving step 306 to hash generation step 308 and compression step 312. Steps 306 and 308 may be, and in some embodiments of the present invention are, performed in parallel. These steps may be, and in some embodiments are, performed sequentially. The ordering of the processing of the steps 308 and 312 is not important.

In step 308 a hash value is generated from the received block of data to be stored and a hash function. In some embodiments of the present invention, the mumur hash function, e.g., mumurhash2, is used to generate a 24 bit hash value for the received block of data to be stored. The first 24 bits of the value calculated by applying the mumur hash function to the block of data to be stored is the generated hash value. The mumur hash function is exceedingly fast and has good collision resistance characteristics. The size of the hash value generated may be, and in some embodiments is, user configurable for example with the number of bits being chosen from the range of 24-31 bits. As the distribution over the hash function is approximately the same the first 24-31 bits calculated will be used as the generated hash value. The higher the number of bits used the lower the number of collisions, i.e., unique blocks of data having the same hash values. In those instance when the size of the hash value is configurable the size of the hash value is typically configured during the initialization step 304. Once set the hash value size remains in effect for all subsequent processing of data blocks as the hash value is utilized as part of the storage and/or de-duplication process.

The generated hash value 310 outputted from hash value generation step 308 may be, and in some embodiments is, stored in the data/information section of memory 108 for later use in additional processing steps. From step 308 processing proceeds to step 316.

In compression step 312, the received block of data to be stored is compressed to generate a compressed block of data. The compressed block of data inherently has a size. The size is referred to hereinafter as a first size. The compression function and/or technique used to compress the received block of data to be stored is a loss-less compression function, i.e., no data will be lost when the block of data is compressed. Upon uncompressing the compressed block of data the original unaltered block of data received for storage will be obtained.

The compressed received block of data having a first size 314 outputted by compression step 312 may be, and in some embodiments is, stored in the data/information section 120 of memory 108 for later use for example in additional processing steps of the method 300.

Processing proceeds from step 312 to step 316. In step 316, the generated hash value 310 is compared to the hash values corresponding to previously stored blocks of data. In some embodiments, the comparison is performed by accessing the hash value to physical block address table and using the generated hash value as an index to the table determining if there is an entry in the table corresponding to the generated hash value.

Processing proceeds from step 316 via connection node A 318 to decision step 320 shown on FIG. 3B.

In decision step 320, a decision is made as to whether the generated hash value matches a hash value of a previously stored block of data. If the generated hash value does not match a hash value of a previously stored block of data processing proceeds via connection node B 380 to determination step 382 shown on FIG. 3D. Otherwise, processing proceeds to step 324. In step 382, a determination is made that the block of data to be stored does not match any previously stored blocks of data. Processing then proceeds to step 384. In step 384, the compressed block of data is stored in memory, e.g., in storage 122 of silicon storage 126, at a free physical block address. Processing then proceeds to step 386 where a new physical block address linked list entry corresponding to the generated compressed block of data is created. Processing step 386 includes sub-steps 388, 390, and 392. Processing starts at sub-step 388. In step 388 a next physical block address is included in the new entry and set to null and the size information indicating the size of the compressed block of data, i.e., the first size, is included in the new entry. Processing then proceeds to sub-step 390. In sub-step 390 a tag is included in the new entry and is set to the value of 1 indicating this is the first entry in the physical block address linked list also referred to as the head of the this linked list. Processing then proceeds to sub-step 392. In sub-step 392 a reference value set to 1 indicating this is the first reference corresponding to the block of data to be stored from which the compressed block of data was generated is included in the new entry. Processing then proceeds from step 386 to step 394.

In step 394, a new entry in a logical block address to hash table is created associating the received logical block address with the generated hash value 310 and the tag value of 1. In some embodiments, the logical block address to hash table uses the logical block address as the index to the logical block address to hash table. Processing then proceeds from step 394 to step 396.

In step 396, a new entry in the hash to physical block address table is created using the generated hash value 310 as the index to the table and setting the associated entry to the physical block address in which the compressed data block was stored in step 384. Processing then proceeds to stop step 398.

In stop set 398 processing associated with the write request or command received in step 306 concludes. Additional processing may occur for example in connection with additional write or read requests or commands sent to the data processing system 100.

Tables and/or linked lists that were updated during the processing in response to the received request may be, and in some embodiments, are stored in data/information 120 section of memory 108 as well as in storage 122 of memory 108 for later use. By storing the updated tables and/or linked lists in RAM and Silicon Storage memory the information is both accessible to the processor in RAM memory while also stored in silicon storage memory where it can serve as a backup to the version of the tables and linked lists stored in RAM should they be lost or corrupted, such as during a power failure.

Returning now to decision step 320, in decision step 320 when the generated hash value 310 does match a hash value of a previously stored block of data processing proceeds to step 324 where a do loop is executed. The do loop is performed for each previously stored block of data with a matching hash value until: (i) a previously stored block of data is determined to match said block of data to be stored or (ii) there are no more previously stored blocks of data with a matching hash value. This do loop is used to evaluate whether any of the previously stored blocks of data having a hash value matching the generated hash value 310 are a match to the block of data to be stored which was received in step 306. The do loop allows each previously stored block of data with a matching hash to be evaluated one at a time. Upon first proceeding to step 324, the first previously stored block of data with a matching hash value is evaluated.

In some embodiments of the present invention the speed with which data is stored and/or retrieved from the storage 122 is important or even critical. In some of these embodiments, a limited form of de-duplication may be, and often is, implemented wherein limits are introduced on the number of previously stored blocks of data to be evaluated for de-duplication and/or time limits on the duration that the de-duplication process may be performed before a determination is made that the block of data should be identified as not matching a previously stored block of data for de-duplication purposes. In such embodiments multiple duplicative blocks may end up being stored in the storage 122 but the speed of storing data is increased as compared to other embodiments where all blocks with a hash value matching the hash value of the block to be stored are checked to eliminate the possibility of duplicates.

In some of these embodiments with limited de-duplication, the system may be, and often is, configurable by the user so that the user can specify one or more of the following parameters: (1) the maximum number of previously stored blocks of data with a matching hash value to be checked for de-duplication purposes, (2) the maximum number of blocks of data with a matching hash value and a matching size to be checked for de-duplication purposes, (3) the maximum duration of time allowed for the de-duplication process to determine if the block of data to be stored matches a previously stored block of data with a matching hash value before automatically making a determination that the block of data to be stored should be identified and treated as a non-duplicative block of data (e.g., the maximum duration of time for step 324 to be performed before the determination is made that the block of data to be stored should not be treated as a duplicate). In some embodiments one or more of the aforementioned parameters may be a fixed value instead of a user configurable value. In some embodiments each of the configurable parameters may be adjusted during system usage either by the user or by the system, for example based on or as a function of the amount of free storage space available in memory storage 122. By way of example, as memory storage 122 reaches one or more thresholds of capacity usage (e.g., 50%, 75%, 95%, etc.) the maximum duration of time allowed for de-duplication and/or the maximum number of previously stored blocks of data with a matching hash value and/or the maximum number of previously stored blocks of data with a matching hash value and a matching size may be increased allowing for the optimization of the storage 122 as storage capacity becomes more important. In embodiments including one or more of the aforementioned parameters, the do loop previously discussed is performed for each previously stored block of data with a matching hash value until one of the following events occurs: (i) a previously stored block of data is determined to match said block of data to be stored, (ii) there are no more previously stored blocks of data with a matching hash value, (iii) the maximum number of previously stored blocks of data with a matching hash value to be checked for de-duplication purposes has been exceeded, (iv) the maximum number of blocks of data with a matching hash value and a matching size to be checked for de-duplication purposes has been exceeded, (v) the maximum duration of time allowed for the de-duplication process to determine if the block of data to be stored matches a previously stored block of data with a matching hash value before automatically making a determination that the block of data to be stored should be identified and treated as a non-duplicative block of data (e.g., the maximum duration of time for step 324 to be performed before the determination is made that the block of data to be stored should not be treated as a duplicate) has been reached. If the events identified in (iii), (iv), or (v) cause the do loop to be exited then a determination is made that said block of data to be stored does not match a previously stored block of data even though all previously stored blocks of data with a matching hash value may not have been checked to determine if the block of data to be stored is duplicative. Processing proceeds to step 338. This will result in the block of data received in the write request or command to ultimately be stored to in storage 122 even if it is a duplicate.

In some embodiments of the present invention wherein a limited de-duplication process is perform a do loop is not used and the determination step 324 is executed a single time. In such embodiments, the de-duplication process is performed with respect to the first identified block of data that was previously stored with a matching hash value. If that previously stored block of data is determined not to be a match to the received block of data then the received block of data is treated as not being a duplicate and will be stored in the storage 122. In such embodiments duplicate blocks of data may be, and in some instances are, stored in storage 122 but as previously discussed such a limited de-duplication process allows for the storage of blocks of data with increased speed as opposed to checking each previously stored block of data with a matching hash value to determine if the block of data to be stored is duplicative.

In step 324, a determination is made as to whether the block of data to be stored matches the previously stored block of data with the matching hash value. Determination step 324 includes sub-steps 326, 328, 330, 332, 336, 338, 342, 344, 346, and 348. Processing starts at sub-step 326 when the first size which is the size of the compressed block of data to be stored is compared to the previously stored block of data with the matching hash value being evaluated. After the comparison is performed in sub-step 326 processing proceeds to decision sub-step 328 wherein when said first size does match the size of the previously stored block of data with the matching hash value being evaluated processing proceeds to bit-by-bit comparison sub-step 342 and when the first size does not match the size of the previously stored block of data with the matching hash value being evaluated processing proceeds to determination sub-step 330.

In determination sub-step 330, it is determined that said block of data to be stored does not match said previously stored block of data under evaluation. Processing then proceeds to decision sub-step 332.

In decision sub-step 332, a decision is made that if there are additional previously stored blocks of data with a hash value that matches the generated hash value 310 then move to processing the next previously stored block of data with a matching hash value. In this way the next iteration of the do loop is begun. Processing proceeds via connection node Z 334 to step 324 and sub-step 326 where processing continues and the next previously stored block of data with a matching hash value is evaluated.

If in decision sub-step 332, a decision is made that there are no additional previously stored blocks of data with a hash value that matches the generated hash value 310 then processing proceeds to sub-step 336 where the do loop is ended as there are no more previously stored blocks of data with a matching hash value to be evaluated. Processing proceeds from sub-step 336 to determination sub-step 338.

In determination sub-step 338, a determination is made that said block of data to be stored does not match a previously stored block of data. Processing then proceeds from sub-step 338 of step 324 to steps 352 and 356 shown on FIG. 3C via connection node C 350. Processing steps 352 and 356 may be, and in some embodiments are performed in parallel. Processing steps 352 and 356 may be, and in some embodiments are, also performed sequentially. If the processing steps 352 and 356 are performed sequentially, the order in which the steps are processed is not important.

In processing step 352 an existing physical block address linked list entry for the previously stored block of data with the matching hash value is updated. If there are multiple previously stored blocks of data having a hash value that matches the generated hash value the physical block address linked list entry associated with the previously stored block of data having a matching hash value and a next physical block address value set to null is the existing physical block address linked list entry that will be updated. This entry will the last entry in the linked list also referred to as the tail of the linked list. During processing step 352, processing sub-step 354 is performed. In processing sub-step 354 the next physical block address value in the existing linked list entry being updated is changed from null to a new physical block address value indicating a physical memory location, e.g., in storage 122, to be used for storing the generated compressed block of data that had been received with the write request or command. Processing proceeds from step 352 to processing step 364.

In processing step 356, a new physical block address linked list entry corresponding to the generated compressed data block is created. Step 356 may, and in some embodiments does include, processing sub-steps 358, 360, and 362. In processing sub-step 358 a next physical block address set to null and size information indicating the size of the compressed data block, i.e., the first size, is included in the new physical block address linked list entry. Processing then proceeds to step 360. In step 360 a tag indicating the position of this entry in the physical block address linked list that includes the existing physical block address linked list entry and the new physical block address linked list entry is included in the new physical block address linked list entry. Processing then proceeds to step 362. In step 362, a reference value indicating the number of different logical block addresses corresponding to the block of data to be stored from which the compressed block of data was generated is included in the new physical block address linked list entry.

Processing proceeds from step 356 to step 364. In processing step 364 a new entry in a logical block address to hash value table is generated. The new entry associating the logical block address received with the write request or command with the generated hash value and the tag value indicating the position of the new physical block address linked list entry corresponding to the generated compressed data block. Processing proceeds from step 364 to step 365 where the compressed block of data is stored in memory, e.g., in storage 122 of silicon storage 126, at a new physical block address corresponding to the new physical block address value previously discussed in step 354.

Processing proceeds from step 365 to stop step 366. In stop set 364 processing associated with the write request or command received in step 306 concludes. Additionally processing may occur for example in connection with additional write or read requests or commands sent to the data processing system.

Tables and/or linked lists that were updated during the processing in response to the received request may be, and in some embodiments, are stored in data/information 120 section of memory 108 as well as in storage 122 of memory 108 for later use. By storing the updated tables and/or linked lists in RAM and Silicon Storage memory the information is both accessible to the processor in RAM memory while also stored in silicon storage memory where it can serve as a backup to the version of the tables and linked lists stored in RAM should they be lost or corrupted, such as during a power failure.

Returning to decision sub-step 328 of determination sub-step 324. As previously discussed, when the first size which is the size of the compressed data block to be stored matches the size of the previously stored block of data with the matching hash value under evaluation processing proceeds to bit by bit comparison sub-step 342.

In sub-step 342, a bit by bit comparison of the block of data to be stored to an uncompressed version of the previously stored block of data with the matching hash being evaluated is performed or a bit by bit comparison of the compressed block of data to be stored to the previously stored block of data with the matching hash value being evaluated. From processing sub-step 342 processing proceeds to decision sub-step 344.

In decision sub-step 344, when the result of the bit by bit comparison performed in sub-step 342 shows the compared bits match processing proceeds to determination sub-step 346. In step 346, it is determined that said block of data to be stored matches a previously stored block of data, i.e., the previously stored block of data currently being evaluated. Processing then proceeds from step 346 to step 348.

In sub-step 348, the do for each previously stored block of data with a matching hash value loop is ended as a previously stored block has been determined to match the block of data to be stored and no further evaluations of any additional previously stored blocks of data with a matching hash value need to be evaluated. Processing for step 324 is then concluded in connection with the received write request or command and processing proceeds from sub-step 348 of step 324 to step 372 shown on FIG. 3E via connection node D 370.

In step 372, the existing physical block address linked list entry corresponding to the previously stored block of data that matches the block of data to be stored is updated, e.g., in some embodiments of the present invention this is accomplished by incrementing the reference value of the entry by 1. Processing proceeds from step 372 to step 374.

In step 374, the tag value associated with the existing physical block address linked list entry corresponding to the previously stored block of data that matches the block of data to be stored is determined. Processing then proceeds to step 376.

In step 376, a new entry in a logical block address to hash table at the logical block address received with the write request or command is created with the new entry including the generated hash value and the tag value determined in step 374.

Processing then proceeds from step 376 to stop step 378.

In stop set 378 processing associated with the write request or command received in step 306 concludes. Additionally processing may occur for example in connection with additional write or read requests or commands sent to the data processing system.

Tables and/or linked lists that were updated during the processing in response to the received request may be, and in some embodiments, are stored in data/information 120 section of memory 108 as well as in storage 122 of memory 108 for later use. As previously discussed, by storing the updated tables and/or linked lists in RAM and Silicon Storage memory the information is both accessible to the processor in RAM memory while also stored in silicon storage memory where it can serve as a backup to the version of the tables and linked lists stored in RAM should they be lost or corrupted, such as during a power failure.

Figure 4:
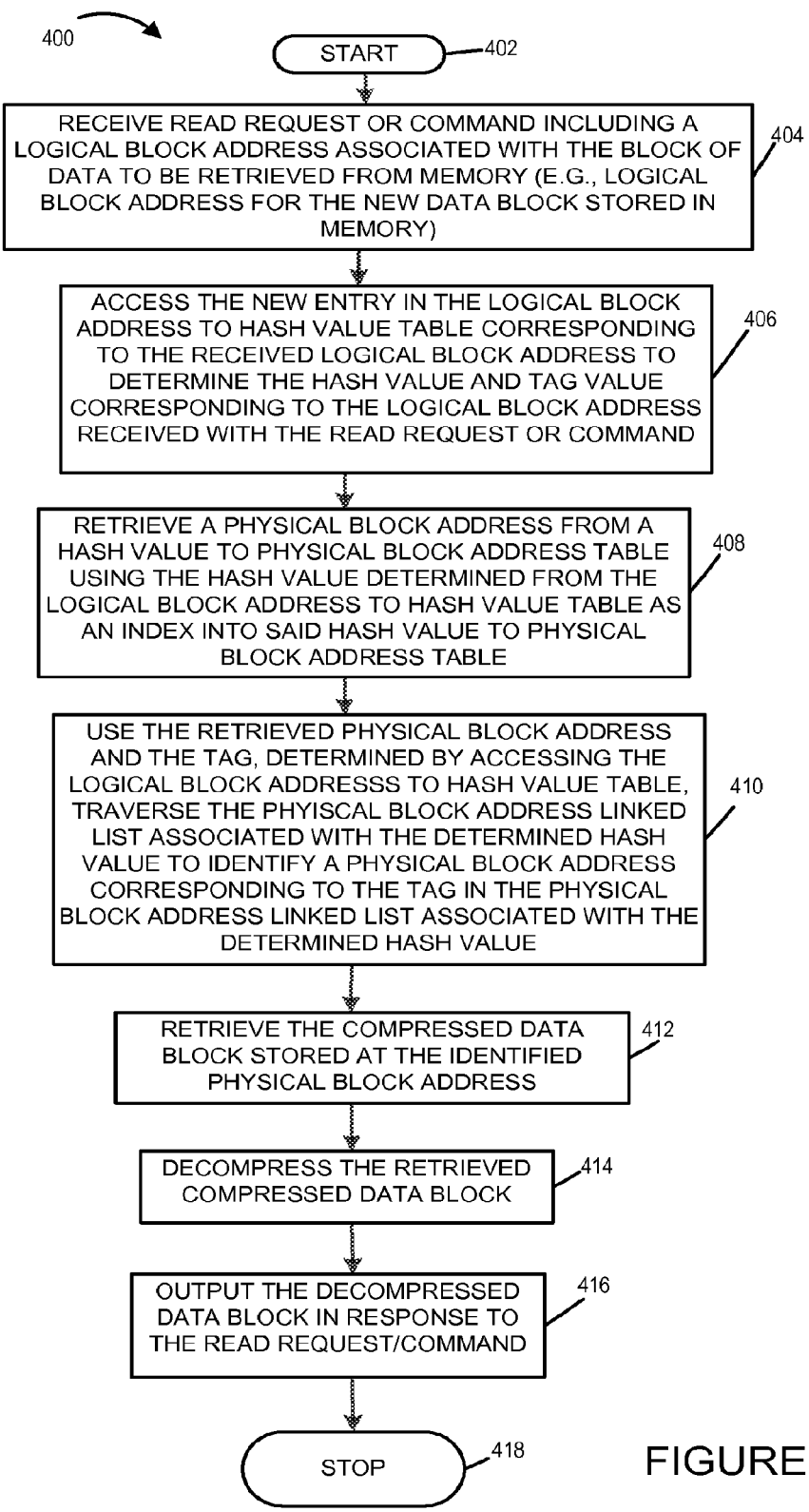
FIG. 4 illustrates an exemplary method for processing read requests and/or commands in accordance with one embodiment of the present invention.

The method 400 illustrated in FIG. 4 is an example used to explain various features of the invention. FIG. 4 illustrates a read request or command in accordance with an embodiment of the present invention. FIG. 4 assumes that the processing of the method of FIG. 3 has been completed wherein the hash value generated for the block of data to be stored matched a previously stored block of data but the size of the block of data to be stored did not match a previously stored block of data. The other possible outcomes of the method illustrated in FIG. 3 will not be discussed with regard to the FIG. 4 example to avoid complicating the description.

For illustrative purposes the method 400 of FIG. 4 will be explained in connection with exemplary system 100 of FIG. 1. Method 400 begins at start step 402 with processor 110 executing the steps of the process unless otherwise specified. Processing proceeds from start step 402 to receive step 404. In receive step 404, a read request or command is received by transceiver 104 for example via network interface 114 and I/O interface 112. The receive read request or command includes a logical block address associated with the block of data to be retrieved from memory (e.g., the logical block address for the new data block stored in memory in connection with the processing described in method 300 of FIG. 3). The receive request including the logical block address may be, and in some embodiments, is stored in the data/information section of RAM memory for later use for example in additional processing steps to be performed in connection with method 400. Processing proceeds from step 404 to step 406.

In step 406, the new entry in the logical block address to hash value table corresponding to the received logical block address is accessed to determine the hash value and tag value corresponding to the logical block address received with the read request or command. Processing proceeds from step 406 to step 408 where a physical block address from a hash value to physical block address table is retrieved using the hash value determined from the logical block address to hash value table as an index into said hash value to physical block address table. Processing proceeds to step 410.

In step 410 the retrieved physical block address and tag value, which was determined by accessing the logical block address to hash value table in step 406, are used to traverse the physical block address linked list associated with the determined hash value to identify a physical block address corresponding to the tag in the physical block address linked list associated with the determined hash value. Processing proceeds from step 410 to step 412.

In step 412, the compressed data block stored at the identified physical block address is retrieved from memory, e.g., storage 122 of memory 108. Processing proceeds to step 414.

In step 414, the retrieved compressed data block is decompressed and processing proceeds to step 416.

In step 416, the decompressed data block is output in response to the read request or command.

For example, in some embodiments the compressed data block is retrieved by processor 110 from storage 122 of memory 108 via I/O interface 112 and outputted to the source of the read request or command via network interface 114.

Processing proceeds from step 416 to stop step 418 were processing relating to method 400 and the read request or command received at step 404 concludes. Additional processing related to the retrieved data block may still continue and/or processing relating to different requests received by the system may also continue such as write requests or additional read requests.

Figure 5B:
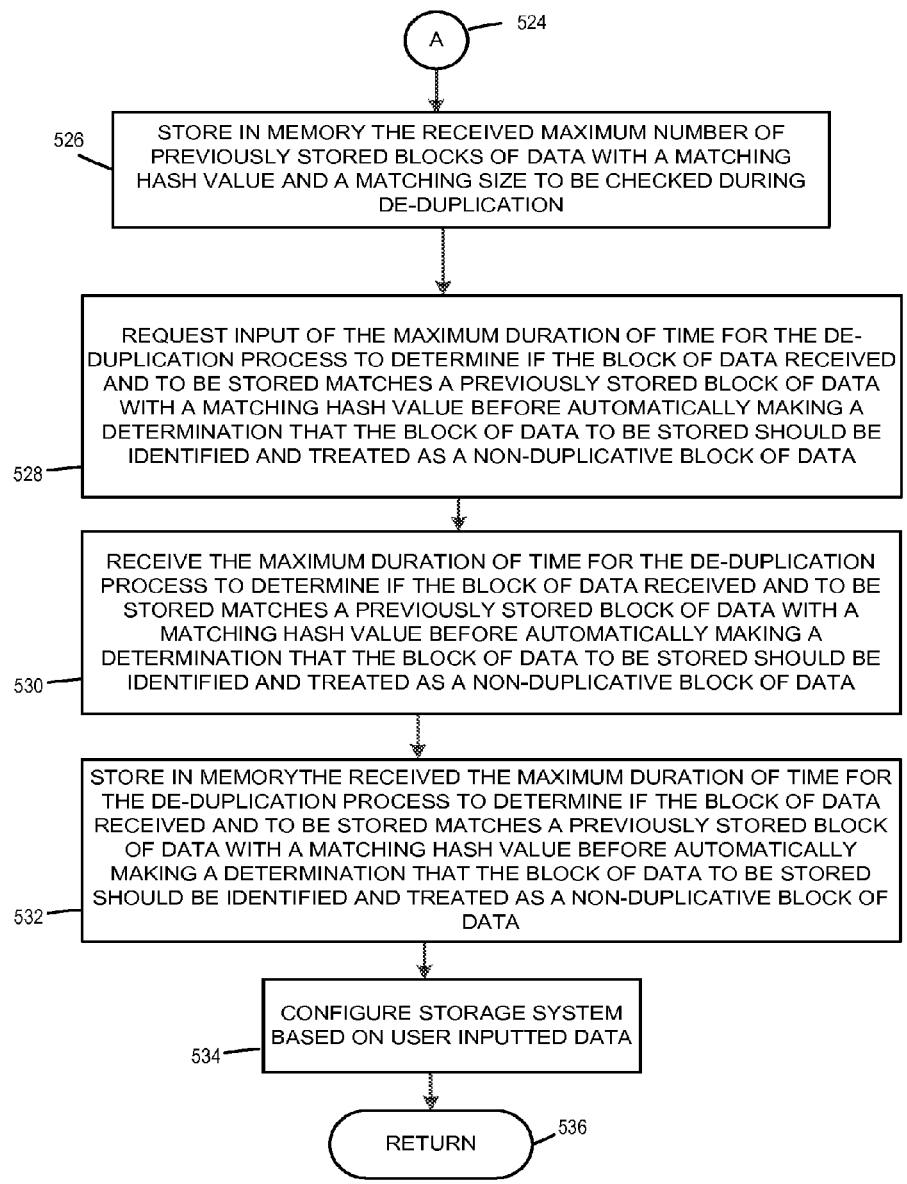
FIG. 5B which is a second part of FIG. 5 illustrates a second portion of an exemplary routine that may be, and in some embodiments of the present invention is, used to obtain information regarding the configuration of a system or apparatus implemented in accordance with one embodiment of the present invention.

FIG. 5 includes FIGS. 5A and 5B. Routine 500 of FIG. 5 illustrates an exemplary method of inputting various parameters and functions that may be, and in some embodiments of the present invention, are used to configure a storage apparatus or system that implements a method of data processing in accordance with an embodiment of the present invention. For illustrative purposes the steps of routine 500 of FIG. 5 will now be explained in view of exemplary system 100 of FIG. 1.

The routine 500 of FIG. 5 starts at start step 502 illustrated on FIG. 5A with the steps of the routine being executed on processor 110 from which processing proceeds to step 504. In step 504, the processor 110 requests the hash value function to be utilized in the data processing method of the present invention be inputted. For example, a user, e.g., system administration may be prompted to input the hash function to be utilized through a message outputted to display 102. Processing proceeds to step 506 wherein transceiver 104 receives the requested hash function e.g., from the user via input device 106 which may be, and often is a keyboard. Processing proceeds to step 508. In step 508 the received hash function is stored in memory 108, e.g., in data/information 120, assembly of modules 118, and/or storage 122. As the hash function is to be used during data processing procedures it may be stored in the assembly of modules as well as in the storage 122 for redundancy purposes. Processing proceeds to step 510.

In step 510 similar to step 504, the processor 110 requests the number of bits of the hash value, e.g., 24 bits, to be utilized in the data processing method be inputted. For example, a user, e.g., system administration may be prompted to input the number of bits to be utilized through a message outputted to display 102. Processing proceeds to step 512.

In step 512 transceiver 104 receives the requested number of bits of the hash function to be utilized from the user via input device 106 which may be, and often is a keyboard. Processing proceeds to step 514. In step 514 the received number of bits of the hash function to be utilized is stored in memory 108, e.g., in data/information 120, assembly of modules 118, and/or storage 122. As the number of bits of the hash function is to be used during data processing procedures it may be stored in the assembly of modules as well as in the storage 122 for redundancy purposes. Processing proceeds to step 515.

In step 515 which is similar to step 504, the processor 110 requests the maximum number of previously stored blocks of data with a matching hash value (that is a hash value that matches the hash value computed for a block of data received for storage) are to be checked during the de-duplication process of the data processing storage method be inputted. For example, a user, e.g., system administration may be prompted to input the maximum number of previously stored blocks of data with a matching hash value which are to be checked during the de-duplication process through a message outputted to display 102. Processing proceeds to step 516.

In step 516 transceiver 104 receives the requested maximum number of previously stored blocks of data with a matching hash value which are to be checked during the de-duplication process from the user via input device 106 which may be, and often is a keyboard. Processing proceeds to step 518. In step 518 the received maximum number of previously stored blocks of data with a matching hash value which are to be checked during the de-duplication process is stored in memory 108, e.g., in data/information 120, assembly of modules 118, and/or storage 122. For similar reasons as those discussed in connection with the storage of the number of hash bits to be utilized the information received in step 516 may be stored in the assembly of modules as well as in the storage 122 for redundancy purposes. Processing proceeds to step 520.

In step 520 which is similar to step 504, the processor 110 requests the maximum number of previously stored blocks of data with a matching hash value and a matching size (that is a hash value that matches the hash value computed for a block of data received for storage and a size that matches the size of the compressed block of data received for storage) are to be checked during the de-duplication process of the data processing storage method be inputted. For example, a user, e.g., system administration may be prompted to input the maximum number of previously stored blocks of data with a matching hash value and a matching size which are to be checked during the de-duplication process through a message outputted to display 102. Processing proceeds to step 522.

In step 522 transceiver 104 receives the requested maximum number of previously stored blocks of data with a matching hash value and a matching size which are to be checked during the de-duplication process from the user via input device 106. Processing proceeds to step 526 illustrated in FIG. 5B via connection node A 524. In step 526 the received maximum number of previously stored blocks of data with a matching hash value and a matching size which are to be checked during the de-duplication process is stored in memory 108, e.g., in data/information 120, assembly of modules 118, and/or storage 122. For similar reasons as those discussed in connection with the storage of the number of hash bits to be utilized the information received in step 522 may be stored in the assembly of modules as well as in the storage 122 for redundancy purposes. Processing proceeds to step 528.

In step 528 which is similar to step 504, the processor 110 requests the maximum duration of time for the de-duplication process to determine if the block of data received for storage matches a previously stored block of data with a matching hash value before automatically making a determination that the block of data to be stored should be identified and treated as a non-duplicative block of data be inputted. For example, a user, e.g., system administration may be prompted to input maximum duration of time for the de-duplication process to determine if the block of data received for storage matches a previously stored block of data with a matching hash value before automatically making a determination that the block of data to be stored should be identified and treated as a non-duplicative block of data through a message outputted to display 102. Processing proceeds to step 530.

In step 530 transceiver 104 receives the requested maximum duration of time for the de-duplication process from the user via input device 106. Processing proceeds to step 532. In step 532 the received maximum duration of time for the de-duplication process is stored in memory 108, e.g., in data/information 120, assembly of modules 118, and/or storage 122. For similar reasons as those discussed in connection with the storage of the number of hash bits to be utilized the information received in step 530 may be stored in the assembly of modules as well as in the storage 122 for redundancy purposes. Processing proceeds to step 534.

In step 534 the system 100 is configured using the various parameters inputted by the user. Processing proceeds to return step 536.

In step 536, the processing in connection with routine 500 concludes and processing continues with the method that invoked routine 500.

In at least some embodiments of the present invention, the requests of routine 500 may be, and sometimes are, a message transmitted by the transceiver 104 via the network interface to an external system on a network responsible for configuring system 100. The information inputted in response to such requests may be, and in at least some embodiments are, messages sent from the external system over the network and received by the network interface 114, I/O interface 112, and transceiver 104.

In some embodiments, routine 500 may be, and is, a subroutine that is invoked when the storage system is being initialized. In some embodiments the routine 500 is part of a configuration routine that both initializes and configures the storage system implemented in accordance with an embodiment of the present invention. While routine 500 has been discussed in connection with the exemplary system of FIG. 1, it is also applicable to other embodiments of the present invention such as apparatus that implement the present invention.

FIG. 6 includes FIGS. 6A, 6B, 6C, 6D, 6E, and 6F. Method 6000 of FIG. 6 illustrates another example relating to a second exemplary embodiment of the present invention. For illustrative purposes the steps of method 6000 of FIG. 6 will now be explained in view of system 100 of FIG. 1. The method 6000 makes use of the PBA linked listed, a logical block address to hash value table, a hash value to physical block address table, and a physical block address table. FIG. 7 discussed above provides an example of the logical block address to hash value table, a hash value to physical block address table, and a physical block address table. It is assumed for purposes of this example that these tables have been previously set up in system 100.

The method 6000 of FIG. 6 starts at start step 6002 illustrated on FIG. 6A with the steps of the method being executed on processor 110 from which processing proceeds to step 6004. In step 6004, transceiver 104 receives a write data block input/output request from an upper layer including a block of data to be stored and a logical block address (LBA) to be associated with where the block of data is to be stored. From step 6004, processing proceeds to step 6006. In step 6006, the hash value for the received block of data is computed. In some embodiments a mumur hash function, e.g., mumurhash2, is used to generate a 24 bit hash value for the received block of data to be stored. The hash value outputted from the mumur hash function is truncated in some embodiments of the present invention. Processing proceeds to step 6008 where the received block of data is compressed using a loss-less compression function. The received logical block address, received block of data, computed hash value, and compressed block of data may be, and in some embodiments are, stored in the data/information 120 section of memory 108 for later use, e.g., in later processing steps of method 6000. From step 6008 processing proceeds to decision step 6012.

In decision step 6012, it is determined whether there is a hash value stored in the LBA to HASH value table at the LBA received in step 6004. This may be, and in some embodiments is, achieved by processor 6012 using the received LBA as an index to the LBA to Hash value table. If there is no hash value stored in the LBA to Hash value table at the received LBA then this is not a rewrite request and processing proceeds to step 6022. If there a hash value stored in the LBA to Hash value table at the received LBA address then this is a rewrite request and processing proceeds to step 6018.

In step 6018, the processor 110 retrieves the hash value associated with the received LBA from the LBA to Hash value table along with the associated tag value. In some embodiments, this is achieved by using the LBA as an index into the LBA to hash value table. In some embodiments, a search for the received LBA address is made of the LBA to Hash value table and the associated hash value is linked to the LBA table such that upon identification of the LBA entry the associated hash value is also identified. In some embodiments of the present invention, the hash value and associated tag retrieved from the LBA to hash value table are stored in temporary memory space in data/information 120 of memory 108. From step 6018 processing proceeds to decision step 6014.

In step 6014, the PBA address for the retrieved hash value is retrieved from the Hash to PBA table using the retrieved hash value as the index to the Hash to PBA table. Processing then proceeds to step 6016. In step 6016, the PBA linked link for matching hash values is then traversed using retrieved PBA address until the PBA entry that has an associated tag which matches the tag retrieved from the LBA table and stored in temporary memory is identified. The reference count associated with the PBA address entry identified as having the matching tag is then decremented by one in the PBA table. This decrementing is required as the received write request is actually a rewrite request and the block of data associated with the LBA address is being changed. Processing proceeds to step 6022. In some embodiments of the present invention, in addition to decrementing the associated reference count value additional updates may be made to the PBA table, Hash to PBA, and LBA to PBA table. For example, in some embodiments if the reference count value is decremented to become a value of zero the hash value to PBA table may be updated to remove this entry from the PBA linked list for the associated hash value and additional updates may be made to track the changes in the hash to PBA table.

In step 6022, processor 110 determines whether a PBA address entry exists in the Hash to PBA table using the computed hash value as an index. Processing proceeds to decision step 6024. If in decision step 6024, there is a PBA address stored in the Hash to PBA table at the computed hash value then processing proceeds to step 6026. Otherwise, if there is no PBA address stored in the Hash to PBA table at the computed hash value then there is a new block of data to be stored as there are no previously stored blocks of data with a matching hash value. In this case, processing proceeds via connection node NEW BLOCK 6030 to step 6058 illustrated on FIG. 6C.

In step 6058, the LBA to Hash table is updated for example by creating a new entry in the table using the logical byte address as an index and associating the address with the computed hash value for the block of data received with the write request. In some embodiments, the LBA table index may be determined during system initialization and updating the LBA to Hash table in such cases is achieved by populating the hash value entry associated with the LBA address in the LBA to Hash table. Processing then proceeds to decision step 6060 where a decision is made based upon whether there is space available in the current write block for the compressed block of data and associated metadata to be stored. If there is space available in the current write block then processing proceeds to step 6062. If there is not space available in the current write block then processing proceeds to step 6076.

In step 6076, processing commences to get a free write block processing then proceeds to decision step 6078 where a decision is made based on whether a free write block is available. If a free write block is available processing proceeds to step 6062. Otherwise, if a free write block is not available processing proceeds from decision step 6078 to step 6080. In step 6080, processor 110 of system 100 initiates performing a garbage collection routine in an attempt to free up sufficient space on the storage media, e.g., storage media 126, so that sufficient memory space is available in a write block to which the compressed block of data and associated metadata can be stored. Processing then proceeds to step 6082 wherein the system waits for the garbage collection routine initiated in step 6080 to provide a status indication regarding its completion. In some embodiments, the status indication may include the status of the available free write blocks. Upon receipt of the garbage collection status in step 6082, processing proceeds from step 6082 to decision step 6084. In decision step 6084, a determination is made as to whether there is a free write block available in which the compressed block of data and associated metadata can be stored. If there is not a free write block available then processing proceeds to step 6086 where processor 110 initiates an error handling routine, e.g., by sending and error input output message to the upper layer that invoked method 6000. Processing then proceeds to stop step 6088 where processing associated with this write request ends; however, processing in the system continues for example, processing in system 100 may, and in some embodiments does, proceed to address the error of not having sufficient physical memory space available to store the block of data received with the write request.

When a determination is made that there is sufficient space available in the current write block (decision step 6060) or there is a free write block available (decision steps 6078 or 6086) processing proceeds to step 6062.

In step 6062, the system determines the PBA address of the write block to which the compressed data block and metadata will be written. Processing then proceeds to step 6064 in which the processor 110 writes the block of data that was received and compressed to storage, e.g., storage 122 of memory 108, at the PBA address determined in step 6062, e.g., either a PBA address in the current write block if space was available or a PBA address in a free write block. Processing then proceeds to step 6066 where the metadata in the write block is updated to reflect the changes to the write block. Processing then proceeds to step 6068.

In step 6068, the Hash to PBA table is updated. For example, the table is updated to include a new PBA entry associated with the computed hash value. The new PBA entry is populated with the PBA address determined in step 6062 and to which the compressed block of data was written in storage. In some embodiments, the computed hash value is an index to the Hash to PBA table which allows for a fast identification of the associated PBA address. Processing proceeds to step 6070 where the PBA table is updated.

In step 6070, the PBA table is updated. For example, using the PBA address determined in step 6062 and which was added to the Hash to PBA table in step 6068 as an index to the PBA table set the associated entries as follows: set tag entry to 1, set the reference count entry to 1 (as this is a new block without de-duplication), set size entry to the size of the compressed block of data that was generated in step 6008 and stored in storage in step 6064, and set Next PBA Entry as NULL as this is the head of the linked list of PBA entries having a hash value equal to the computed hash value. In some embodiments, the PBA table entry may need to be created before being populated. Processing then proceeds to step 6072.

In step 6072, the LBA to Hash value table is updated. For example, using the LBA received in step 6004 as an index to the LBA to Hash value table, the associated entries are set as follows: tag entry is set to 1. In some embodiments step 6058 update LBA to Hash value table) is skipped with the associated processing instead being performed in connection with step 6072. Upon the completion of the update to the LBA to Hash value table, the table includes the LBA received in step 6004 associated with the computed hash value for the block of data received in step 6004 and also associated with the tag value of 1. The association may be, and in some embodiments is, achieved through the use of the LBA as an index to the LBA to Hash value table. Processing then proceeds to step 6074.

In step 6074, processor 110 sends an acknowledgement to the upper layer routine from which the write data block I/O request was received in step 6004. Processing then concludes with respect to the received write request but processing continues in the system.

In some embodiments, after step 6070 the metadata is again updated before proceeding to step 6074. In some embodiments, the LBA to Hash value table, the Hash to PBA table and the PBA table are stored in both RAM memory and non-volatile storage for back up purposes and/or for maintaining the information when the system is powered down.

Returning now to decision step 6024 shown in FIG. 6A, when there is a PBA address stored in the Hash to PBA table at the computed hash value processing proceeds from step 6024 to step 6026.

In step 6026, the PBA value associated with the computed hash value is retrieved from the Hash to PBA table using the computed hash value as index. Processing then proceeds to step 6028 where variable "PBA value" is set equal to the retrieved PBA value associated with the computed hash value. In some embodiments, the PBA value is stored in data/information 120 of memory 108. From step 6028 processing proceeds via connection node A 6032 to decision step 6034 shown in FIG. 6B.

In decision step 6034, a determination is made as to whether the de-duplication feature is turned on, e.g., activated. In this exemplary embodiment, the de-duplication feature is a system configurable option that determines whether or not the system is to perform de-duplication of the blocks of data to be written to storage. If the de-duplication feature is not turned on then processing proceeds to step 6050 while if the de-duplication feature is turned on processing proceeds to step 6036.

In step 6050, the processor 110 retrieves the Next PBA value from the PBA table using the PBA value as an index. Processing then proceeds to decision step 6052. In decision step 6052, the retrieved Next PBA value is compared to NULL and if it is equal then processing proceeds to step 6090 illustrated on FIG. 6D via COLLISION connection node 6056. Otherwise processing proceeds to step 6054. When the NEXT PBA value=NULL this indicates that the current element is the last element in the linked list of PBA values associated with a hash value equal to the computed hash value, i.e., the current entry is the tail entry of the PBA linked list.

If the Next PBA entry is not equal to NULL then the linked list has not been fully traversed as there are additional PBA entries associated with the same hash value.

In step 6054, set "PBA value" equal to the retrieved Next PBA value and get the next element in the linked list in the PBA table using the "PBA value". From step 6054 processing proceeds back to decision step 6034 where processing continues as previously described.

In decision step 6034 as previously discussed when the de-duplication feature is turned on processing proceeds to step 6036.

In step 6036, using the PBA value set in step 6028 as an index to the PBA table the size entry associated with the PBA value is retrieved. This size value may be, and in some embodiments is stored in data/information 120 of memory 108 for later use. Processing proceeds to decision step 6038.

In step 6038, a determination is made as to whether the retrieved size value matches the size of said received and compressed block of data, i.e., the size of the compressed block of data generated in step 6008. If there is not a match then it has been determined that there has been a collision that is that there are at least two different blocks of data that do not contain the same data but which have the same hash value and processing proceeds to step 6050 where processing proceeds as previously described. In this way, the PBA linked list of entries with hash values matching the computed hash value is traversed and tested to determine if a previously stored block of data is a duplicate of the block of data received with the write request in step 6004.

When the retrieved size value matches the size of the compressed data block then processing proceeds to step 6040 from decision step 6038. Because the compressed block of data and the data block stored at the PBA address in storage at PBA value have the same hash and are the same size the block of data will need to be retrieved from storage and compared to compressed block of data to determine if they are duplicates. In step 6040, processor 110 reads from storage media 122 of memory 108 the data block 6042 which is stored at the physical block address equal to PBA value. In some embodiments, the data block 6042 read from storage media is stored in data/information 120 of memory 108 for later use. Processing then proceeds from read step 6040 to comparison step 6044.

In step 6044, the data block read from the storage media 6042 is compared to the received block of data. The comparison may be, and in some embodiments is, a bit by bit comparison of the compressed data block generated in step 6008 to the compressed block of data 6042 read from the storage media. In some embodiments, the data block read from storage is uncompressed and a bit by bit comparison is performed against the uncompressed block of data received in step 6004.

Once the comparison has been made, processing proceeds from comparison step 6044 to decision step 6046.

In decision step 6046, if it was determined in comparison step 6044 that the two compared blocks of data match then the blocks of data are duplicates and processing proceeds via ADD DEDUPLICATION connection node 6048 to decision step 6134 shown in FIG. 6F. If in comparison step 6044 it was determined that the two compared blocks of data do not match then the blocks are not duplicates and processing proceeds to step 6050 where processing continues as previously discussed. In this way if there are additional blocks of data stored with same hash value they will be also be evaluated to determine if they are a match to the block of data received for storage in step 6004.

In decision step 6134 shown in FIG. 6F, a determination is made as to whether there is sufficient space in the current write block to store the metadata associated with the received block of data to be written to storage. It should be appreciated that because this block of data has been determined to be a duplicate it does not need to be written to storage. The metadata may, and in some embodiments does, include some or all of the information contained in the LBA to Hash value table, the Hash to PBA table, and the PBA table. If there is space available in the current write block then processing proceeds to step 6150. If there is not space available in the current write block then processing proceeds to step 6136.

In step 6136, processing commences to get a free write block processing then proceeds to decision step 6138 where a decision is made based on whether a free write block is available. If a free write block is available processing proceeds to step 6150. Otherwise, if a free write block is not available processing proceeds from decision step 6138 to step 6140. In step 6140, processor 110 of system 100 initiates performing a garbage collection routine in an attempt to free up sufficient space on the storage media, e.g., storage media 126, so that sufficient memory space is available in a write block to which the metadata associated with the received block of data can be stored. Processing then proceeds to step 6142 wherein the system waits for the garbage collection routine initiated in step 6140 to provide a status indication regarding its completion. In some embodiments, the status indication may include the status of the available free write blocks. Upon receipt of the garbage collection status in step 6142, processing proceeds from step 6142 to decision step 6144. In decision step 6144, a determination is made as to whether there is a free write block available in which the metadata can be stored. If there is not a free write block available then processing proceeds to step 6146 where processor 110 initiates an error handling routine, e.g., by sending an error input output message to the upper layer that invoked method 6000. Processing then proceeds to stop step 6148 where processing associated with this write request ends; however, processing in the system continues for example, processing in system 100 may, and in some embodiments does, proceed to address the error of not having sufficient physical memory space available to store the metadata associated with block of data received for storage in step 6004.

When a determination is made that there is sufficient space available in the current write block (decision step 6134) or there is a free write block available (decision steps 6138 or 6144) processing proceeds to step 6150.

In step 6150, the system determines the PBA address of the write block to which the metadata will be written. Processing proceeds to step 6152. In step 6152, processor 110 changes the reference (REF) count in the PBA table to update it to reflect that there is an additional block of data referenced in the system that is duplicative of the block of data stored at the physical block address having PBA value. This may be, and in some embodiments is, done by using the PBA value as an index to the PBA table and updating the associated reference count by incrementing the reference (REF) count by 1. Processing proceeds to step 6154 wherein using the PBA value as an index to the PBA table the associated tag value associated with the PBA value is retrieved. In some embodiments, this tag value is stored in data/information 120 of memory 108 for later use. This is the tag that is used to identify the entry in the linked list of PBA entries with hash values matching the computed hash value which contains the PBA value associated with the received block of data. Processing proceeds from step 6154 to step 6156 where the tag in the LBA to Hash table is updated. In some embodiments, at this step a new entry is made in the LBA to Hash table using the LBA received in step 6004 as the index to the entry in the table. The hash value computed in step 6006 and the tag value retrieved in step 6154 are then entered into the LBA to Hash Table at the newly created entry at the received LBA index value so that the computed hash value and retrieved tag value are associated with the received LBA. Processing then proceeds to step 6158 where the metadata in the write block is updated. In some embodiments this includes writing updates to the LBA to Hash value table, PBA table, and/or the Hash to PBA table which may also be stored in media storage 122 so that is retained during power outages or for redundancy purposes. It will be appreciated that in this case of de-duplication no updates were made to the hash to PBA table unless they were made as part of obtaining a free write block during the garbage collection routine as such the Hash to PBA table may not require updating.

Processing then proceeds to step 6160. In step 6160, processor 110 sends an acknowledgement to the upper layer routine from which the write data block I/O request was received in step 6004. Processing then concludes with respect to the received write request but processing continues in the system.

In the cases where the de-duplication feature is turned off or where there is a collision, the compressed block of data will need to be stored in storage, e.g., storage 122, and the LBA to hash value table, Hash to PBA table, and PBA table along with the PBA linked list of hash values will need to be updated to reflect the storage of the compressed data block. The processing associated with such cases is now discussed.

Figure 6B:
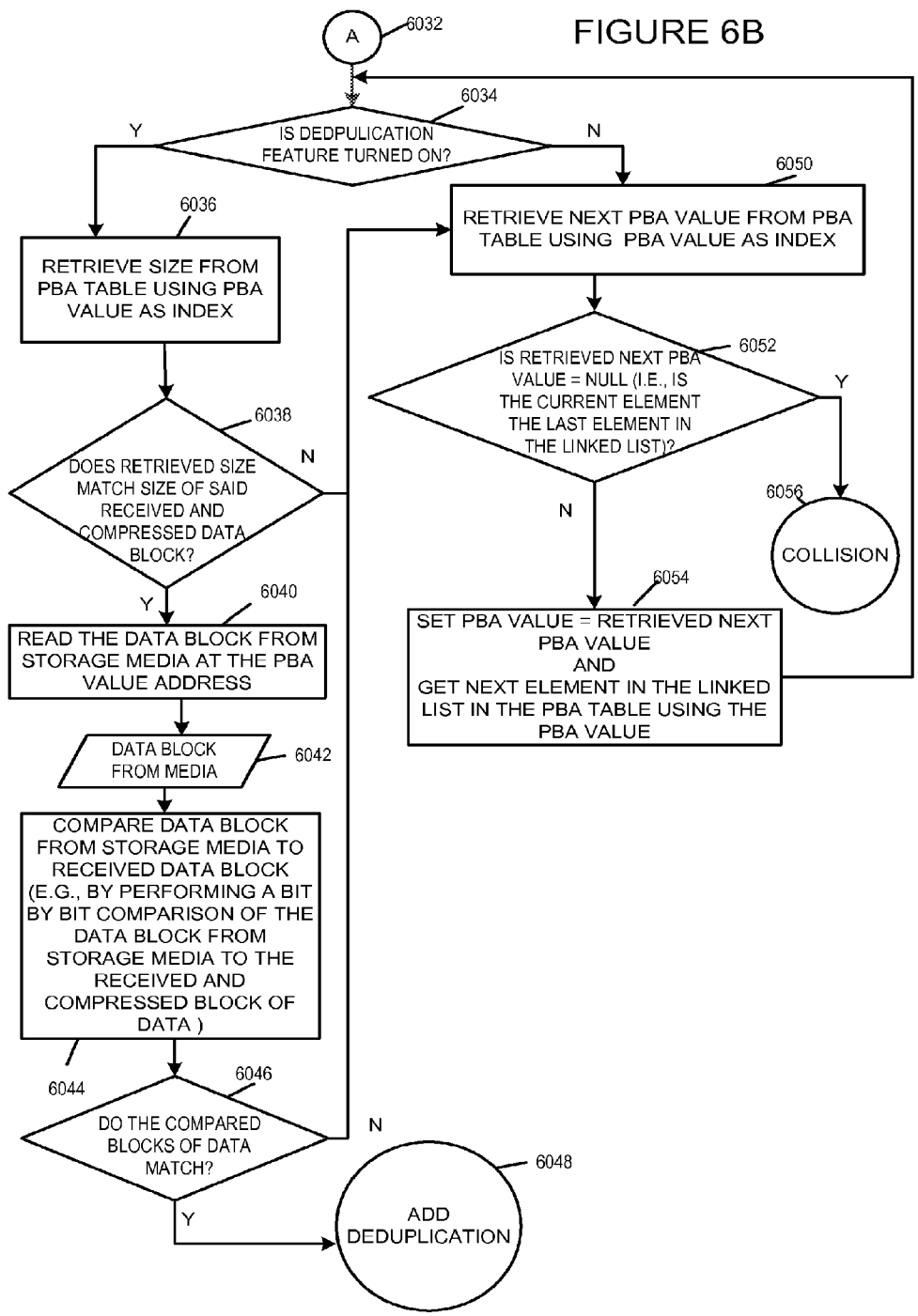
FIG. 6B which is a second part of FIG. 6 illustrates a second portion of an exemplary method for processing write requests in accordance with one embodiment of the present invention.
Figure 6C:
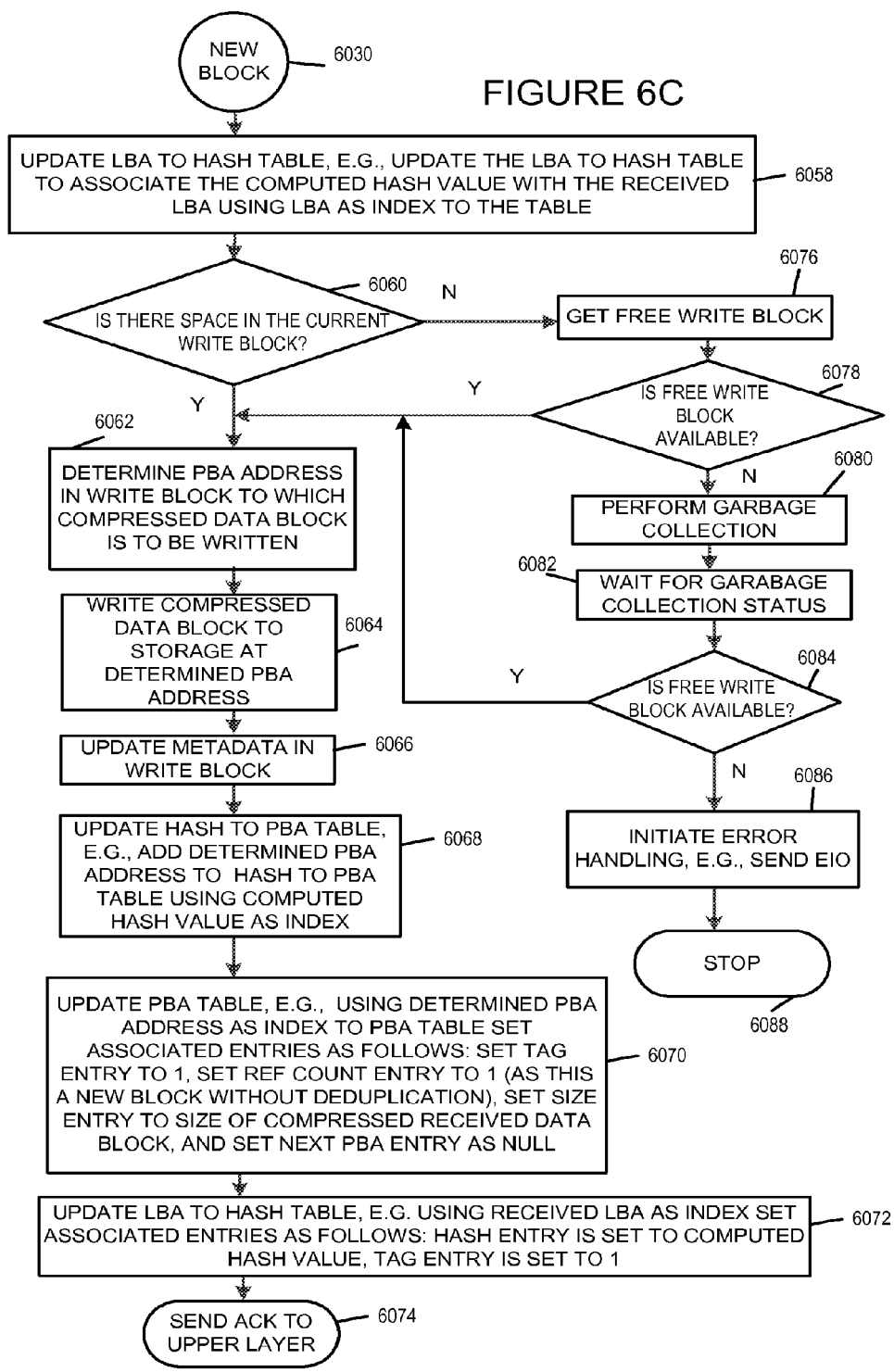
FIG. 6C which is a third part of FIG. 6 illustrates a third portion of an exemplary method for processing write requests in accordance with one embodiment of the present invention.
Figure 6D:
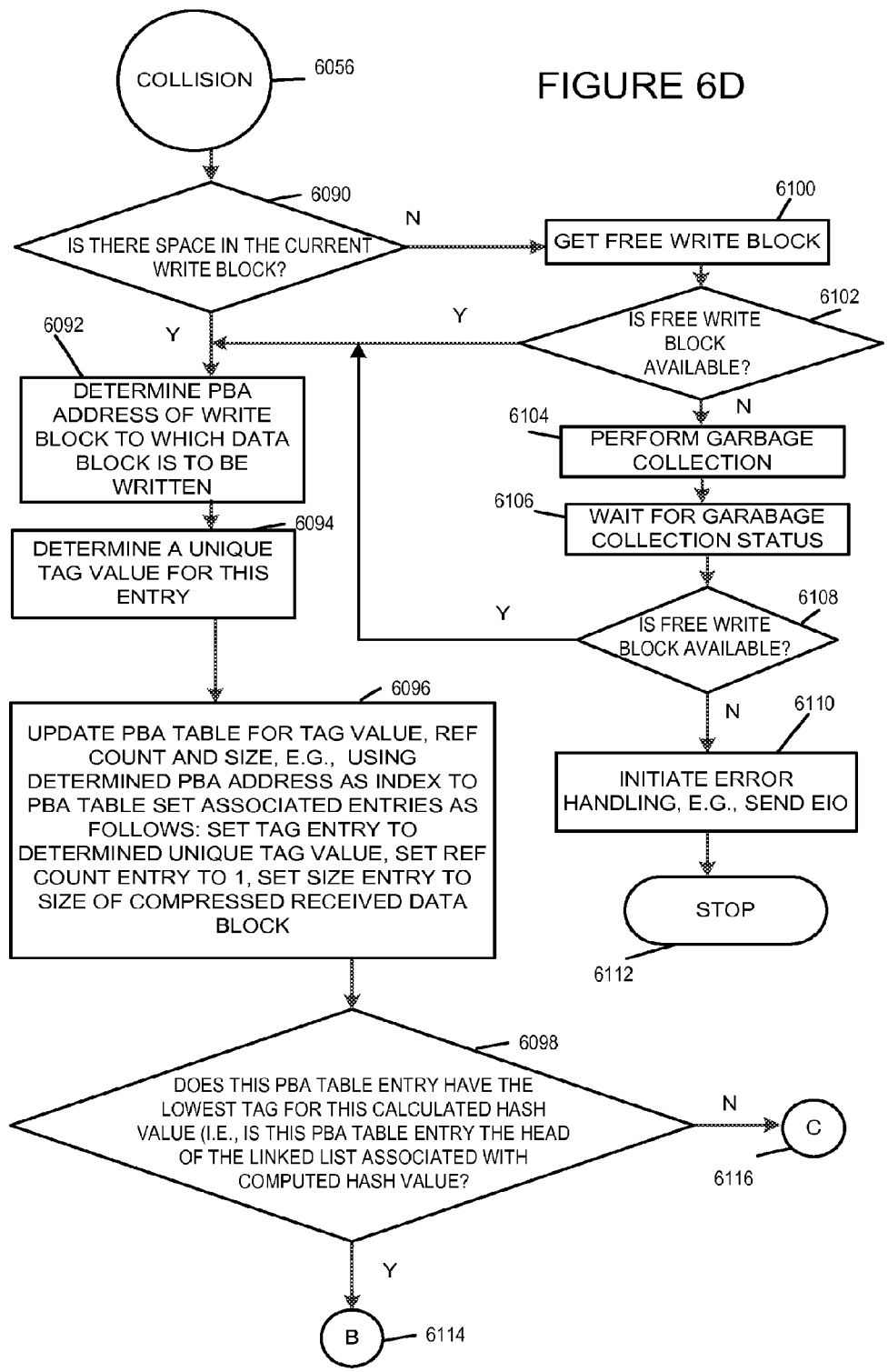
FIG. 6D which is a fourth part of FIG. 6 illustrates a fourth portion of an exemplary method for processing write requests in accordance with one embodiment of the present invention.
Figure 6E:
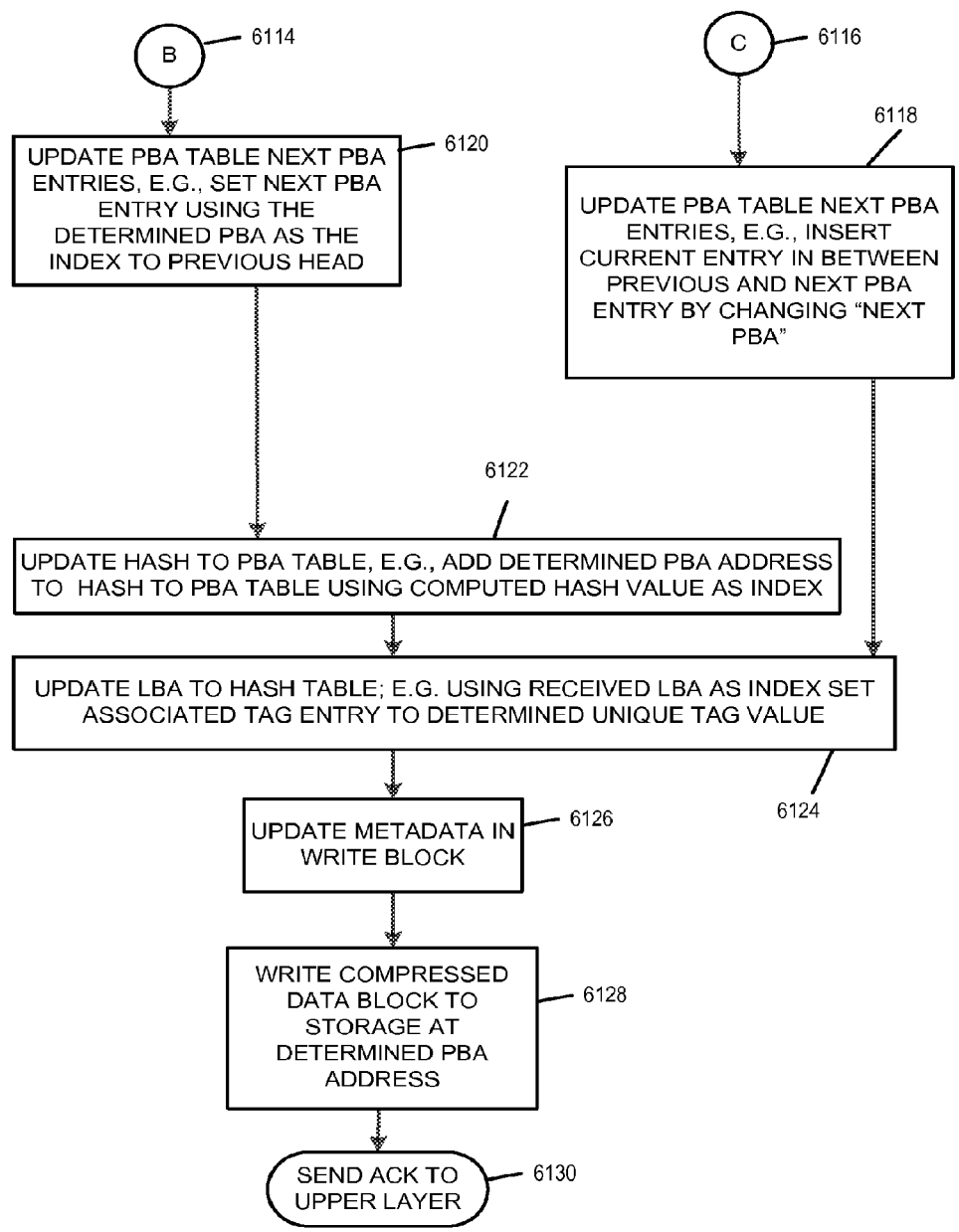
FIG. 6E which is a fifth part of FIG. 6 illustrates a fifth portion of an exemplary method for processing write requests in accordance with one embodiment of the present invention.

Returning to decision step 6090 illustrated on FIG. 6D, in decision step 6090, a decision is made based upon whether there is space available in the current write block for the compressed block of data and associated metadata to be stored. If there is space available in the current write block then processing proceeds to step 6092. If there is not space available in the current write block then processing proceeds to step 6100.

In step 6100, processing commences to get a free write block processing then proceeds to decision step 6102 where a decision is made based on whether a free write block is available. If a free write block is available processing proceeds to step 6092. Otherwise, if a free write block is not available processing proceeds from decision step 6102 to step 6104. In step 6104, processor 110 of system 100 initiates performing a garbage collection routine in an attempt to free up sufficient space on the storage media, e.g., storage media 126, so that sufficient memory space is available in a write block to which the compressed block of data and associated metadata can be stored. Processing then proceeds to step 6106 wherein the system waits for the garbage collection routine initiated in step 6104 to provide a status indication regarding its completion. In some embodiments, the status indication may include the status of the available free write blocks. Upon receipt of the garbage collection status in step 6106, processing proceeds from step 6106 to decision step 6108. In decision step 6108, a determination is made as to whether there is a free write block available in which the compressed block of data and associated metadata can be stored. If there is not a free write block available then processing proceeds to step 6110 where processor 110 initiates an error handling routine, e.g., by sending an error input output message to the upper layer that invoked method 6000. Processing then proceeds to stop step 6112 where processing associated with this write request concludes; however, processing in the system continues for example, processing in system 100 may, and in some embodiments does, proceed to address the error of not having sufficient physical memory space available to store the block of data received with the write request.

When a determination is made that there is sufficient space available in the current write block (decision step 6090) or there is a free write block available (decision steps 6102 or 6108) processing proceeds to step 6092.

In step 6092, the system determines the PBA address of the write block to which the compressed data block and metadata will be written. Processing then proceeds to step 6094. In step 6094 a unique tag value is determined for this entry. Processing then proceeds to step 6096. In step 6096, the PBA table is updated to include new data associated with the compressed block of data that is to be stored including physical block address at which the compressed block of data is to be stored and the associated tag value, reference count, and size. For example, using the determined PBA at which the compressed block of data is to be stored as an index to the PBA table set the associated entries as follows: set tag entry to the unique tag value determined in step 6094, set reference (REF) count entry to 1, set size entry to the size of the compressed block of data to be stored in storage at the PBA address. In some embodiments new entries for the above data needs to be created during this step, while in other embodiments the PBA table is fixed during configuration and the tag value, REF count and size fields or entries merely need to be populated at the determined PBA index. Processing proceeds from step 6096 to decision step 6098. In decision step 6098 a determination is made as to whether this PBA table entry that is the PBA table entry from step 6094 has the lowest value tag value for this computed hash value and if it does then processing proceeds to step 6120 shown on FIG. 6E via connection node B 6114. Decision step 6098 is determining whether or not the present PBA table entry is the head of the linked list associated with the computed hash value as the head of the linked list will have the lowest tag value. When the present tag value is not the lowest tag value that is the PBA entry is not the head of the linked list then processing proceeds to step 6118 illustrated on FIG. 6E via connection node C 6116.

In step 6118, the PBA Table NEXT PBA entries are updated. For example by inserting the current entry in between the previous and NEXT PBA entry by changing the "NEXT PBA" entries in the table. By way of further example, the PBA value of the entry before proceeding to step 6090 corresponds to the PBA for the last entry or tail in the linked list as determined in decision step 6052 wherein it was determined that the NEXT PBA entry associated with PBA value in the PBA table was equal to NULL. So the NEXT PBA value of the newly created entry which is at the PBA table index determined in step 6092 is set to NULL and the NEXT PBA associated with PBA value is changed from NULL to the PBA determined in step 6092 which is the physical block address at which the compressed block of data is to be stored. Processing then proceeds to step 6124.

Returning to step 6120, in step 6120, the PBA Table NEXT PBA entries are updated, e.g., by setting the NEXT PBA of this PBA entry that is the newly created PBA entry to the previous head therein making this entry the new head. Processing then proceeds to step 6122.

In step 6122, the Hash to PBA table is updated so that the physical block address associated with the computed hash value is the physical block address at which the compressed block of data is to be stored which is the PBA determined in step 6092. In some embodiments, the computed hash value is used as an index to the Hash to PBA table and the PBA entry associated with the computed hash value is changed to reflect the PBA to which the compressed block of data is to be stored. Processing then proceeds to step 6124.

In step 6124, the LBA to Hash table is updated. For example, by using the LBA received in step 6004 as an index to the LBA to Hash table set the associated tag entry to the unique tag value determined in step 6094. Processing then proceeds to step 6126.

In step 6126, the metadata in the write block, e.g., storage 122, is updated. For example, the metadata associated with the compressed block of data to be stored in the write block may be, and in some embodiments is, added to the write block. Additionally, the LBA to Hash value table, Hash to PBA table, and PBA tables may be, and as previously discussed are, updated and/or written to storage for maintaining the information after the system has been powered down or for redundancy purposes. Processing then proceeds to step 6128.

In step 6128, the compressed block of data generated in step 6008 is written to storage, e.g., storage 122, at the physical block address determined in step 6092. Processing then proceeds to step 6130. In step 6130, processor 110 sends an acknowledgement to the upper layer routine from which the write data block I/0 request was received in step 6004. Processing then concludes with respect to the received write request but processing continues in the system for example with respect to another I/O request.

Several examples are now provided showing one possible sequencing of how the LBA to hash value table 702, the hash to PBA table 704 and PBA table 706 may be, and in some embodiments are, updated in accordance with the present invention as write requests and commands are received. In some embodiments of the present invention the processor 110 of FIG. 1 performs the steps of updating the tables.

Figure 8:
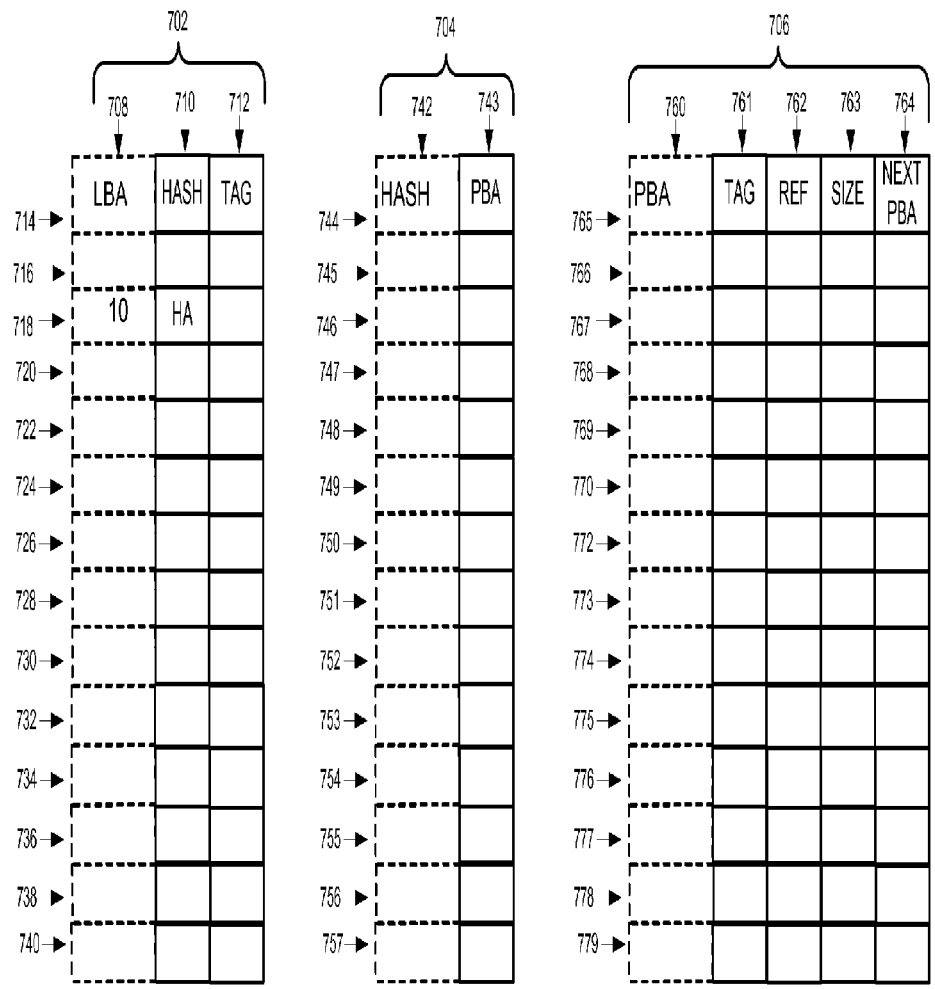
FIG. 8 illustrates how various exemplary tables may be, and in some embodiments are, used in implementing the present invention.
Figure 9:
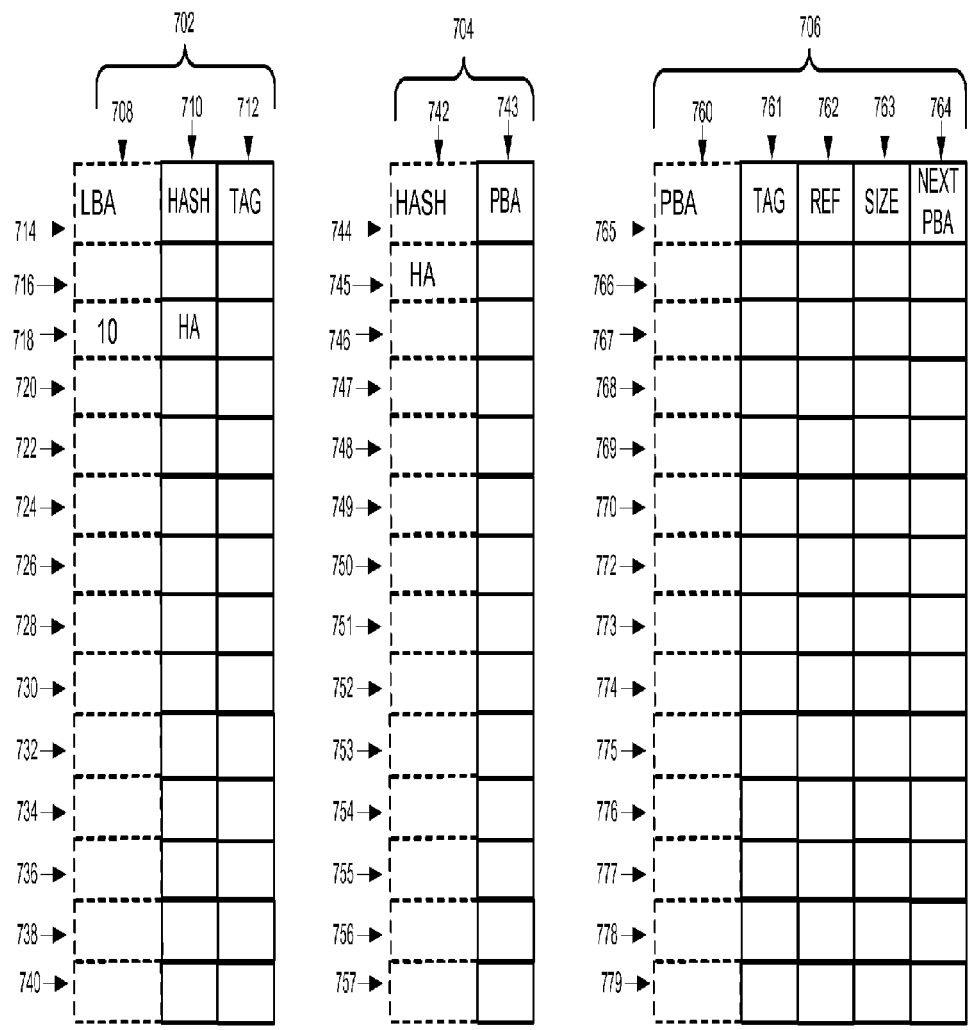
FIG. 9 illustrates how various exemplary tables may be, and in some embodiments are, used in implementing the present invention.
Figure 10:
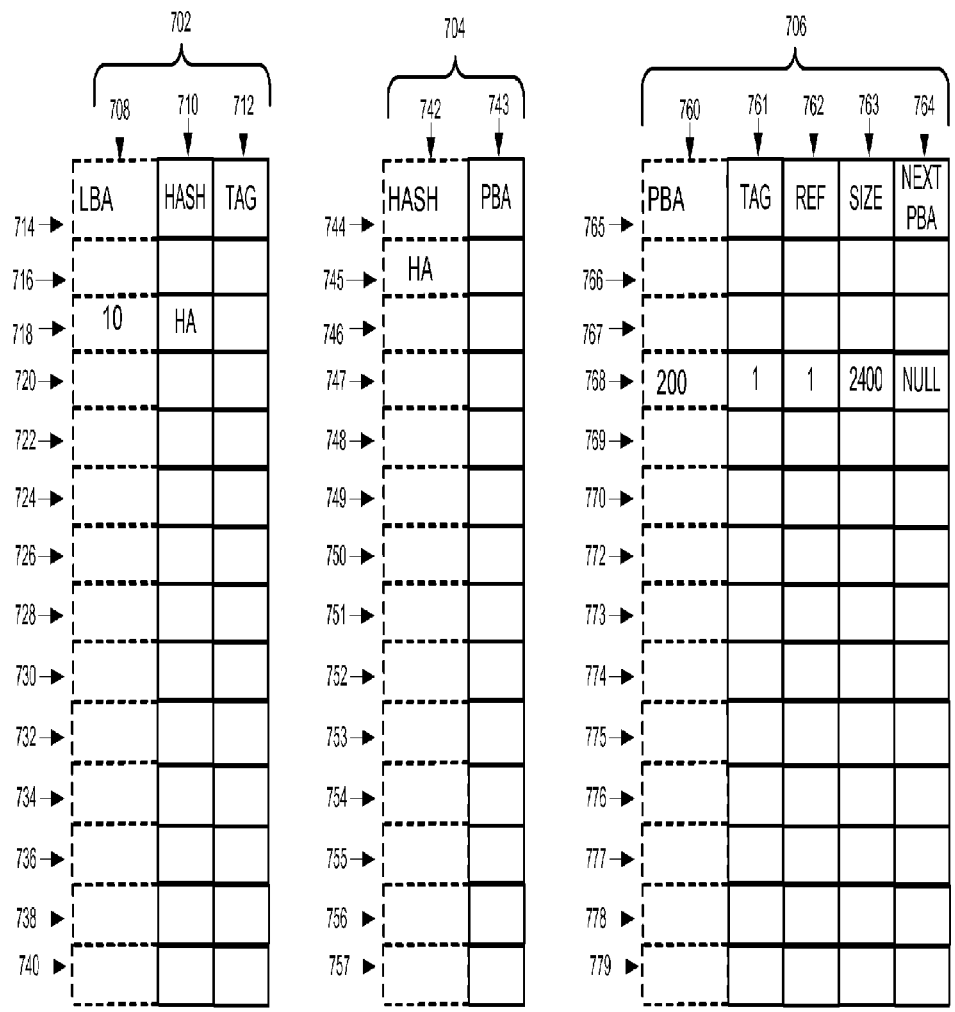
FIG. 10 illustrates how various exemplary tables may be, and in some embodiments are, used in implementing the present invention.
Figure 11:
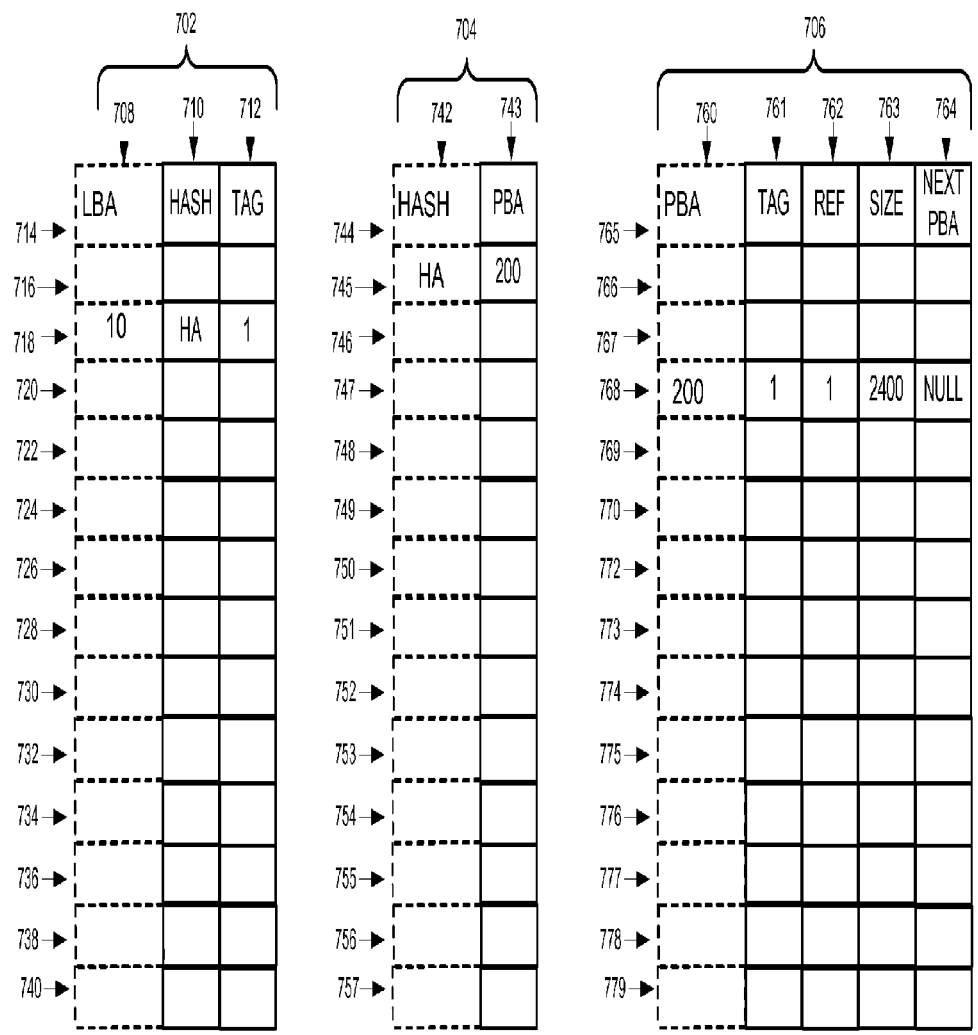
FIG. 11 illustrates how various exemplary tables may be, and in some embodiments are, used in implementing the present invention.

As shown in FIG. 7, the LBA to hash value table 702, the hash to PBA table 704 and PBA table 706 are all initially empty. Upon the receipt of a write block request including a logical block address of 10 and a block of data A. Processing commences and a hash value is computed for the received block of data A using a mumur hash function and truncating the calculated, i.e., computed, value to be only the first 31 bits. This generated hash value will be referred to as HA. Processing then proceeds and using loss-less compression, the block of data A is compressed to generate a compressed block of data A. Using the logical block address as an index go to LBA 10 in the LBA to hash table 702. The LBA 10 row is currently empty. As shown in FIG. 8, insert at LBA 10 row 718 insert in the hash column 710 the generated hash value HA. Next proceed to the hash to PBA table 704 of FIG. 8 and using the generated hash value HA as an index determine if there is an entry for HA already present in the hash to PBA table. In this case the answer is no as the table is empty as previously discussed. There are no previously stored blocks of data with a matching hash value as this is the first write request. As shown in FIG. 9 create a new entry in the hash to PBA table at index HA row 745. Determine a free physical block address to which the compressed block of data is to be written. In this example, the physical block address 200 is a free PBA in which the system stores the compressed block of data A. Next create a new entry in the PBA table 706 using the physical block address 200 as an index. FIG. 10 shows how the new entry is populated at PBA 200 row 768. The new entry will include a collision tag value set to 1 in the column 761 indicating that there are no collisions for this block of data, a reference value set to 1 in column 762, the size value is set to equal 2400, i.e., 2400 bytes, in column 763 which is the size of the compressed block of data A, and the next PBA is set to NULL as this is the first entry in the physical block address linked list for PBA entries associated with blocks of data have a hash value equal to HA. Now as shown in FIG. 11 update the entry for the hash value to PBA table 704 at hash value index HA row 745 PBA column 743 to contain the value 200 which is the physical block address value at which the block of data A is stored. As shown in FIG. 11, the tag value associated with LBA 10 in the LBA to hash value table is updated to the tag value of 1 by setting the tag value in column 712 at the LBA index of 10 row 718 to 1 so that it matches the unique tag value associated with the stored block of data as indicated in the PBA table at PBA index 200 row 768 column 761. At this point, the compressed block of data A and its associated meta data has been stored and the LBA to hash value table 702, hash value to PBA table 704 and PBA table 706 have been updated. In some embodiments the tables 702, 704, and 706 are also stored to the media in which the block of data A was stored.

Figure 12:
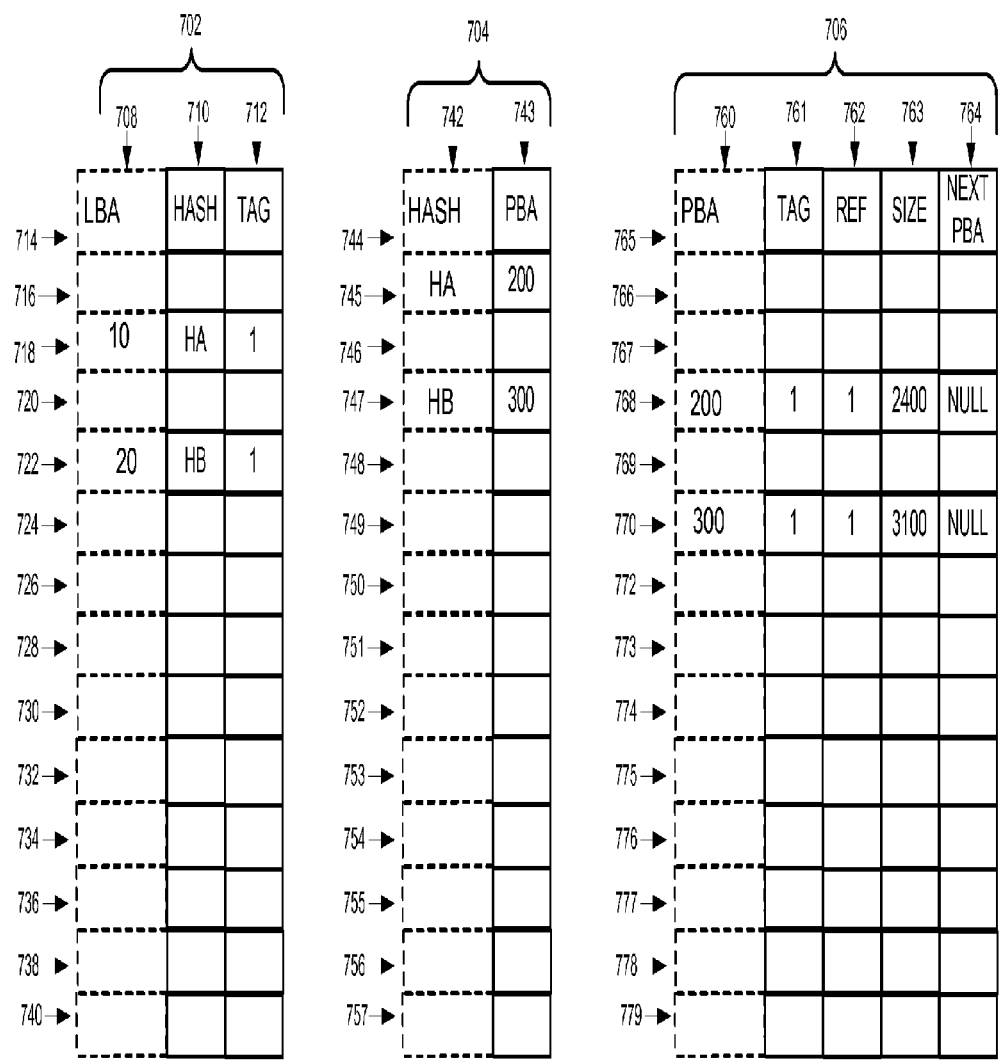
FIG. 12 illustrates how various exemplary tables may be, and in some embodiments are, used in implementing the present invention.

A write block of data B at LBA 20 request is now received by the system. And the process described in connection with the write block of data A at LBA 10 request is repeated for the write block of data B at LBA 20 request. The generated hash value is HB, the size of the compressed block of data B is 3100, the physical block address at which the compressed block of data B is stored is 300. The tag value is 1, the reference count will be 1 and the next PBA will be NULL for the same reasons discussed in connection with the processing of the write request for block A. FIG. 12 shows the updated LBA to hash value table 702, hash value to PBA table 704 and PBA table 706.

Figure 13:
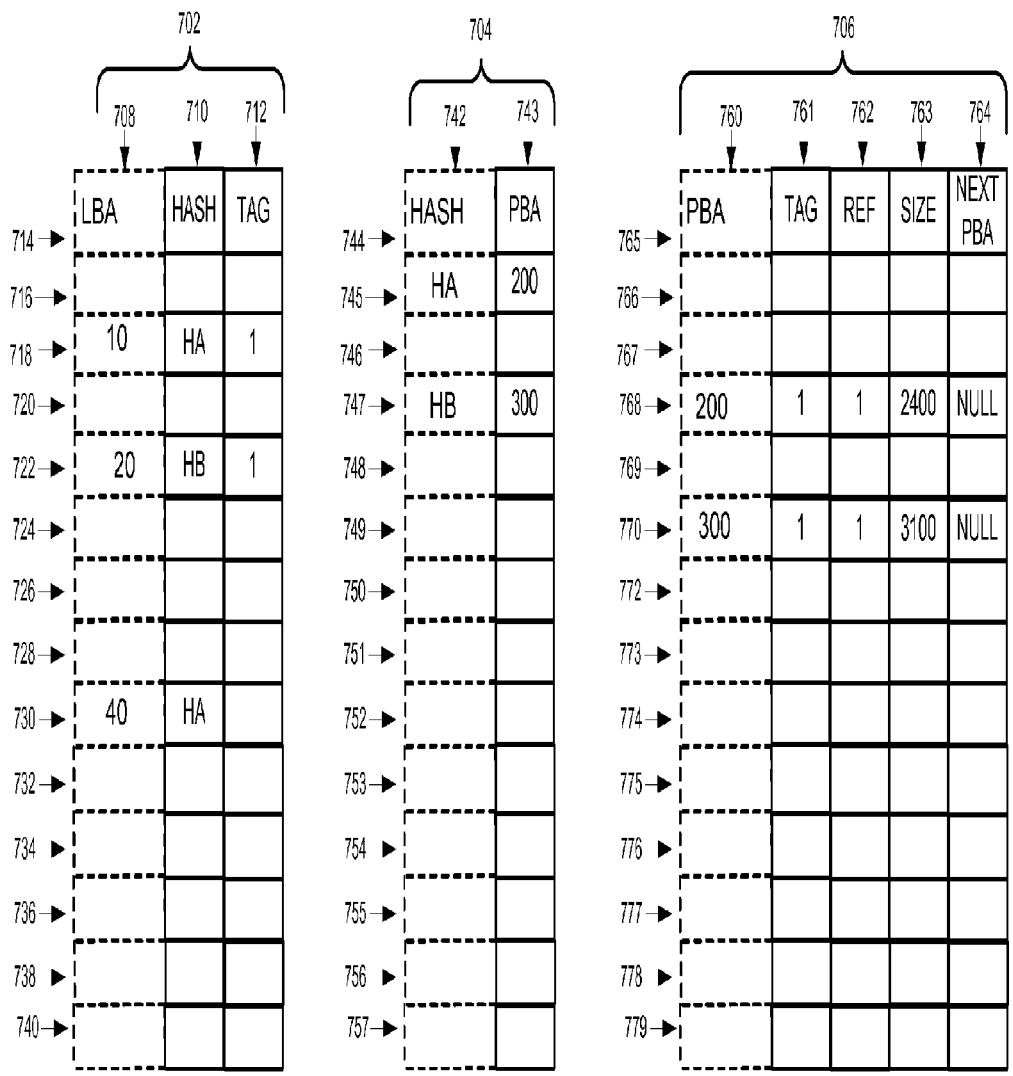
FIG. 13 illustrates how various exemplary tables may be, and in some embodiments are, used in implementing the present invention.
Figure 14:
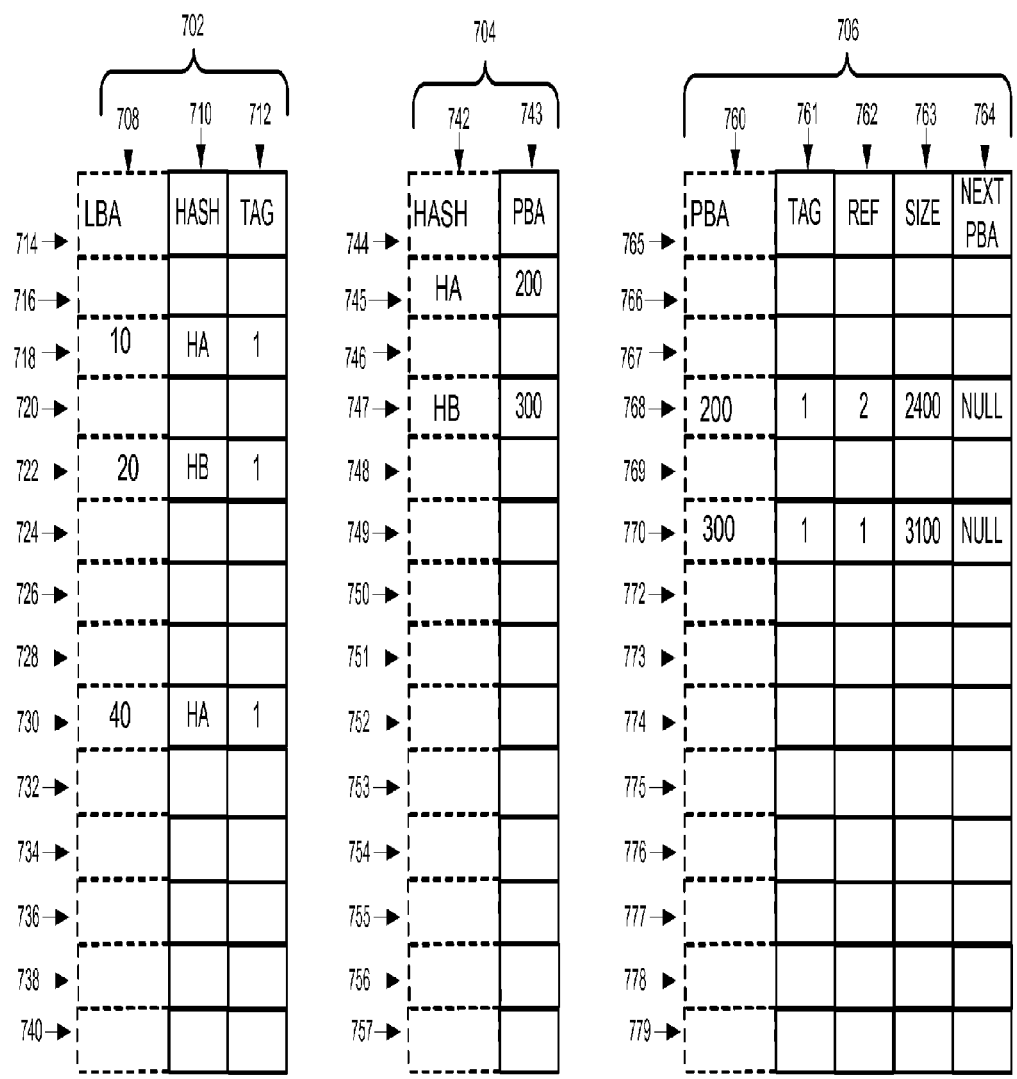
FIG. 14 illustrates how various exemplary tables may be, and in some embodiments are, used in implementing the present invention.

A write block of data A at LBA 40 is now received by the system. This is an example of a case of de-duplication. The generated hash value is HA for the received block of data A. The block of data A received is compressed and has a size equal to 2400 bytes. As shown in FIG. 13 in LBA to hash value table 702, the hash value HA is entered in column 710 at LBA address index equal to 40 shown in table 702 at row 730. In the hash value to PBA table 704 a search is made for an entry having hash value HA using HA as the index to the table and an entry is found at row 745 column 742. This indicates that there is a previously stored block of data having the same hash value HA as the block of data received for storage at LBA 40. From hash value to PBA table the physical block address associated with the hash value HA is now identified to be 200 from row 745 PBA column 743. PBA 200 is the index of the head or first entry of the PBA linked list contained in the PBA table 706 corresponding to the hash value HA. PBA 200 is used to index the PBA table 706 and locate the first the entry corresponding to a previously stored block of data having a hash value equal to HA. At PBA 200 row 768 of the PBA table information associated with the first previously stored block of data A is accessed. From row 768 column 763 the size of previously stored compressed block of data with a matching hash value HA is determined to be 2400. The size of the previously stored block of data with the matching hash value HA is compared to the size of the block of data A generated from the write LDA 40 request. In this case the data size matches. The physical block address 200 is now used to retrieve the previously stored compressed block of data from storage. Once the previously stored block of data is retrieved it is compared to the current block of data to be stored. The two blocks of data match meaning this is a duplicate block of data. As the two blocks of data match the reference value in the PBA table at ref column 762 row 768 is incremented from 1 to a value of 2. The LBA to hash value table is now updated at LBA 40 to include the tag value associated with PBA 200 in PBA table 706. In this case, the tag value associated with PBA 200 in PBA table 706 row 768 column 768 is determined to have a value of 1. So the tag value of 1 is inputted into the LBA to hash value table 704 at LBA 40 row 730 tag column 712. FIG. 14 shows the LBA to hash value table 702, hash value table to PBA table 704, PBA table 706 after the updates have been completed. The hash value table to PBA table 704 was not modified as PBA 200 is still the PBA address of the head of the PBA linked list for previously stored blocks of data with a hash value equal to HA.

Figure 15:
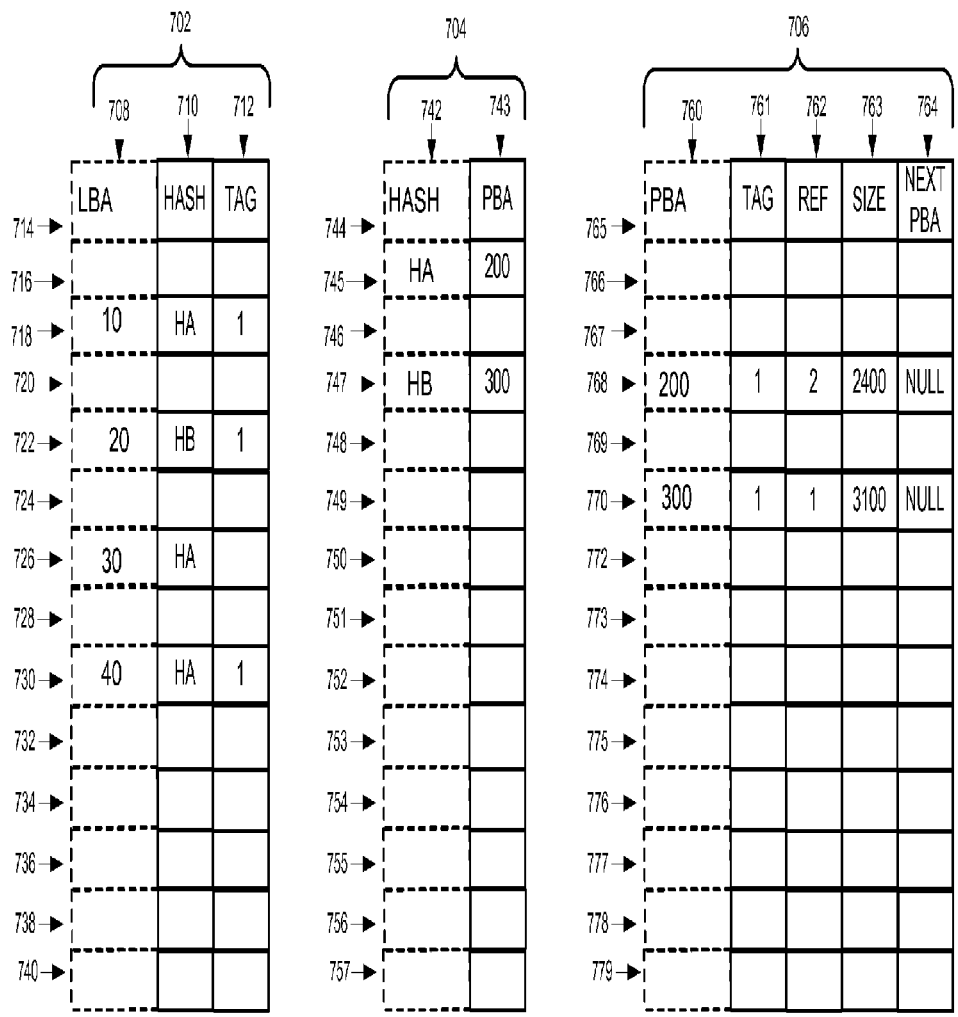
FIG. 15 illustrates how various exemplary tables may be, and in some embodiments are, used in implementing the present invention.
Figure 16:
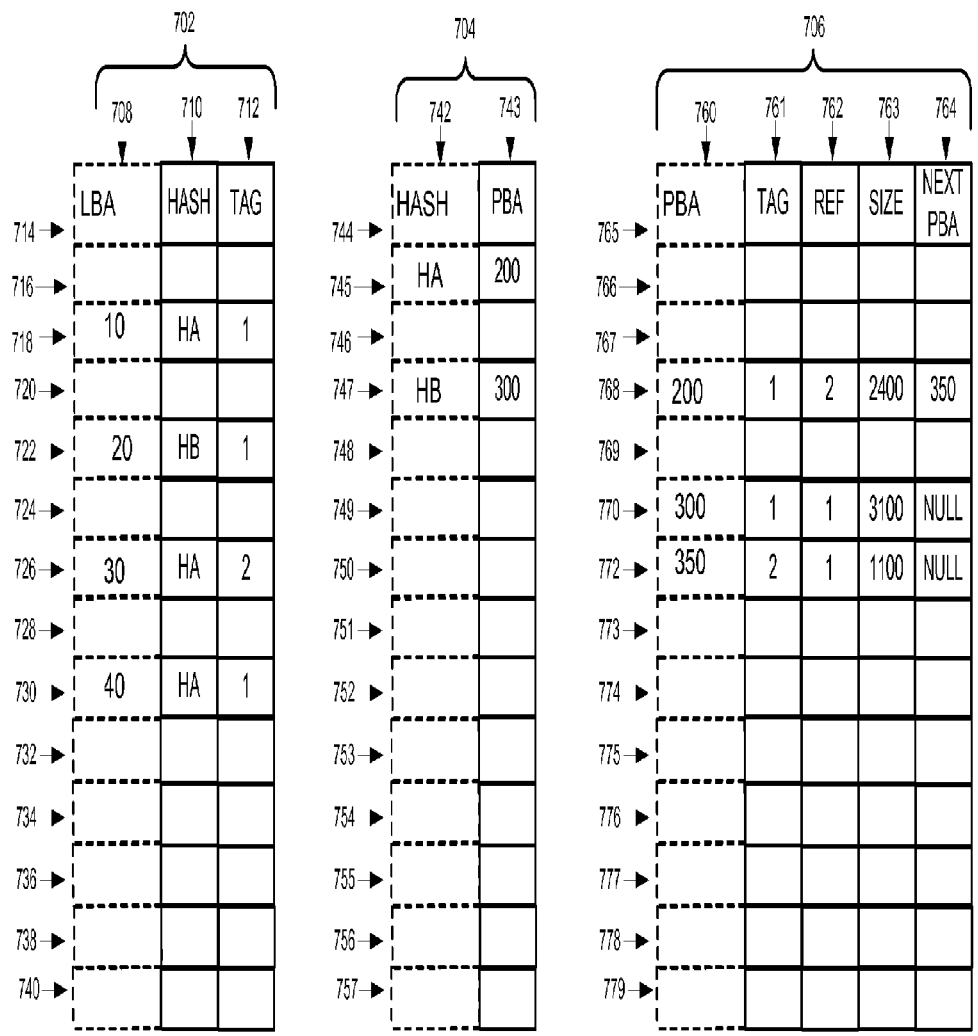
FIG. 16 illustrates how various exemplary tables may be, and in some embodiments are, used in implementing the present invention.

In this next example, a write block of data X at LBA 30 request is now received by the system. A hash value is generated for the received block of data X which is equal to HA. The received block of data X is compressed and has a size of 1100 bytes. In LBA to hash table 702 at index LBA 30 a check is made as to whether there is any hash value, tag associated with LBA 30. If no hash value and tag are present in the table associated with LBA 30 then this write request is not performing a rewrite of data at LBA 30. In this specific case as shown in FIG. 14, no hash value and no tag are present at LBA 30 in the LBA to hash value table 702. Because there is no hash value present at LBA 30, the hash value HA is associated with the LBA 30 by being inserted into the LBA 30 entry in LBA to hash value table 702 at hash column 710 LBA 30 row 726 as shown in FIG. 15. The hash to PBA table 704 is now searched for an entry associated with a hash value HA. This may be, and in some embodiments of the present invention is, achieved by checking the hash value to PBA table 704 at the hash value index to determine whether there is any entry with an associated PBA present. If the check results in finding a HA index with an associated PBA then this is either a case of de-duplication or collision or both. That is there is at least one previously stored block of data having a matching hash value which may be a duplicate or which may not be a duplicate but which has the same hash value. In this example, as shown in FIG. 15 at hash index HA row 745 hash column 742 in the hash value to PBA table 704 a PBA value 200 is present. So there is a previously stored block of data with a matching hash value. The PBA linked list for hash value HA is now traversed to determine if there is a matching block of data or whether this is a collision. Using the PBA value 200 as an index to the PBA table 706, the data associated with the PBA table entry at 200 PBA row 768 is accessed. The size associated with PBA 200 from size column 763 is 2400. The units of the size is bytes. A comparison is made of the size value 2400 associated with PBA 200 and the size of the compressed block of data X which is 1100 bytes. The sizes do not match so the block of data stored at 200 PBA is not the same as this new block of data X to be stored. The PBA 200 entry in the PBA table 706 is now checked to determine whether there are additional previously stored blocks of data with a hash value equal to HA. This is done by checking the next PBA column 764 associated with PBA 200 row 768 of the PBA to hash table 706. The value is a null so only 1 entry is present in this PBA linked list associated with previously stored blocks of data having a hash value equal to HA. This means that this write request is an example of a collision and block of data X is different from or unique with respect to any other previously stored block of data. A new free physical block address is obtained at which the compressed block of data X is stored. In this example, it is assumed that PBA 350 is the free physical block address at which the compressed block of data X is stored. A new entry in the PBA linked list is created and associated with PBA 350. In this example, this is achieved by creating a new entry at PBA 350 in the PBA table 706 and by setting the associated size value to equal the size of the compressed block of data X which is 1100, setting the reference value or count as 1, and setting the next PBA value as NULL. Now get the unique tag and set that at 350 PBA in this case the tag value is set to 2. At the 200 PBA row 768 in the PBA table 706 the next PBA value column 764 is changed from NULL to 350. In the LBA to hash table 702, row HA 726 the tag value in column 712 is updated to be the tag value associated with PBA 350 in the PBA table 706 which is a value of 2. FIG. 16 shows the LBA to hash table 702, the hash value to PBA table 704, and the PBA table 706 after the updates have been completed. This concludes the processing associated with the write block of data X at LBA 30 request.

From a review of the LBA to hash value table 702 as shown in FIG. 16, it can be appreciated that there are logically three previously stored blocks of data having a hash value HA and logical block addresses 10, 30 and 40. Two of those blocks those associated with LBA 10 at LBA 40 have the same tag value which indicates that they are duplicates. LBA 30 has a tag value of 2 indicating that it is different from and not a duplicate of the block of data associated with LBA 10 and LBA 40 which has a tag value of 1. Because of the de-duplication process only two and not three blocks of data needed to be stored in memory saving on the amount of space required to successfully fulfill the requests for data storage.

The next example concerns the case of a rewrite that is writing over data at a previously written logical block address. In addition this example also addresses the case wherein there is a collision that is the hash value of the block of data received to be written is the same as a block of data previously stored but the blocks of data are actually different. The system receives a rewrite data request to write block of data Y at LBA 10. The rewrite request may, and in some embodiments is, the same as a write request with the exception that the logical block address provided is currently associated with a previously written block of data. The generated hash value for the block of data Y is HB. The compressed block of data Y has a size 1100. At LBA 10 row 718 in LBA to hash table 702 shown in FIG. 16 check whether there is any hash and tag associated with LBA 10. If there is then this is a request to rewrite the data at this position. In cases of rewriting a LBA before completing the processing for the request the reference value or count associated with the previous PBA that was associated with the hash value and tag associated with the LBA and which is being overwritten needs to be reduced by 1. In this case, a check of the LBA 10 row in the LBA to hash value table 702 indicates that a hash value and tag were previously associated with LBA 10. At this point, the processor copies the hash value HA and tag 1 to temporary memory space. The hash value associated with LBA 10 in LBA to hash value table 702 is set to the value of the generated hash value which in this example is HB. Using the generated hash value HB as an index to the hash to PBA table 704 it is determined whether there is a PBA associated with the generated hash value HB. In this example, hash value HB is located in row 747 and it has a PBA value 300 associated with it row 747 column 743. The PBA 300 is the address of the head of the physical block address linked list for previously stored blocks of data having a hash value HB. Using PBA 300 as an index to the PBA table 706 the system accesses the size, tag, reference value and next PBA information associated with PBA 300 which is contained in row 770. The data size associated with PBA 300 is compared to the data size of the compressed block of data Y received for storage. In this example the two sizes are different as the data size associated with PBA 300 is 3100 bytes and the data size of the compressed block of data Y is 1100 bytes. Because the sizes are different the block of data stored in physical block address 300 is not a match to the block of data Y received for storage. The next PBA information which is associated with PBA 300 is NULL so that indicates that the block of data Y is not a duplicate of any previously stored blocks of data. Because this is a new block of data to be stored a new entry is created and added to the end of the PBA linked list. A free physical block address is obtained and the compressed data block is stored in this free physical block address. In this example, the obtained physical block address is PBA 370. A new entry is created in the PBA table 706 at PBA 370 and size value is set to 1100 the size of the compressed block of data Y, the reference value or count is set to 1, and the next PBA value is set to NULL. A unique tag value is determined in this example it is the value 2 and the tag value associated with PBA 370 in PBA table 706 is set to 2. The LBA to hash value table 702 is updated at LBA 10 so its associated tag value is set to 2. The next PBA value of the entry associated with PBA 300 is updated from NULL to 370 row 770 column 764 of PBA table 706. This updates the PBA linked list for entries having a hash value of HB.

Figure 17:
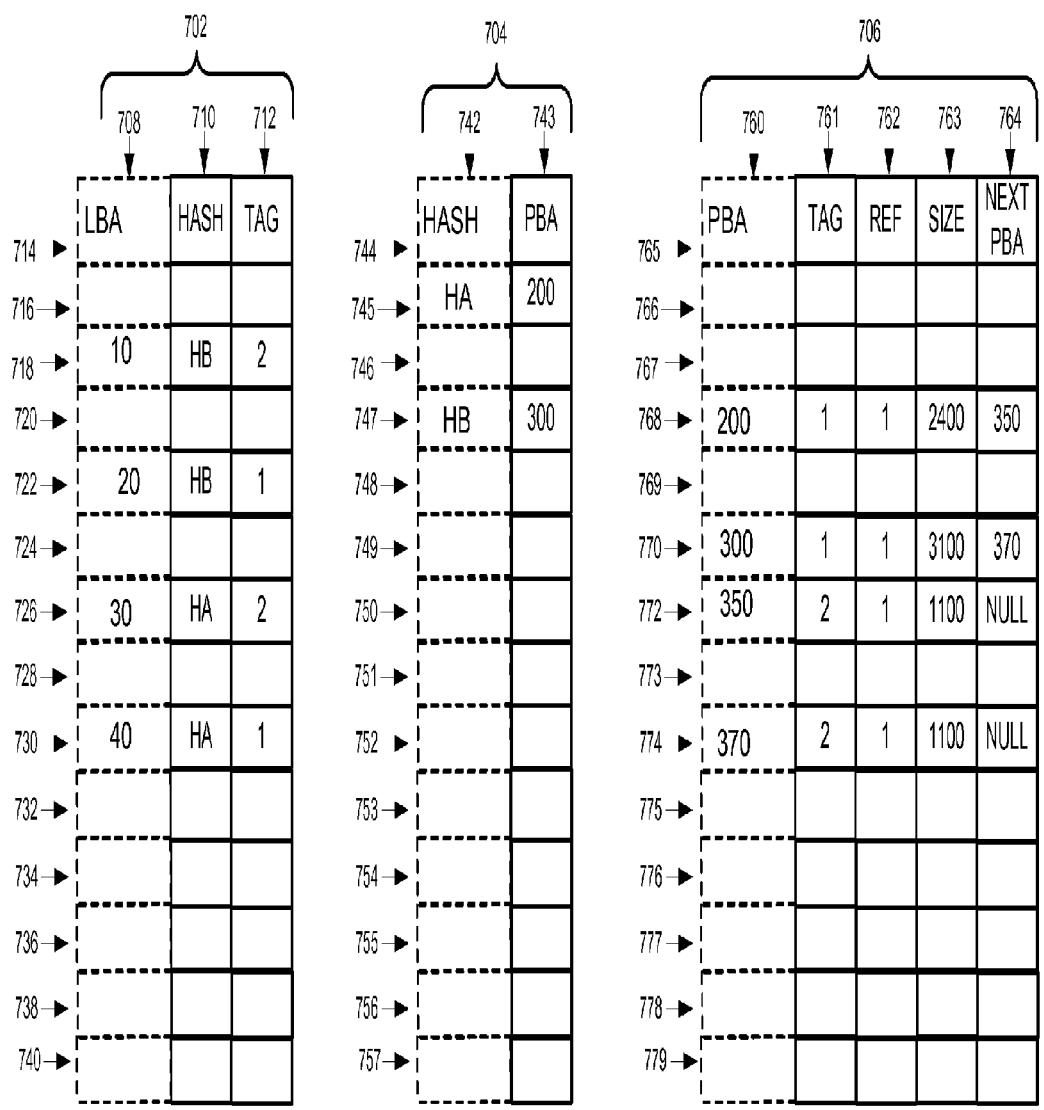
FIG. 17 illustrates how various exemplary tables may be, and in some embodiments are, used in implementing the present invention.

Previously LBA 10 contained hash value HA with a tag value of 1. Using hash value HA as an index to hash value to PBA table 704 the PBA 200 is identified as the head of the physical block linked list associated with hash value HA. The PBA 200 address and tag value 1 is then used to traverse the linked list and identify the PBA entry with an associated tag of 1. Once this PBA entry has been identified its reference count or value is reduced by 1. Processing is then concluded with respect to this rewrite request. The updated LBA to hash table 702, the hash value to PBA table 704, and the PBA table 706 accompanying this example are shown in FIG. 17.

Figure 18:
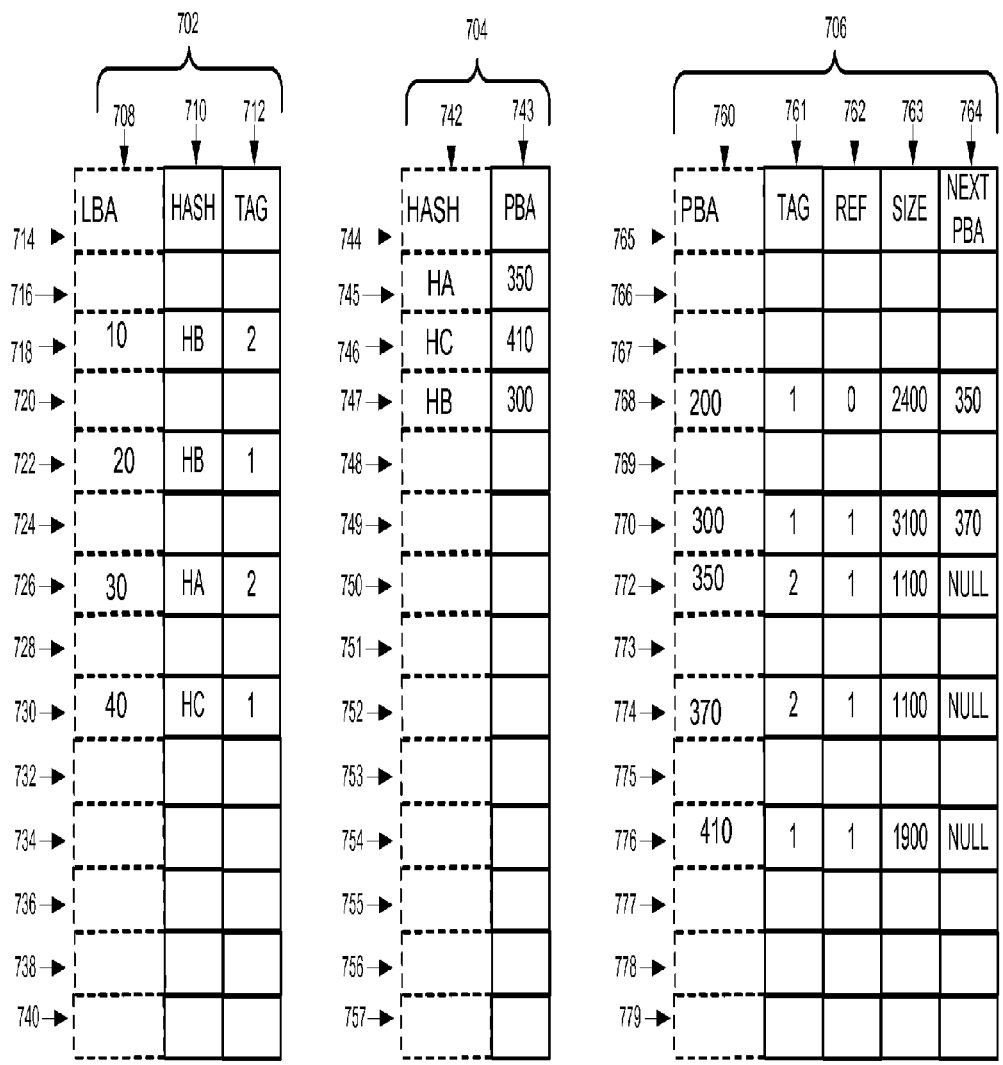
FIG. 18 illustrates how various exemplary tables may be, and in some embodiments are, used in implementing the present invention.

The next example concerns the case of a rewrite of a new entry. This is similar to the previous example, however, no de-duplication needs to be performed of the new entry. The system receives a rewrite data request to write block of data P at LBA 40. The generated hash value for the block of data P is HC. The compressed block of data P has a size 1900. At LBA 40 row 730 of LBA to hash table 702 as shown in FIG. 17 check whether there is any hash value and tag associated with LBA 40. If there is then this is a request to rewrite the data at this position. In cases of rewriting a LBA before completing the processing for the request the reference value or count associated with the previous PBA that was associated with the hash value and tag associated with the LBA and which is being overwritten needs to be reduced by 1. In this case, a check of the LBA 40 row in the LBA to hash value table 702 indicates that a hash value and tag were previously associated with LBA 40. At this point, the processor copies the hash value HA and tag value lwhich was previously associated with LBA 40 to temporary memory space. The hash value associated with LBA 40 in the LBA to hash value table 702 is set to the value of the generated hash value which in this example is HC. Using the generated hash value HC as an index to the hash to PBA table 704 it is determined whether there is a PBA associated with the generated hash value HC. In this example, hash value HC is not present in the hash to PBA table 704. That is there is no association of a hash value HC to a PBA address. As a result it is determined that this is a new block of data to be stored. Determine a free physical block address to which the compressed block of data is to be written. In this example, the physical block address 410 is a free PBA in which the system stores the compressed block of data P. A new entry is created in PBA table 706 using the physical block address 410 as an index. The new entry will include a collision tag value set to 1 in the column 761 indicating there are no collisions for this block of data, a reference value set to 1 in column 762, the size value is set to 1900 in column 763 which is the size of the compressed block of data P, and the next PBA is set to NULL as this is the first entry in the physical block address linked list for hash value HC. These updates to the PBA table are shown in FIG. 18 row 776. The hash to PBA table 704 is updated so that the PBA address 410 is associated with hash value index HC. This is illustrated in FIG. 18 hash to PBA table 704 row 746 which contains hash index HC in column 742 and PBA 410 in column 743. The LBA to hash table 702 is updated so that the hash value HC and tag value of 1 is associated with the LBA index 40. This is accomplished by updating column 710 to HC and column 712 to 1 in the LBA to hash table 702 at index LBA 40 as shown in FIG. 18 row 730.

Previously LBA 40 was associated with hash value HA and tag value of 1. This information was stored in temporary memory. Using the HA value as an index to the hash value to PBA table 704 as shown in FIG. 17 the PBA 200 is identified as the head of the physical block linked list associated with hash value HA. The PBA 200 address and tag value of 1 is then used to traverse the linked list and identify the PBA entry with an associated tag of 1. Once this PBA entry has been identified its reference count or value is reduced by 1. This is shown in FIG. 18 row 768 PBA index 200 column 762 REF value reduced to zero. Because the reference count associated with the hash value HA and tag 1 is now zero it means that the head of the linked list should be updated as the PBA block address at 200 is now free to be rewritten as there is no longer a logical block address associated with the compressed data stored at PBA address 200. At PBA table index 200 row 768 the Next PBA address associated with PBA 200 is PBA 350 identified in Next PBA column 764. The hash to PBA table 704 is updated at hash value index HA row 745 so that PBA 350 is associated with hash value HA as PBA 350 is now the PBA address for the head of the linked list of data blocks stored with a hash value matching HA. Processing is then concluded with respect to this rewrite request. The updated LBA to hash value table 702, hash to PBA table 704 and PBA table 706 is shown in FIG. 18. In some embodiments of the present invention, the head of the linked list is not updated when the associated reference count of the linked list becomes zero but instead is updated at a later time. In some such embodiments, the hash to PBA table 704 is not updated but the hash value, e.g., hash value HA would remain associated to the PBA address 200 which is the PBA address with the reference count of zero still being the head of the linked listed. The linked list is traversed in the same manner as previously discussed. In some embodiments, the linked list is updated at a later time when the reference count for an associated PBA address becomes zero. For example, in some but not all embodiments of the present invention, a garbage collection routine is utilized that frees up physical block address memory space and updates the PBA table 706 and hash to PBA table 706 as needed. An example of a garbage collection routine in accordance with one embodiment of the present invention is discussed below in connection with FIG. 20.

The next example concerns the case of a rewrite with a collision of the hash value. The system receives a rewrite data request to write block of data X at LBA 20. The generated hash value for the block of data X is HA. The compressed block of data X has a size 1100. At LBA 20 row 722 of LBA to hash table 702 as shown in FIG. 18 check whether there is any hash value and tag associated with LBA 20. If there is then this is a request to rewrite the data at this position. In cases of rewriting a LBA before completing the processing for the request the reference value or count associated with the previous PBA that was associated with the hash value and tag associated with the LBA and which is being overwritten needs to be reduced by 1. In this case, a check of the LBA 20 row 722 in the LBA to hash value table 702 indicates that a hash value and tag were previously associated with LBA 20. At this point, the processor copies the hash value HB and tag value lwhich was previously associated with LBA 20 to temporary memory space. The hash value associated with LBA 20 in LBA to hash value table 702 is set to the value of the generated hash value which in this example is HA. Using the generated hash value HA as an index to the hash to PBA table 704 it is determined whether there is a PBA associated with the generated hash value HA. In this example, hash value HA is located in the hash to PBA table 704 at row 745 and it has a PBA value 350 associated with it. The PBA 350 is the address of the head of the physical block address linked list for previously stored blocks of data having a hash value HA. Using PBA 350 as an index to the PBA table 706 the system accesses the size, tag, reference value and next PBA information associated with PBA 350 which is contained in row 772. The data size associated with PBA 350 is compared to the data size of the compressed block of data X received for storage. In this example the two sizes are the same as the data size associated with PBA 350 is 1100 bytes and the data size of the compressed block of data X is 1100 bytes. Because the sizes are the same the compressed block of data stored in physical block address 350 is retrieved from memory and compared to the block of data X received for storage and compressed. In some embodiments, the block of data stored at physical block address 350 is uncompressed and then compared to the uncompressed received block of data X to be stored. In this example, the compressed block of data X and the retrieved block of data X are compared using a bit by bit comparison and the two blocks are determined to match. That is they are the same. The PBA table 706 is then updated to reflect this determination by incrementing the reference count associated with physical block address index 350 by one. This is achieved in this example by incrementing the reference count value in row 772 column 762 from one to two as shown in PBA table 706 of FIG. 19. The tag value associated with PBA 350 in row 772 column 761 of PBA table 706 is determined to be set to the value of 2. The LBA to hash value table 702 is updated to associate the LBA 20 row 722 with the hash value HA in column 710 and the determined tag value 2 in column 712.

Figure 19:
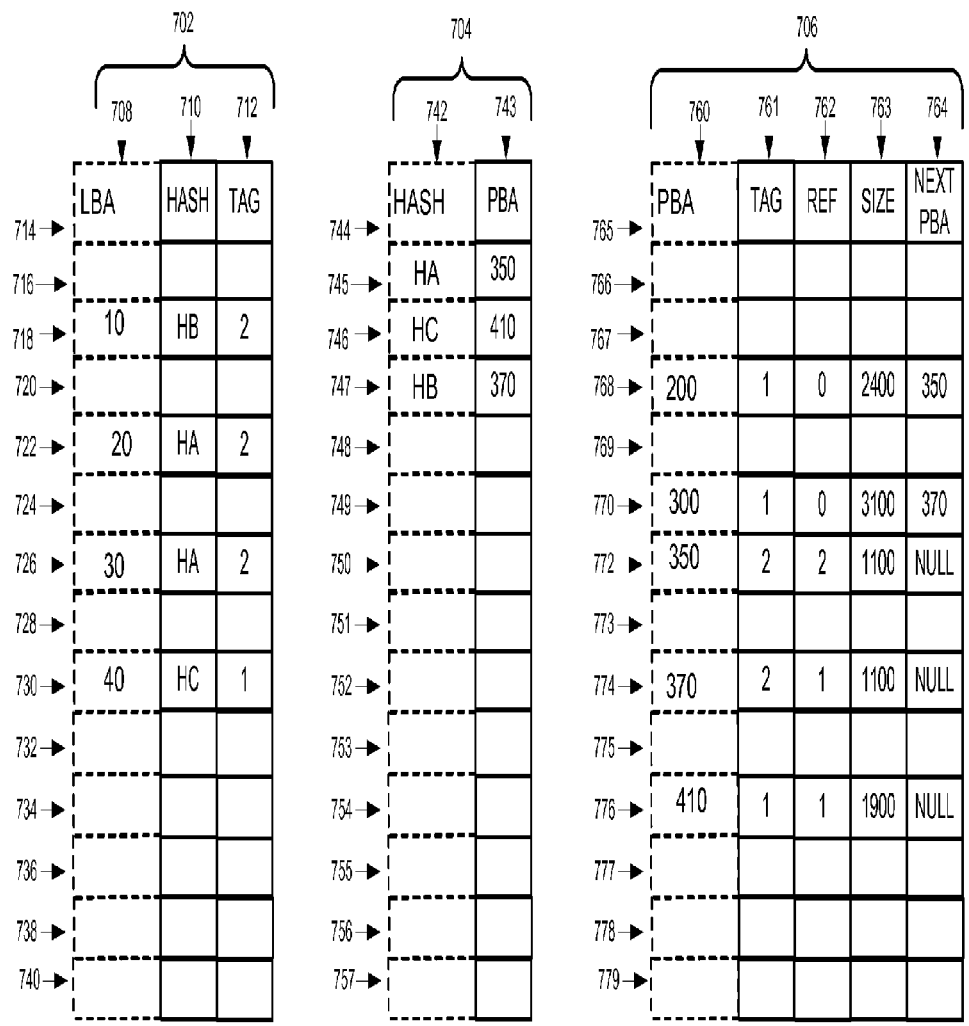
FIG. 19 illustrates how various exemplary tables may be, and in some embodiments are, used in implementing the present invention.

Previously LBA to hash value table 702 contained at LBA index 20 hash value HB with a tag value of 1 as shown in FIG. 18. This information was stored in temporary memory and is now retrieved from temporary memory. Using the hash value HB as an index to hash value to PBA table 704 the PBA 300 is identified as the head of the physical block linked list associated with hash value HB. The PBA 300 address and tag value 1 is then used to traverse the linked list and identify the PBA entry with an associated tag of 1. Once this PBA entry has been identified its reference count or value is reduced by 1. In this example using PBA 300 as an index to the PBA table row 770, it is determined that tag value associated with PBA 300 contained in column 761 is a tag value of 1. The PBA 300 entry associated reference count contained in row 770, column 762 is decremented from a value of one to zero as illustrated in FIG. 19.

As the reference count of the head entry of the linked list for stored data blocks having a hash value HB at PBA table index 300 is zero, the head of the link PBA address needs to be updated in the hash to PBA table. The head of the linked list is updated to be the equal to the next PBA entry associated with PBA 300 in PBA table 706 which is PBA 370 from row 770 column 764. The hash to PBA table 704 entry associated with the index HB row 747 is updated to contain the physical block address 370 in column 743 to indicate the new physical block address at which the head of the linked list for blocks of data stored with a hash value of HB is located. Processing is then concluded with respect to this rewrite request. The updated LBA to hash table 702, the hash value to PBA table 704, and the PBA table 706 accompanying this example are shown in FIG. 19. As previously discussed, in some embodiments of the present invention, the linked list associated with the hash value HB is not updated, for example, the head of the linked list is not updated during the write process but is updated at a later time such as part of garbage collection routine.

Figure 20:
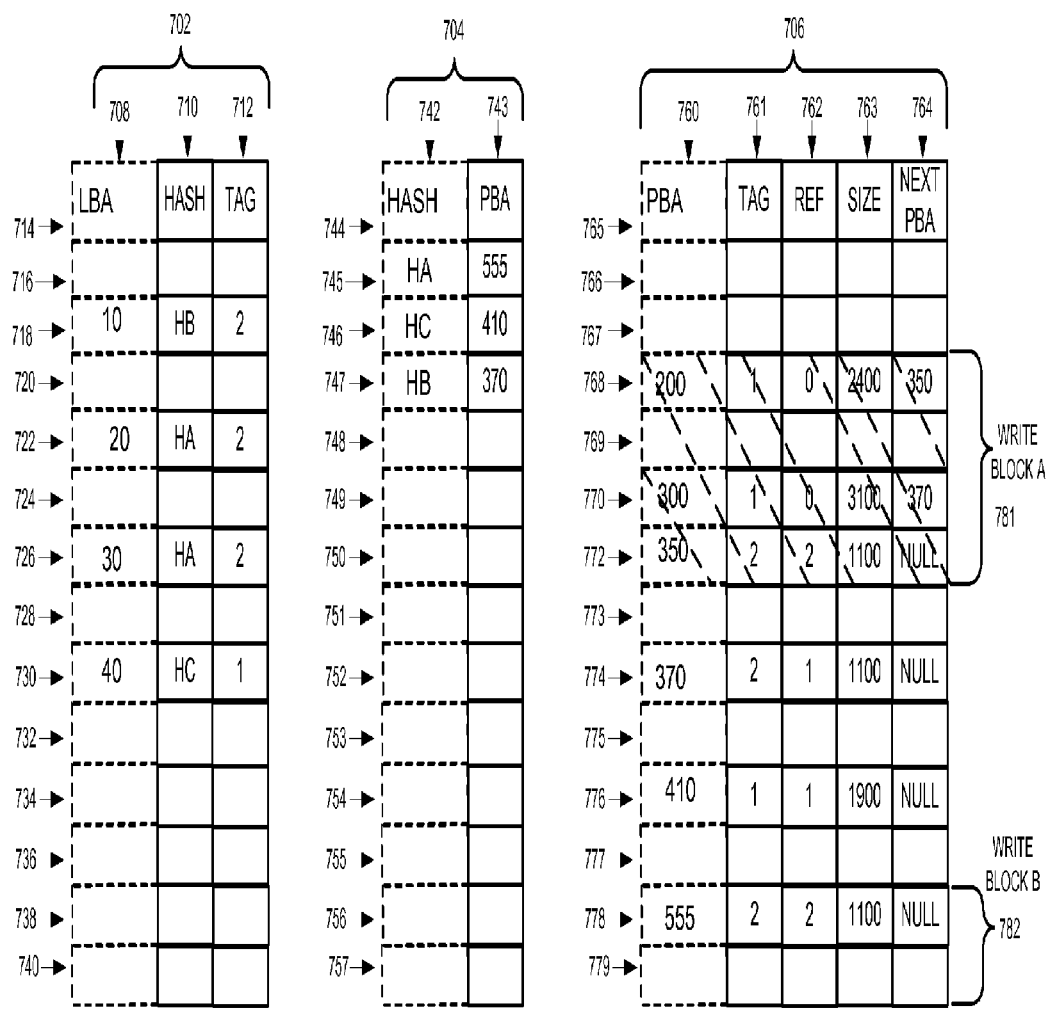
FIG. 20 illustrates how various exemplary tables may be, and in some embodiments are, used and updated during the garbage collection routine of one embodiment of the present invention.

In some embodiments of the present invention a garbage collection routine is executed by processor 110 for checking for and freeing up space in the physical write blocks. For example, in FIG. 20 the garbage collection routine will check the PBA table 706 for free space in the write blocks. For purposes of this example, assume that write block A 781 contains rows 768, 769, 770, and 772. In write block A 781 there are 3 entries out of which the associated reference count of the PBA index 200 and PBA index 300 is zero as shown in row 768 column 762 and in row 770 column 762 respectively. The reference count of zero indicates that the data blocks stored in these physical block address locations (PBA 200 and PBA 300) are no longer being referenced by the system and that they can be discarded. The processor 110 identifies the next PBA associated with PBA 200 and stores it in RAM memory. In this example, it is PBA 350 from row 768 column 764. Processor 110 removes the entries in row 768 associated with PBA 200. Previously PBA 200 was the head of the linked list for data blocks with a hash value of HA. In those embodiments in which the head of the linked list was not previously updated the appropriate changes are made in the hash to PBA table to make PBA 350 the head of the linked list for data blocks having a hash value of HA. This is accomplished by using the hash value HA as the index to the hash to PBA table and updating the PBA entry associated with the hash value HA to be PBA 350. Similarly the entries associated with PBA 300 row 770 are removed from the PBA table and the hash value to PBA table is updated as appropriate. The processor 110 now reads the data at physical block address 350 and schedules the data to be written to another block. A free physical block address is identified in a different write block. In this example PBA 555 in write block B 782 is identified as free. As shown in FIG. 20 write block B contains rows 778 and 779 of PBA table 706. The data block associated with PBA 350 is written to memory physical block address location 555. The PBA table 706 is updated so that the tag value, reference count, size value and next PBA value are associated with PBA 555 row 778. The system reduces the reference count of PBA index 350 to zero and write block A is added to a free write block linked list that is used to track free write blocks available for use, e.g., to store blocks of date in response to write requests. The processor 110 removes entries associated with PBA 350 from the PBA table 706. Thereby making physical block addresses 200, 300, and 350 available for reuse. The processor updates the hash value to PBA table 704 PBA value associated with hash value HA to be associated with PBA 555 which is the physical block address of the head entry of the linked list for data blocks having a hash value of HA. The diagonal dashed lines through write block A entries of FIG. 20 indicate that those entries have been removed from the PBA table 706 upon completion of the garbage collection routine.

Figure 21:
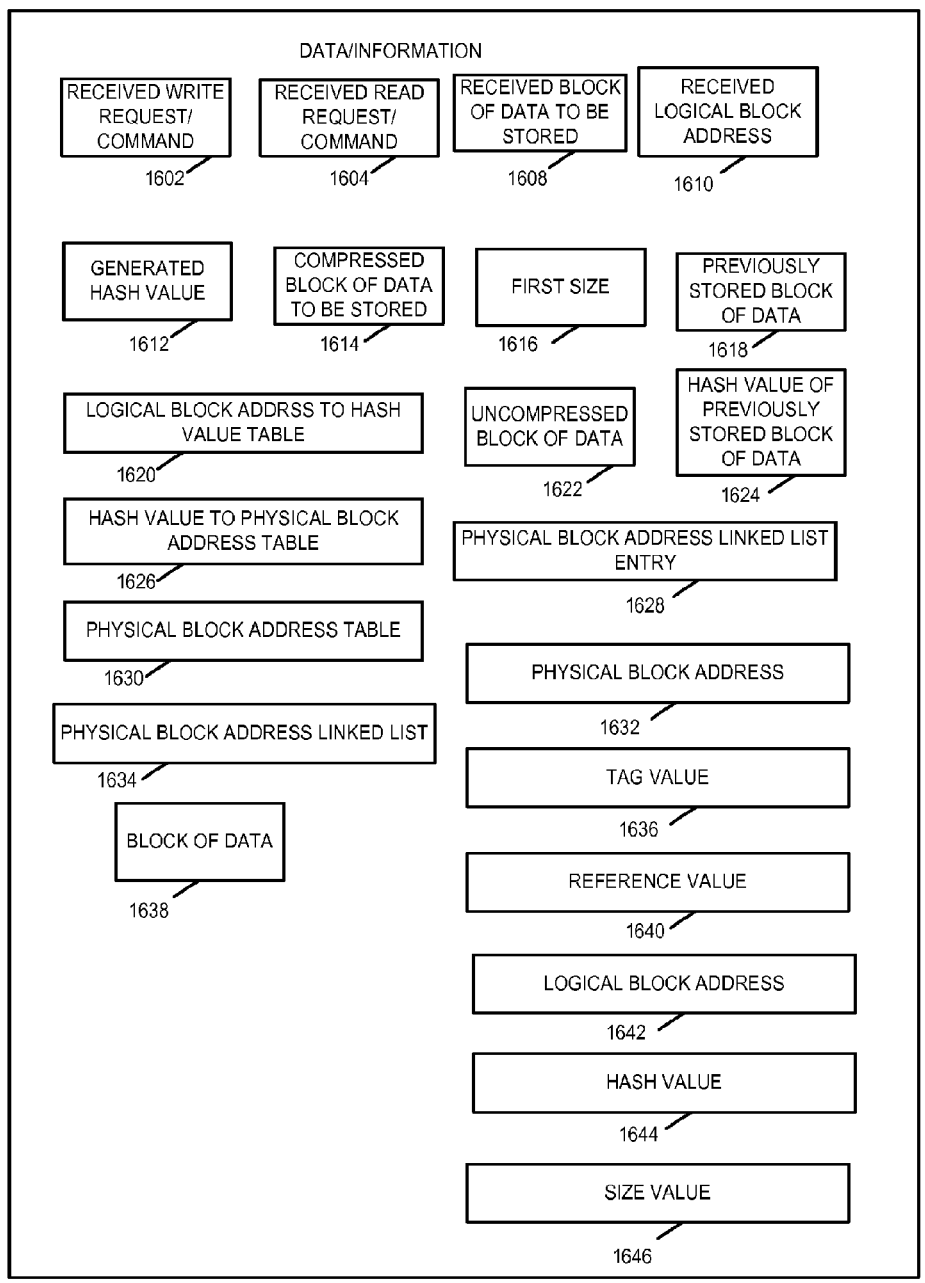
FIG. 21 illustrates exemplary data/information that may be, and in some embodiments of the present invention, is stored in memory, e.g., RAM memory.

FIG. 21 illustrates exemplary data/information that may be, and in some embodiments of the present invention, is stored in memory, e.g., RAM memory.

The exemplary data/information 1600 may be, and in some embodiments is, stored in the data/information 120 section of memory 108 of FIG. 1. Data/information 1600 contains the following exemplary data/information elements: RECEIVED WRITE REQUEST/COMMAND 1602, RECEIVED READ REQUEST/COMMAND 1604, RECEIVED BLOCK OF DATA 1608, RECEIVED LOGICAL BLOCK ADDRESS 1610, GENERATED HASH VALUE, 1612, COMPRESSED BLOCK OF DATA TO BE STORED 1614, FIRST SIZE 1616, PREVIOUSLY STORED BLOCK OF DATA 1618, LOGICAL BLOCK ADDRESS TO HASH VALUE TABLE 1620, UNCOMPRESSED BLOCK DATA 1622, HASH VALUE OF PREVIOUSLY STORED BLOCK OF DATA 1624, HASH VALUE TO PHYSICAL BLOCK ADDRESS TABLE 1626, PHYSICAL BLOCK ADDRESS LINKED LIST ENTRY 1628, PHYSICAL BLOCK ADDRESS TABLE 1630, PHYSICAL BLOCK ADDRESS 1632, PHYSICAL BLOCK ADDRESS LINKED LIST 1634, TAG VALUE 1636, BLOCK OF DATA 1638, REFERENCE VALUE 1640, LOGICAL BLOCK ADDRESS 1642, HASH VALUE 1644, SIZE VALUE 1646 which represents various variables and/or constants used in one or more embodiments of the present invention.

Figure 22:
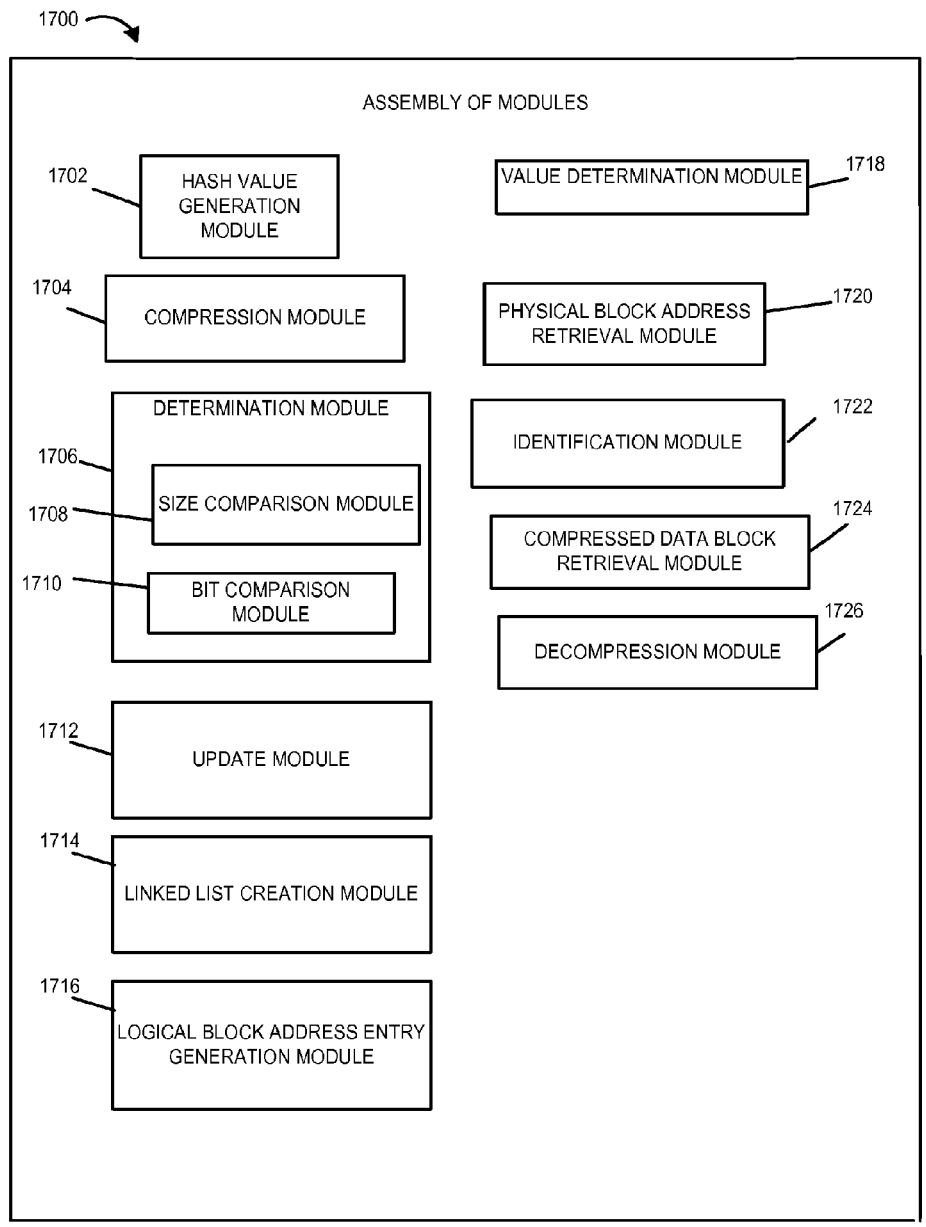
FIG. 22 illustrates an exemplary assembly of modules, which may be, and in some embodiments is, part of an apparatus which implements the method of the present invention, for performing various data processing functions in accordance with an exemplary embodiment.

FIG. 22 illustrates an exemplary assembly of modules, which may and in some embodiments is part of an apparatus which implements the method of the invention, for performing various data processing functions in accordance with an exemplary embodiment. In a hardware only embodiment the modules of FIG. 22 would be implemented in hardware, e.g., as circuits, the combination of which comprise an apparatus. In a software based embodiment the modules of FIG. 22 would be implemented as software modules, including code in the form of computer executable instructions, stored in memory in an apparatus. The apparatus also includes a computer, e.g., processor, which executes the code included in the software modules to perform the functions corresponding to the modules, a display, an input device, a receiver, a network interface, an output device and a bus for coupling the elements of the apparatus together. The memory stores the data, e.g., block of data, and/or logical block address received with a request typically in RAM. The processed data may be, and in some embodiments is stored, in the memory of the apparatus e.g., the storage memory which may be, a solid state memory.

The FIG. 22 assembly of modules 1700 may, and in some embodiments is, used to process data for example compressing, de-duplicating, and storing blocks of data in response to write requests or commands and retrieving and uncompressing blocks of data in response to read requests or commands. In the FIG. 22 example, the assembly of modules includes a hash value generation module 1702, a compression module 1704, a determination module 1706 including a size comparison module 1708 and a bit comparison module 1710, an update module 1712, a linked list creation module 1714, a logical block address entry generation module 1716, a value determination module 1718, a physical block address retrieval module 1720, an identification module 1722, a compressed data block retrieval module 1724 and a decompression module 1726.

The previously identified modules of the assembly of modules of the example of FIG. 22 are now discussed in further detail. In the FIG. 22 example, the assembly of modules includes a hash generation module 1702 configured to generate a hash value from a block of data to be stored and a hash function, a compression module 1704 configured to compress the block of data to be stored to generate a compressed block of data, a comparison module configured to compare said generated hash value to hash values corresponding to previously stored blocks of data, and a determination module configured to determine if the block of data to be stored matches the previously stored block of data with the matching hash value when a comparison performed by said comparison module indicates that said generated hash value matches a hash value corresponding to a previously stored block of data.

In some embodiments of the invention, said determination module 1706 includes a size comparison module 1708 configured to compare said first size to a size of said previously stored block of data with the matching hash value; and wherein said determination module determines that said block of data to be stored does not match said previously stored block of data when said size comparison module indicates that the first size does not match the size of said stored block of data.

In some embodiments said determination module 1706 in addition to including the size comparison module 1708 further includes a bit comparison module 1710 configured to perform at least one of: i) a bit by bit comparison of the block of data to be stored to an uncompressed version of said previously stored block of data with the matching hash value or ii) a bit by bit comparison of said compressed block of data to be stored to said previously stored block of data with the matching hash value.

Various functions of the present invention may be and are implemented as modules in some embodiments. The assembly of modules 1700 shown in FIG. 22 illustrates an exemplary assembly of modules, e.g., software or hardware modules, that may be and are used for performing various functions of a data processing system or apparatus used to process write and read requests and commands for storing and retrieving data from memory in accordance with embodiments of the present invention. When the modules identified in FIG. 22 are implemented as software modules they may be, and in some embodiments of the present invention are, stored in memory 108 of FIG. 1 in the section of memory identified as assembly of modules 118. These modules may be implemented instead as hardware modules, e.g., circuits.

Figure 23:
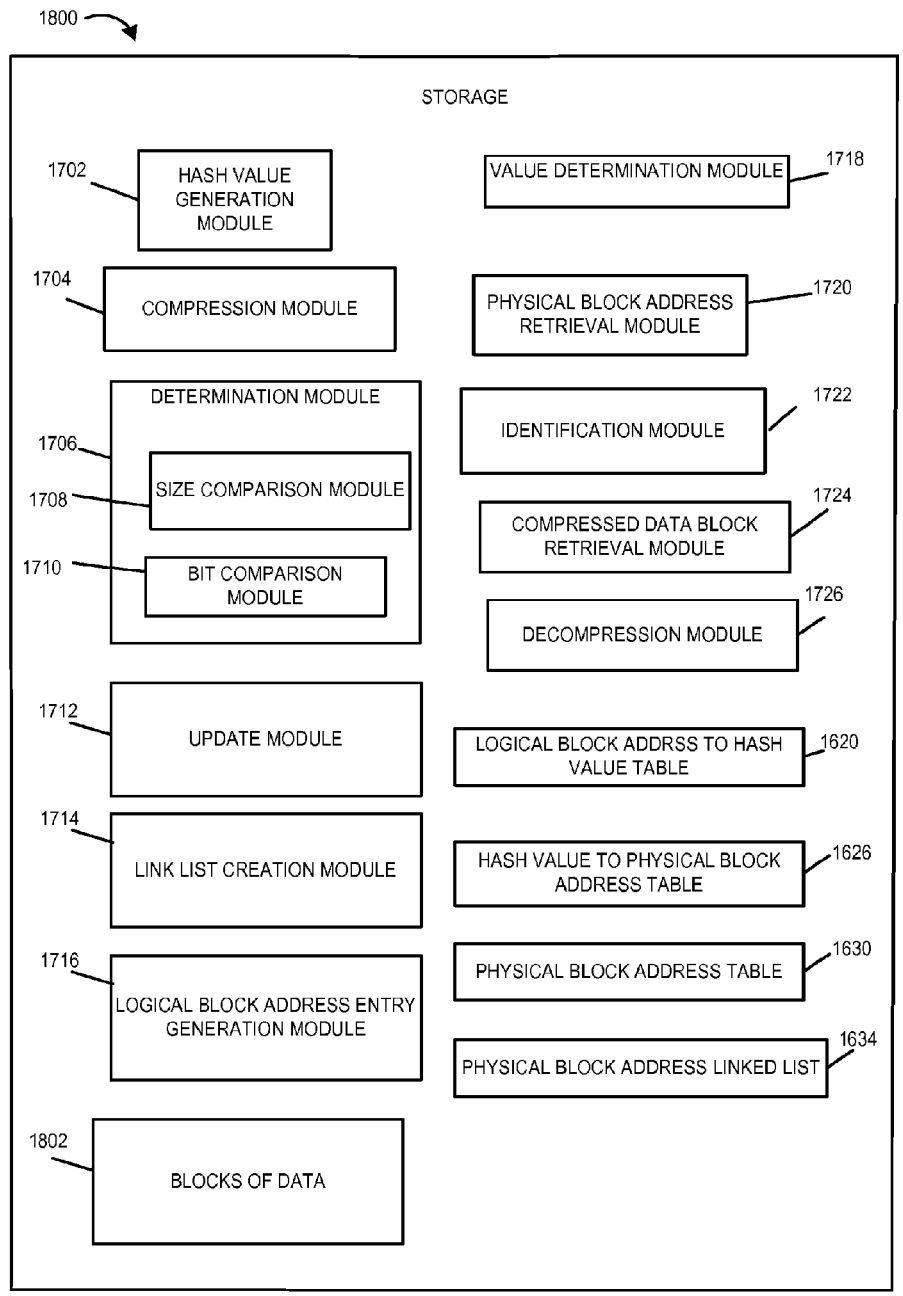
FIG. 23 illustrates an exemplary storage, e.g., silicon storage, which may be, and in some embodiments is, part of an apparatus which implements the methods of the present invention, and may be, and in some embodiments is, used to store various types of data and information including one or more blocks of data, tables and linked lists containing information relating to blocks of data, and software assembly modules.

FIG. 23 illustrates an exemplary storage, e.g., silicon storage, which may and in some embodiments is part of an apparatus which implements the method of the invention, and may be, and in some embodiments is used to store various types of data and information including one or more blocks of data 1802, tables and linked lists containing information relating to blocks of data, and software assembly modules. In the example of FIG. 23 stored in storage 122 memory are the following exemplary items: BLOCKS OF DATA 1802, LOGICAL BLOCK ADDRESS TO HASH VALUE TABLE 1620, HASH VALUE TO PHYSICAL BLOCK ADDRESS TABLE 1626, PHYSICAL BLOCK ADDRESS TABLE 1630, PHYSICAL BLOCK ADDRESS 1632, and PHYSICAL BLOCK ADDRESS LINKED LIST 1634, a hash value generation module 1702, a compression module 1704, a determination module 1706 including a size comparison module 1708 and a bit comparison module 1710, an update module 1712, a linked list creation module 1714, a logical block address entry generation module 1716, a value determination module 1718, a physical block address retrieval module 1720, an identification module 1722, a compressed data block retrieval module 1724 and a decompression module 1726.

While a logical sequencing of the processing steps of the exemplary embodiments of the methods, routines and subroutines of the present invention have been shown, the sequencing is only exemplary and the ordering of the steps may be varied.

The techniques of various embodiments may be implemented using software, hardware and/or a combination of software and hardware. Various embodiments are directed to apparatus, e.g., a data processing system. Various embodiments are also directed to methods, e.g., a method of processing data. Various embodiments are also directed to non-transitory machine, e.g., computer, readable medium, e.g., ROM, RAM, solid state storage, silicon storage disks, CDs, hard discs, etc., which include machine readable instructions for controlling a machine to implement one or more steps of a method.

Various features of the present invention are implemented using modules. For example each of the various routines and/or subroutines disclosed may be implemented in one or more modules. Such modules may be, and in some embodiments are, implemented as software modules. In other embodiments the modules are implemented in hardware. In still other embodiments the modules are implemented using a combination of software and hardware. A wide variety of embodiments are contemplated including some embodiments where different modules are implemented differently, e.g., some in hardware, some in software, and some using a combination of hardware and software. It should also be noted that routines and/or subroutines, or some of the steps performed by such routines, may be implemented in dedicated hardware as opposed to software executed on a general purpose processor. Such embodiments remain within the scope of the present invention. Many of the above described methods or method steps can be implemented using machine executable instructions, such as software, included in a machine readable medium such as a memory device, e.g., RAM, floppy disk, solid state storage device, silicon storage device, etc. to control a machine, e.g., general purpose computer with or without additional hardware, to implement all or portions of the above described methods. Accordingly, among other things, the present invention is directed to a machine readable medium including machine executable instructions for causing a machine, e.g., processor and associated hardware, to perform one or more of the steps of the above described method(s).

Numerous additional variations on the methods and apparatus of the various embodiments described above will be apparent to those skilled in the art in view of the above description. Such variations are to be considered within the scope of the invention.

What is claimed is:

1. A method comprising:
  receiving a request to store a current block of data at a particular logical block address;
  generating a hash value from the block of data to be stored and a hash function;
  compressing the block of data to be stored to generate a current compressed block of data having a first size;

determining whether there is a previously stored hash value at the particular logical block address within a logical block address to hash value table;

when it is determined that there is not a previously stored hash value at the particular logical block address, determining whether there is a previously stored physical block address linked list entry within a hash value to physical block address table at an index corresponding to the generated hash value;

when it is determined that there is a physical block address linked list entry at the index corresponding to the generated hash value, determining whether the current block of data matches a previously stored block of data associated with the physical block address linked list entry at the index corresponding to the generated hash value; and when it is determined that the current block of data matches the previously stored block of data, updating the logical block address to hash value table to include a new entry at the particular logical block address and not storing the current compressed block of data.

2. The method of claim 1, wherein determining whether the current block of data matches the previously stored block of data further comprises:
comparing the first size of the compressed block of data to a second size of a compressed block of data associated with the previously stored block of data; and
determining whether the first size is equal to the second size.

3. The method of claim 2, further comprising:
when it is determined that the first size does equal the second size, performing one of:
a bit by bit comparison of the current block of data to be stored to an uncompressed version of the previously stored block of data; and
a bit by bit comparison of the compressed block of data to be stored to the compressed block of data associated with the previously stored block of data.

4. The method of claim 2, further comprising:
when it is determined that the first size does not equal to the second size, determining whether a next physical block linked list address entry associated with the previously stored physical block address linked list entry is set to null.

5. The method of claim 4, further comprising:
when it is determined that the next physical block address linked list entry associated with the previously stored physical block address linked list entry is set to null, determining a new physical block address for the current compressed block of data;
creating a new physical block address linked list entry for the new physical block address; and
storing the current compressed block of data at a physical memory location corresponding to the new physical block address.

6. The method of claim 5, further comprising:
replacing the next physical block address entry associated with the previously stored block address linked list entry to with the new physical block address corresponding to the current compressed block of data.

7. The method of claim 5, wherein the new physical block address linked list entry includes, at least in part, a tag indicating a position of the new physical block address linked list entry in a physical block address linked list, a reference value indicating a number of different logical block addresses corresponding to the current block of data to be stored, and the first size of the current compressed block of data.

8. The method of claim 7, wherein the reference value is incremented by one in relation to a previous reference value associated with the previously stored physical block address linked list entry.

9. One or more non-transitory tangible media encoding logic that includes instructions for execution that when executed by a processor, is operable to perform operations comprising:
receiving a request to store a current block of data at a particular logical block address;
generating a hash value from the block of data to be stored and a hash function;
compressing the block of data to be stored to generate a current compressed block of data having a first size;
determining whether there is a previously stored hash value at the particular logical block address within a logical block address to hash value table;
when it is determined that there is not a previously stored hash value at the particular logical block address, determining whether there is a previously stored physical block address linked list entry within a hash value to physical block address table at an index corresponding to the generated hash value;
when it is determined that there is a physical block address linked list entry at the index corresponding to the generated hash value, determining whether the current block of data matches a previously stored block of data associated with the physical block address linked list entry at the index corresponding to the generated hash value; and
when it is determined that the current block of data matches the previously stored block of data, updating the logical block address to hash value table to include a new entry at the particular logical block address and not storing the current compressed block of data.

10. The media of claim 9, wherein determining whether the current block of data matches the previously stored block of data further comprises:
comparing the first size of the compressed block of data to a second size of a compressed block of data associated with the previously stored block of data; and
determining whether the first size is equal to the second size.

11. The media of claim 10, the operations further comprising:
when it is determined that the first size does equal the second size, performing one of:
a bit by bit comparison of the current block of data to be stored to an uncompressed version of the previously stored block of data; and
a bit by bit comparison of the compressed block of data to be stored to the compressed block of data associated with the previously stored block of data.

12. The media of claim 10, the operations further comprising:
when it is determined that the first size does not equal to the second size, determining whether a next physical block linked list address entry associated with the previously stored physical block address linked list entry is set to null.

13. The media of claim 12, the operations further comprising:
when it is determined that the next physical block address linked list entry associated with the previously stored physical block address linked list entry is set to null, determining a new physical block address for the current compressed block of data;

creating a new physical block address linked list entry for the new physical block address; and storing the current compressed block of data at a physical memory location corresponding to the new physical block address.

14. The media of claim 13, the operations further comprising:

replacing the next physical block address entry associated with the previously stored block address linked list entry to with the new physical block address corresponding to the current compressed block of data.

15. The media of claim 13, wherein the new physical block address linked list entry includes, at least in part, a tag indicating a position of the new physical block address linked list entry in a physical block address linked list, a reference value indicating a number of different logical block addresses corresponding to the current block of data to be stored, and the first size of the current compressed block of data.

16. The media of claim 15, wherein the reference value is incremented by one in relation to a previous reference value associated with the previously stored physical block address linked list entry.

17. A data processing apparatus comprising:

at least one memory;

at least one processor that executes instructions, wherein the processor and the memory cooperate such that the data processing apparatus is configured for:

receiving a request to store a current block of data at a particular logical block address;

generating a hash value from the block of data to be stored and a hash function;

compressing the block of data to be stored to generate a current compressed block of data having a first size;

determining whether there is a previously stored hash value at the particular logical block address within a logical block address to hash value table;

when it is determined that there is not a previously stored hash value at the particular logical block address, determining whether there is a previously stored physical block address linked list entry within a hash value to physical block address table at an index corresponding to the generated hash value;

when it is determined that there is a physical block address linked list entry at the index corresponding to the generated hash value, determining whether the current block of data matches a previously stored block of data associated with the physical block address linked list entry at the index corresponding to the generated hash value; and when it is determined that the current block of data matches the previously stored block of data, updating the logical block address to hash value table to include a new entry at the particular logical block address and not storing the current compressed block of data.

18. The data processing apparatus of claim 17, wherein determining whether the current block of data matches the previously stored block of data further comprises:

comparing the first size of the compressed block of data to a second size of a compressed block of data associated with the previously stored block of data; and determining whether the first size is equal to the second size.

19. The data processing apparatus of claim 18, the data processing apparatus being further configured for:

when it is determined that the first size does equal the second size, performing one of:

a bit by bit comparison of the current block of data to be stored to an uncompressed version of the previously stored block of data; and a bit by bit comparison of the compressed block of data to be stored to the compressed block of data associated with the previously stored block of data.

20. The data processing apparatus of claim 19, the data processing apparatus being further configured for:

when it is determined that the first size does not equal to the second size, determining whether a next physical block linked list address entry associated with the previously stored physical block address linked list entry is set to null.

* * * * *